(12) United States Patent
Kimura et al.

(10) Patent No.: US 9,100,014 B2
(45) Date of Patent: Aug. 4, 2015

(54) NONVOLATILE STORAGE GATE, OPERATION METHOD FOR THE SAME, AND NONVOLATILE STORAGE GATE EMBEDDED LOGIC CIRCUIT, AND OPERATION METHOD FOR THE SAME

(75) Inventors: Hiromitsu Kimura, Kyoto (JP); Takaaki Fuchikami, Kyoto (JP); Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 819 days.

(21) Appl. No.: 12/919,336

(22) PCT Filed: Jan. 8, 2009

(86) PCT No.: PCT/JP2009/050147
§ 371 (c)(1),
(2), (4) Date: Aug. 25, 2010

(87) PCT Pub. No.: WO2009/107408
PCT Pub. Date: Sep. 3, 2009

(65) Prior Publication Data
US 2011/0010493 A1 Jan. 13, 2011

(30) Foreign Application Priority Data
Feb. 28, 2008 (JP) .................................. 2008-048186

(51) Int. Cl.
*G06F 12/00* (2006.01)
*H03K 19/20* (2006.01)
(Continued)

(52) U.S. Cl.
CPC ................ *H03K 19/20* (2013.01); *G11C 11/22* (2013.01); *H03K 3/0375* (2013.01)

(58) Field of Classification Search
CPC ....... G11C 11/22; H03K 19/20; H03K 3/0375
See application file for complete search history.

(56) References Cited

U.S. PATENT DOCUMENTS 5,912,937 A * 6/1999 Goetting et al. ................. 377/67
6,031,755 A * 2/2000 Ozawa .......................... 365/145
(Continued)

FOREIGN PATENT DOCUMENTS

| CN | 1489211 A | 4/2004 |
|---|---|---|
| JP | 2000-323671 | 11/2000 |

(Continued)

OTHER PUBLICATIONS

John F. Wakerly. 2000. Digital Design: Principles and Practices (4th Ed.). Prentice-Hall, Inc., Upper Saddle River, NJ, USA.*
(Continued)

*Primary Examiner* — Cheng-Yuan Tseng
*Assistant Examiner* — Ramon A Mercado
(74) *Attorney, Agent, or Firm* — Fish & Richardson P.C.

(57) ABSTRACT

Provided is a nonvolatile storage gate embedded logic circuit embedding a nonvolatile storage gate which can hold data after power supply cutoff and can cut off a power supply at the same time shifting into a standby state. The nonvolatile storage gate embedded logic circuit includes a logic calculation unit having a logic gate, and a nonvolatile storage gate having a nonvolatile storage element, a data interface control unit disposed so as to be adjoining to the nonvolatile storage element, and receiving a nonvolatile storage control signal for data read-out from the nonvolatile storage element and data write-in to the nonvolatile storage element, and a volatile storage element disposed so as to be adjoining to the nonvolatile storage element, receiving a data input signal and a clock signal, and outputting a data output signal.

28 Claims, 23 Drawing Sheets

(51) Int. Cl.
*G11C 11/22* (2006.01)
*H03K 3/037* (2006.01)

(56) References Cited

U.S. PATENT DOCUMENTS

| | | | | |
|---|---|---|---|---|
| 6,233,169 | B1* | 5/2001 | Nishimura | 365/145 |
| 6,256,252 | B1* | 7/2001 | Arimoto | 365/227 |
| 2004/0085798 | A1* | 5/2004 | Yokozeki et al. | 365/145 |
| 2004/0085846 | A1* | 5/2004 | Yokozeki et al. | 365/226 |
| 2004/0208046 | A1* | 10/2004 | Yokozeki | 365/145 |
| 2006/0239061 | A1* | 10/2006 | Iwanari | 365/145 |

FOREIGN PATENT DOCUMENTS

| | | |
|---|---|---|
| JP | 2001-093275 | 4/2001 |
| JP | 2004-087003 | 3/2004 |
| JP | 2004-088469 | 3/2004 |
| JP | 2004-248143 | 9/2004 |
| JP | 3737472 | 11/2005 |
| JP | 3910902 | 2/2007 |

OTHER PUBLICATIONS

Peter Cheung. 2005. Letcure 8: Sequential Cirtuits.*

* cited by examiner

FIG. 2
(a)
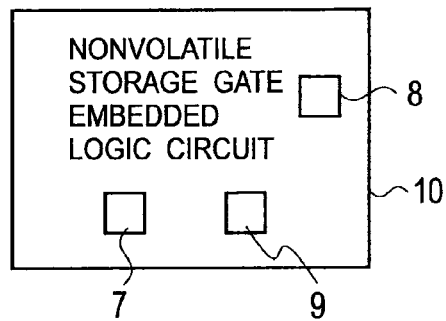
(b)
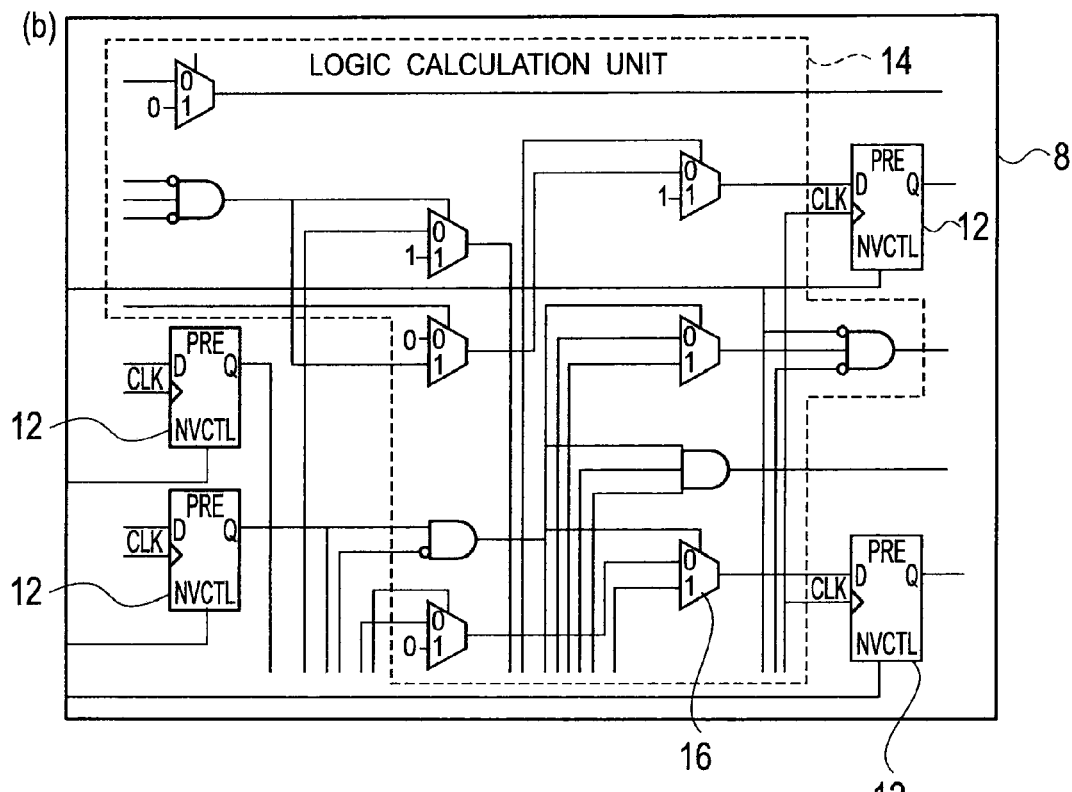
(c)
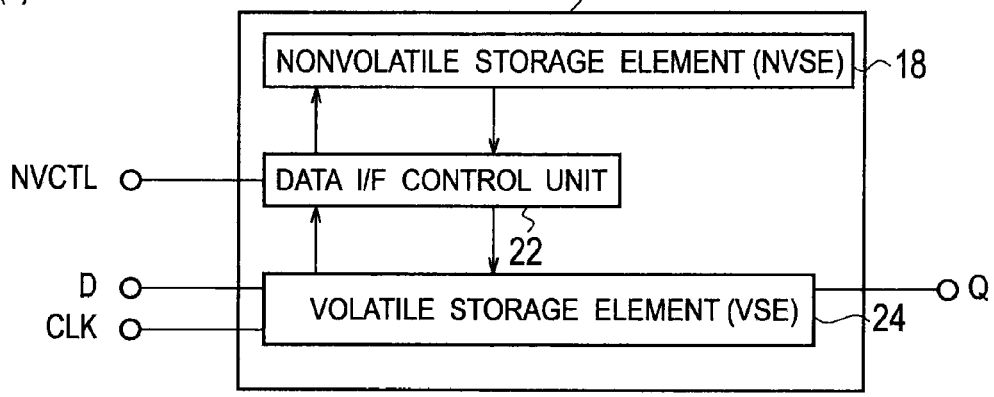

NONVOLATILE STORAGE GATE, OPERATION METHOD FOR THE SAME, AND NONVOLATILE STORAGE GATE EMBEDDED LOGIC CIRCUIT, AND OPERATION METHOD FOR THE SAME

TECHNICAL FIELD

The present invention relates to a nonvolatile storage gate, an operation method for such nonvolatile storage gate, a nonvolatile storage gate embedded logic circuit, and an operation method for such nonvolatile storage gate embedded logic circuit. In particular, the present invention relates to a nonvolatile storage gate which uses a nonvolatile storage element and an operation method for such nonvolatile storage gate, a nonvolatile storage gate embedded logic circuit, and an operation method for such nonvolatile storage gate embedded logic circuit.

BACKGROUND ART

In a Large Scale Integration (LSI), such as a Central Processing Unit (CPU), electric power is regularly consumed due to leakage current also in a state where the LSI is not operating. It is remarkable in particular in a microfabrication process in recent years, and 30 percent of total power consumption is occupied in a 90-nm process.

A method of cutting off a power supply in a state (standby state) where the LSI does not perform the calculation processing is effective for reduction of leakage current. However, since the processed data stored in a storage gate will erase if the power is turned OFF, data is held also after power supply cutoff by the method of applying only a storage gate into alternative power supply, or the method of restoring all the data stored in the storage gate to external before the power supply cutoff (for example, refer to Patent Literature 1).

Since it is necessary to wire a storage gate's proprietary power supply line in a circuit when applying only a storage gate into alternative power supply, complication of a power supply line is caused. Also, since a part to which the power supply is supplied and a part to which the power supply is cut off are existed, the measure of separating a signal line between a logic calculation unit and a storage gate is needed at the time of power supply cutoff.

Moreover, when turning ON a logic calculation unit, the power supply of a storage gate becomes unstable easily, and the measure to data corruption is also needed. Since the power supply of a memory element is turned OFF when restoring all the data stored in a storage gate before power supply cutoff, the above-mentioned measure becomes unnecessary. However, there are problems, like a data restoring process requires a time period as restoration data amount increases.

On the other hand, it is already disclosed about a data holding apparatus using a nonvolatile storage element and a data holding method (for example, refer to Patent Literature 2).

The problem regarding the holding data at the time of power supply cutoff causes in the data stored in a storage gate erasing, if the power supply of a logic calculation circuit is cut off.

On the other hand, since it is necessary to wire a storage gate's proprietary power supply line in a circuit when applying only a storage gate into alternative power supply, complication of a power supply line is caused. Also, since a part to which the power supply is supplied and a part to which the power supply is cut off are existed, the measure of separating a signal line between a logic calculation unit and a storage gate is needed at the time of power supply cutoff. Moreover, when turning ON a logic calculation unit, the power supply of a storage gate becomes unstable easily, and the measure to data corruption is also needed.

Since the power supply of a memory element is turned OFF when restoring all the data stored in a storage gate before power supply cutoff, the above-mentioned measure becomes unnecessary. However, there are problems, like a data restoring process requires a time period as restoration data amount increases.

Patent Literature 1: Japanese Patent No. 3910902
Patent Literature 2: Japanese Patent No. 3737472

SUMMARY OF INVENTION

Technical Problem

The object of the present invention is to provide a nonvolatile storage gate which can hold data after power supply cutoff by embedding a device having a nonvolatile function into a storage gate, and an operation method for such nonvolatile storage gate.

Moreover, the object of the present invention is to provide a nonvolatile storage gate embedded logic circuit which can cut off a power supply at the same time of being in a standby state, without needing securing of the power supply for holding data and restoring external data, by embedding a nonvolatile storage gate, and an operation method for such nonvolatile storage gate embedded logic circuit.

Moreover, the object of the present invention is to provide a nonvolatile storage gate which can be diverted in that condition for the existing design information and a nonvolatile storage gate embedded logic circuit which embedded the aforementioned nonvolatile storage gate.

Moreover, the object of the present invention is to provide a nonvolatile storage gate embedded logic circuit which arranges a nonvolatile storage gate efficiently inside a logic circuit by applying the same the cell pitch of the logic gate and the cell pitch of the nonvolatile storage gate when performing a layout design of the logic circuit.

Solution to Problem

According to one aspect of the present invention for achieving the above-mentioned object, it is provided of a nonvolatile storage gate comprising; a nonvolatile storage element; a data interface control unit disposed so as to be adjoining to the nonvolatile storage element, and receiving a nonvolatile storage control signal for reading-out data from the nonvolatile storage element and writing-in data to the nonvolatile storage element; and a volatile storage element disposed so as to be adjoining to the nonvolatile storage element, receiving a data input signal and a clock signal, and outputting a data output signal.

According to another aspect of the present invention, it is provided of a nonvolatile storage gate embedded logic circuit comprising: a logic calculation unit including a logic gate; and a nonvolatile storage gate including a nonvolatile storage element, a data interface control unit disposed so as to be adjoining to the nonvolatile storage element, and receiving a nonvolatile storage control signal for reading-out data from the nonvolatile storage element and writing-in data to the nonvolatile storage element, and a volatile storage element disposed so as to be adjoining to the nonvolatile storage element, receiving a data input signal and a clock signal, and outputting a data output signal.

According to another aspect of the present invention, it is provided of a nonvolatile storage gate embedded logic circuit comprising: an instruction processing unit; a calculation processing unit connected to the instruction processing unit and receiving an arithmetic control signal from the instruction processing unit; a calculated result storage unit connected to the calculation processing unit and receiving an arithmetic output signal from the calculation processing unit; a first switch block connected to the calculated result storage unit and the instruction processing unit, and supplying a first output signal to the calculation processing unit; a second switch block connected to the first switch block and the instruction processing unit, receiving a switch control signal from the instruction processing unit, and supplying a second output signal to the calculation processing unit; and a power supply control unit controlling a power supply to the calculated result storage unit, the first and second switch blocks, and the calculation processing unit, and bus-connecting to each part, and exchanging data.

According to another aspect of the present invention, it is provided of an operation method of a nonvolatile storage gate, the nonvolatile storage gate including: a nonvolatile storage element; a data interface control unit disposed so as to be adjoining to the nonvolatile storage element, and receiving a nonvolatile storage control signal for reading-out data from the nonvolatile storage element and writing-in data to the nonvolatile storage element; and a volatile storage element disposed so as to be adjoining to the nonvolatile storage element, receiving a data input signal and a clock signal, and outputting a data output signal; the operation method comprising: applying the nonvolatile storage element as a standby state, and applying the volatile storage element as a normal operation state, in a normal operation period; executing data write-in from the volatile storage element to the nonvolatile storage element, in a data write-in period; applying the volatile storage element and the nonvolatile storage element as a power supply cutoff waiting state, in a power supply cutoff waiting period; applying as a power supply cutoff state, in a power supply cutoff period; applying the volatile storage element and the nonvolatile storage element as a power recovery waiting state, in a power recovery waiting period; and executing data read-out to the volatile storage element from the nonvolatile storage element, in a data read-out period.

According to another aspect of the present invention, it is provided of an operation method of a nonvolatile storage gate embedded logic circuit, the nonvolatile storage gate embedded logic circuit including: a logic calculation unit having a logic gate; and a nonvolatile storage gate including a nonvolatile storage element, a data interface control unit disposed so as to be adjoining to the nonvolatile storage element, and receiving a nonvolatile storage control signal for reading-out data from the nonvolatile storage element and writing-in data to the nonvolatile storage element, and a volatile storage element disposed so as to be adjoining to the nonvolatile storage element, receiving a data input signal and a clock signal, and outputting a data output signal; the operation method comprising: applying the nonvolatile storage element as a standby state, and applying the volatile storage element as a normal operation state, in a normal operation period; executing data write-in from the volatile storage element to the nonvolatile storage element, in a data write-in period; applying the volatile storage element and the nonvolatile storage element as a power supply cutoff waiting state, in a power supply cutoff waiting period; applying as a power supply cutoff state, in a power supply cutoff period; applying the volatile storage element and the nonvolatile storage element as a power recovery waiting state, in a power recovery waiting period; and executing data read-out to the volatile storage element from the nonvolatile storage element, in a data read-out period.

ADVANTAGEOUS EFFECTS OF INVENTION

According to the present invention, it can be provided of the nonvolatile storage gate which can hold data after power supply cutoff by embedding the device having the nonvolatile function into the storage gate, and the operation method for such nonvolatile storage gate.

According to the present invention, it can be provided of the nonvolatile storage gate embedded the logic circuit which can cut off the power supply at the same time of being in the standby state, without needing securing of the power supply for holding data and restoring external data, by embedding the nonvolatile storage gate, and the operation method for such nonvolatile storage gate embedded logic circuit.

Moreover, according to the present invention, it can be provided of the nonvolatile storage gate which can be diverted in that condition for the existing design information and the nonvolatile storage gate embedded logic circuit which embedded the aforementioned nonvolatile storage gate, by providing a mechanism in which operation equivalent to the volatile storage gate is possible for the nonvolatile storage gate, and operating as the volatile storage gate at the time of normal operation.

Moreover, according to the present invention, it can be provided of the nonvolatile storage gate embedded logic circuit which arranges the nonvolatile storage gate efficiently inside the logic circuit by applying the same the cell pitch of the logic gate and the cell pitch of the nonvolatile storage gate when performing the layout design of the logic circuit.

Moreover, according to the nonvolatile storage gate embedded logic circuit of a present invention, since the power supply can be cut off in an instant without data restoring at the time of power supply cutoff, the power supply can be cut off in an instant and leakage current can be reduced efficiently when the logic calculation circuit shifts to a standby state.

Moreover, According to the nonvolatile storage gate embedded logic circuit of the present invention, existing circuit information can be diverted in that condition, without performing redesigns, such as a timing design and a power consumption design.

Moreover, according to the nonvolatile storage gate embedded logic circuit of the present invention, the existing circuit can be nonvolatilized easily, for example, a power supply can be cut off at the time of standby (data is not erased), and CPU etc. in which an operation restart is possible can be immediately achieved after power activation.

The power supply monitor unit provided in the external of the logic calculation circuit can determine whether the normal operation is performed or the holding data by the nonvolatile storage element is performed.

(*b*) A schematic configuration of the nonvolatile storage gate embedded logic circuit according to the first embodiment of the present invention, and a configuration diagram composed of a logic calculation unit and a nonvolatile storage gate; and (c) A schematic block configuration diagram of the nonvolatile storage gate which composes the nonvolatile storage gate embedded logic circuit according to the first embodiment of the present invention.

Figure 3:
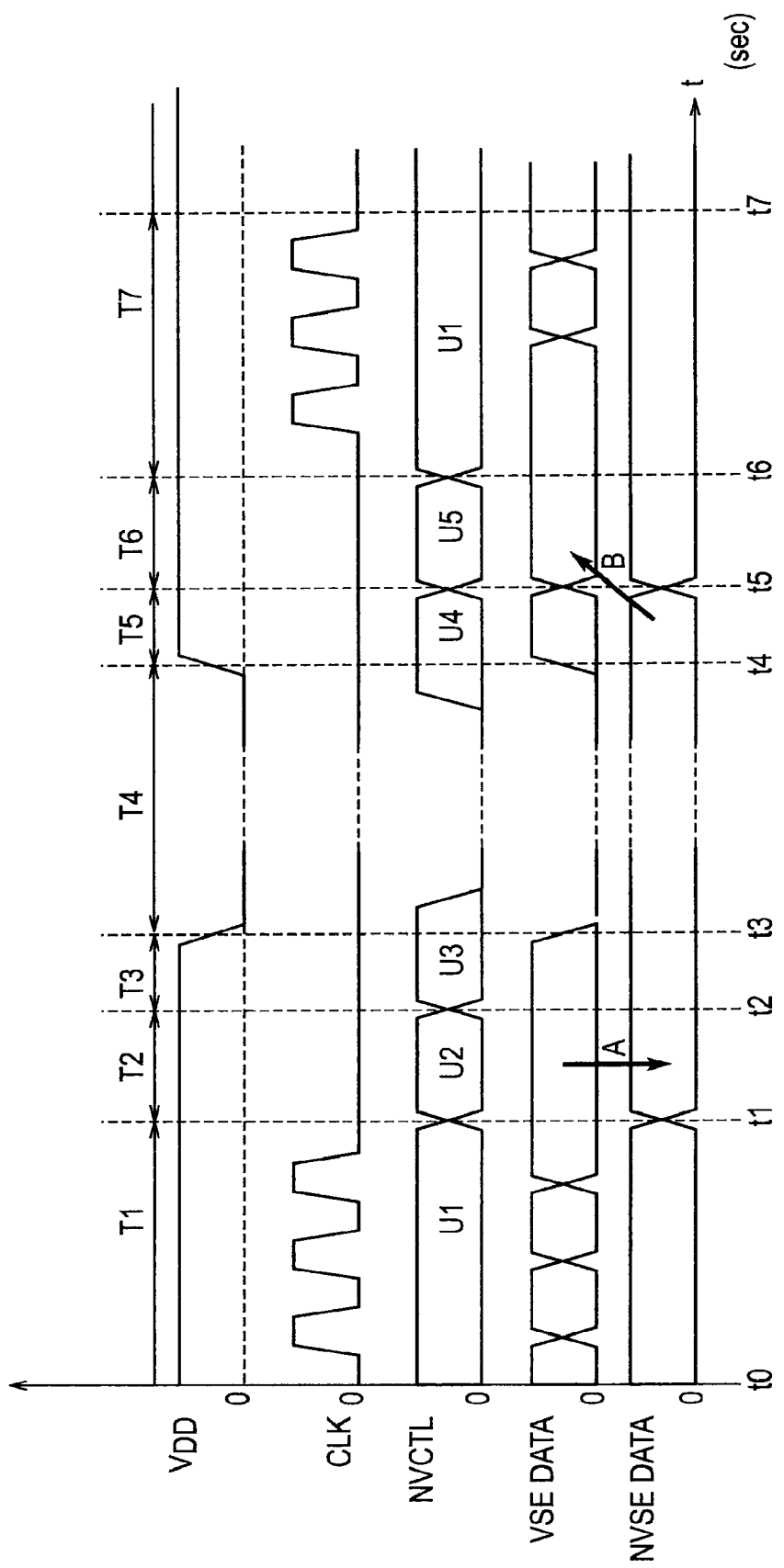

FIG. 3 An example of a logic circuit operation waveform of the nonvolatile storage gate which composes the nonvolatile storage gate embedded logic circuit according to the first embodiment of the present invention.

Figure 4:
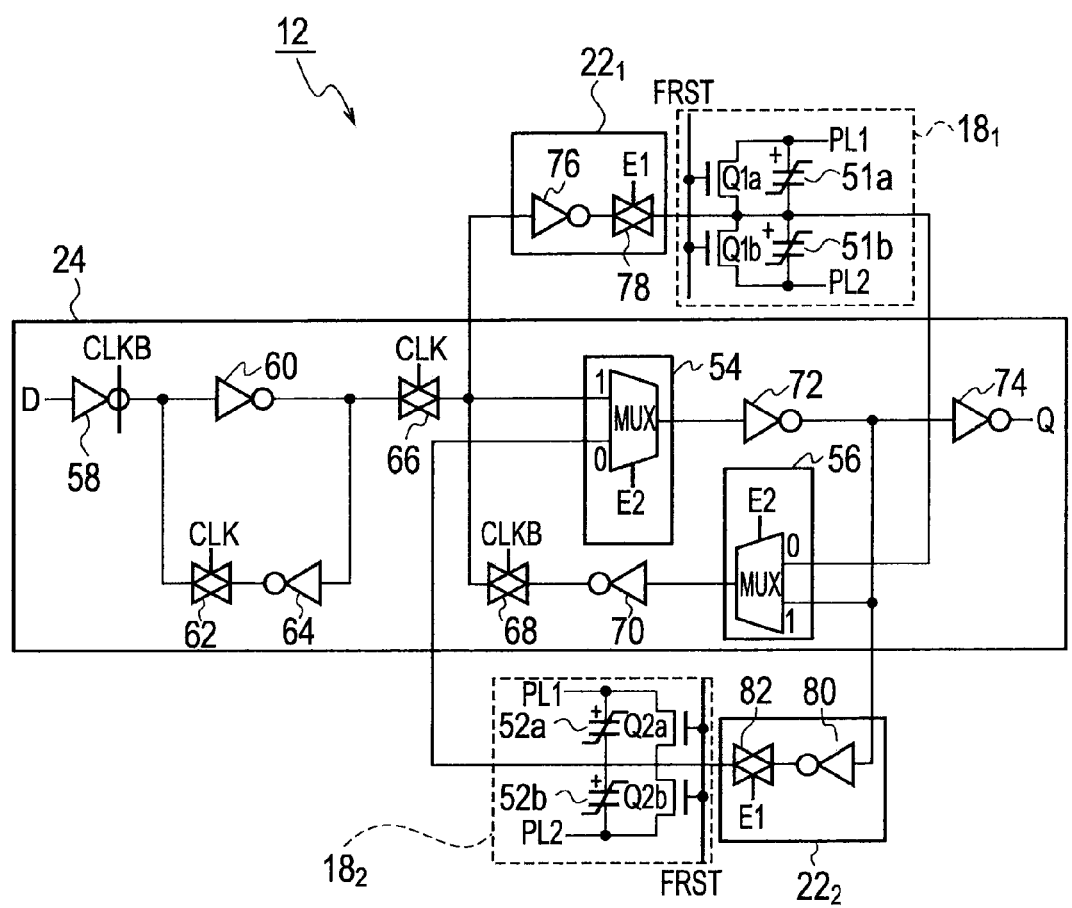
Figure 5:
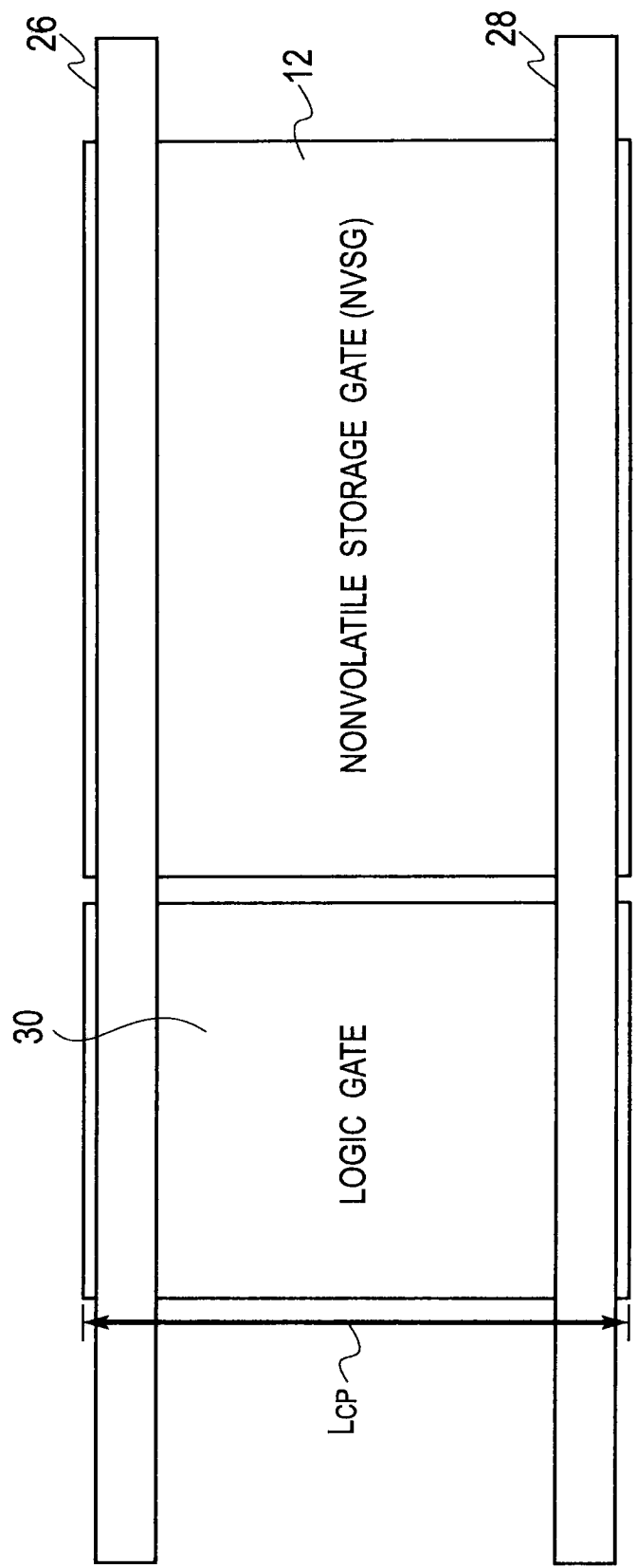
Figure 6:
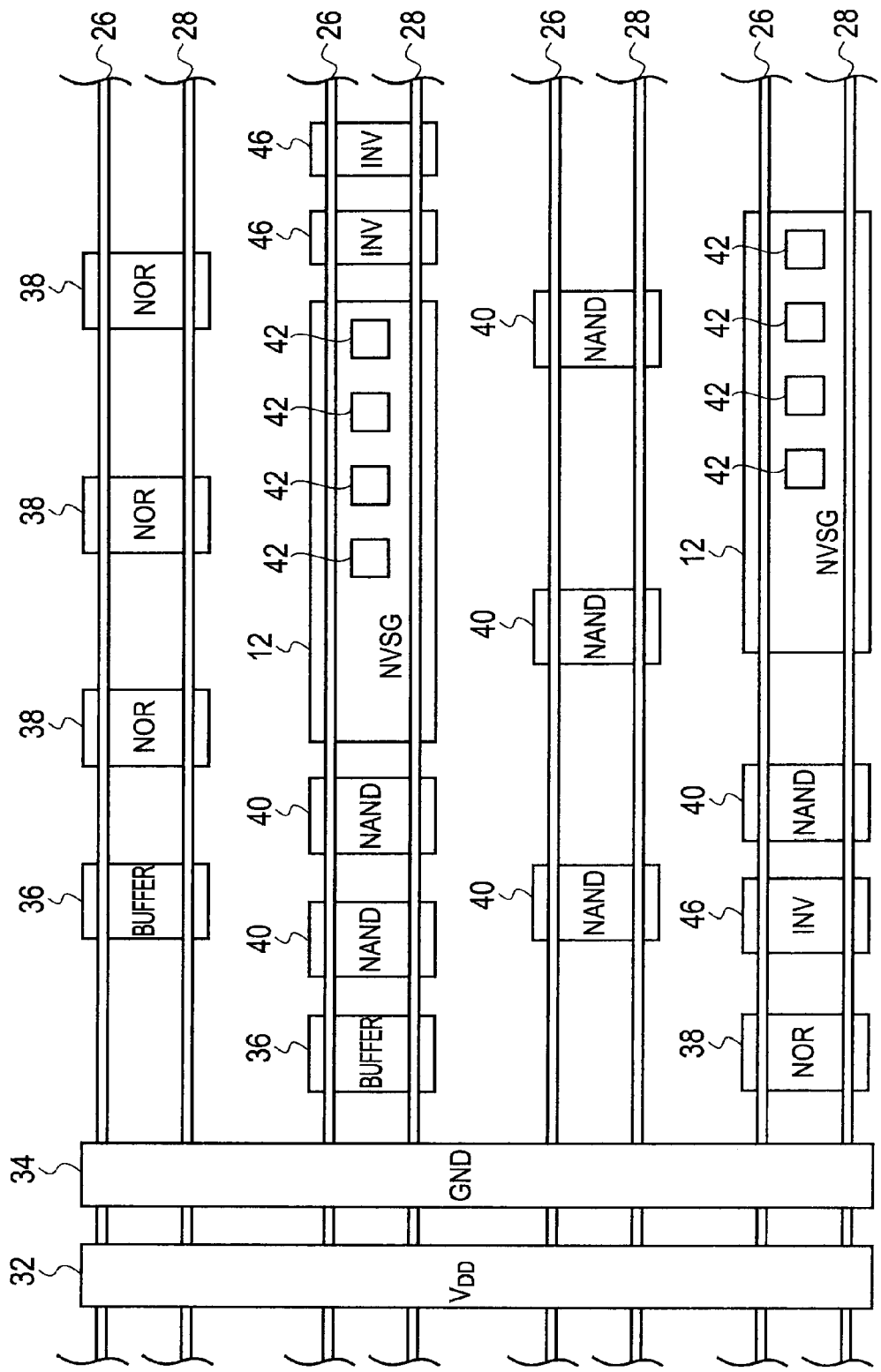
Figure 7:
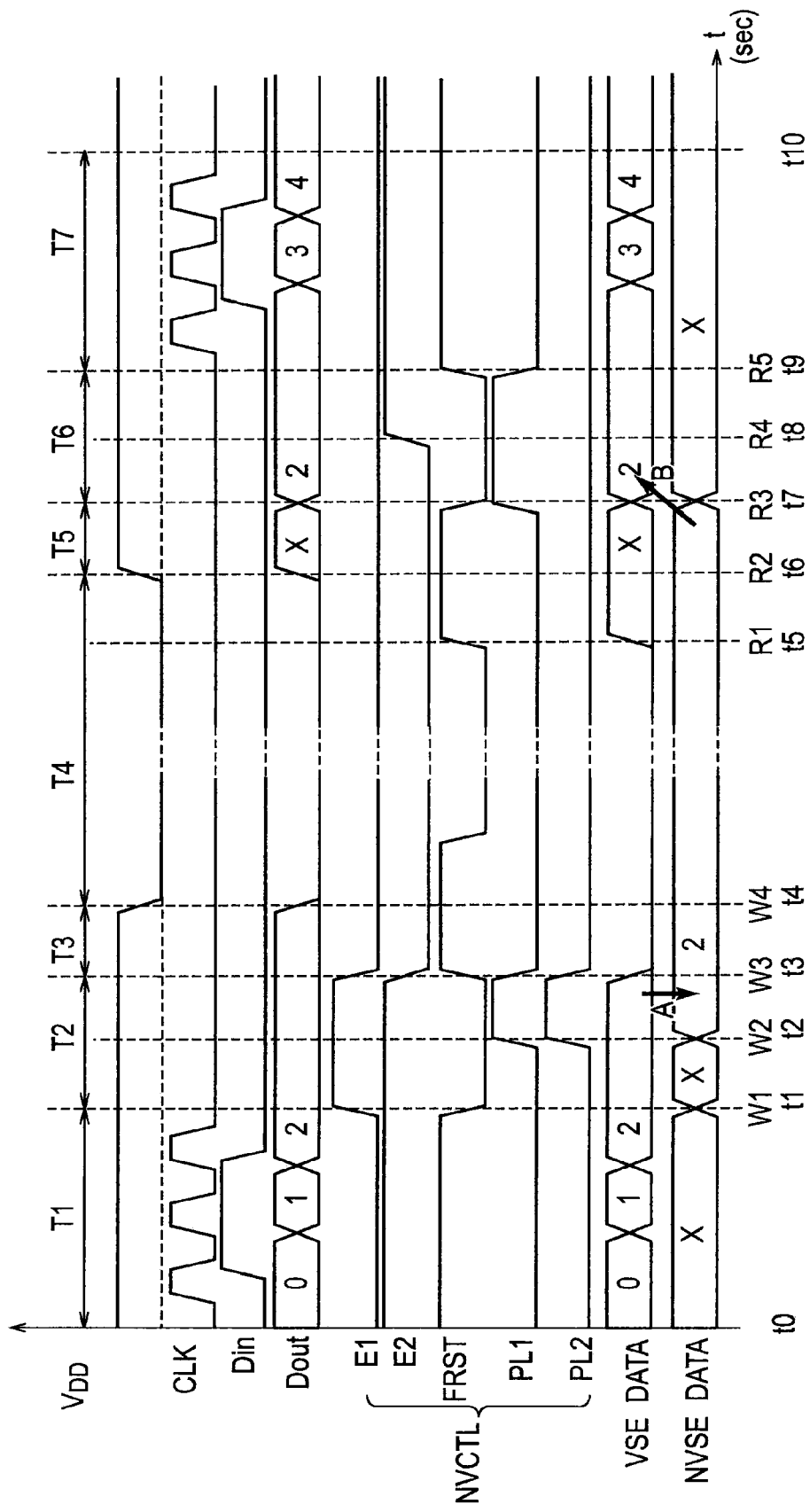
Figure 8:
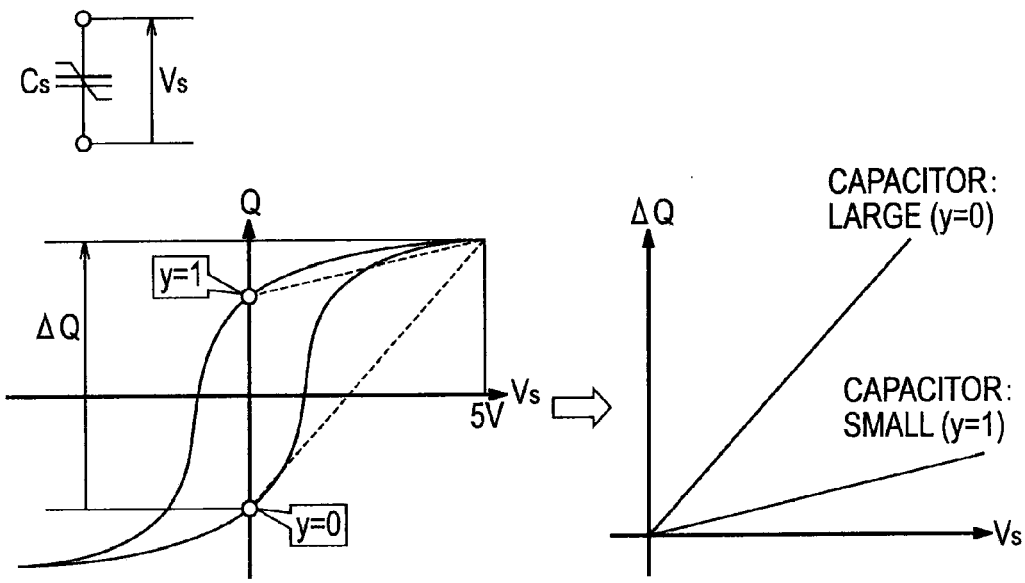
Figure 9:
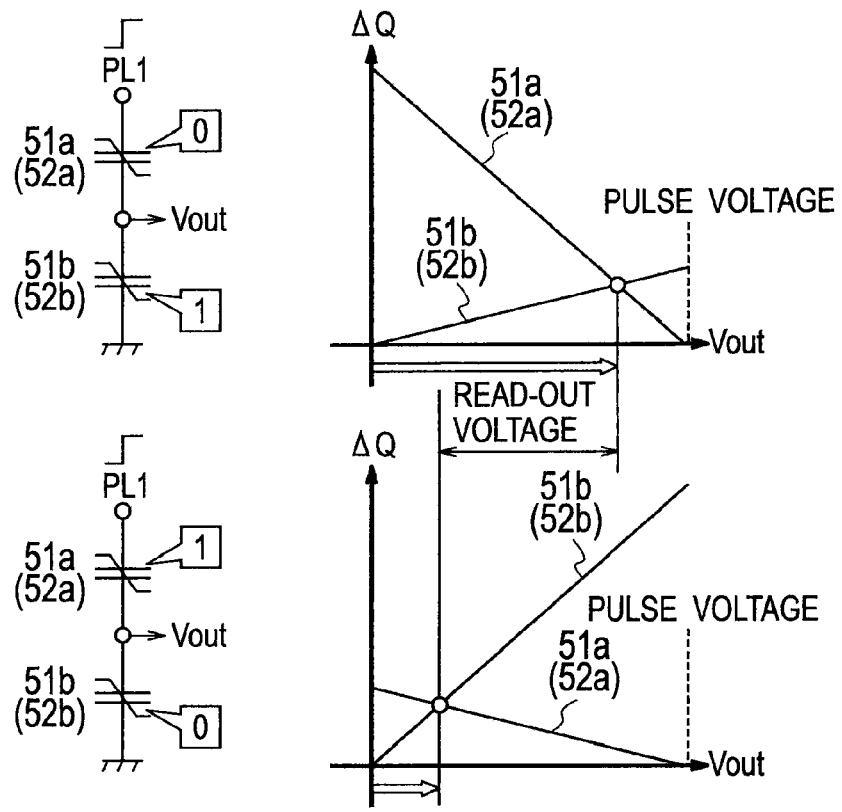
Figure 10:
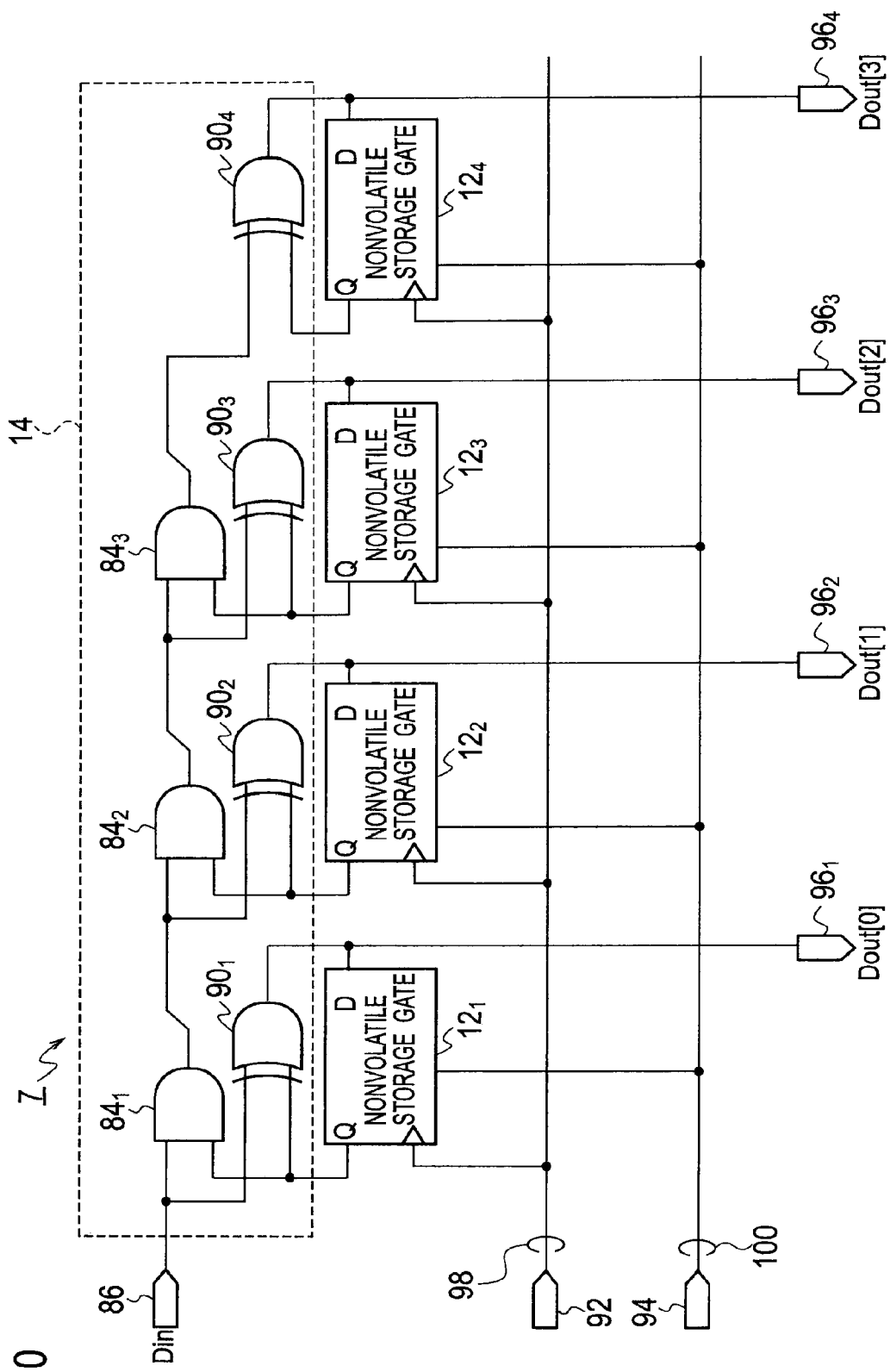
Figure 11:
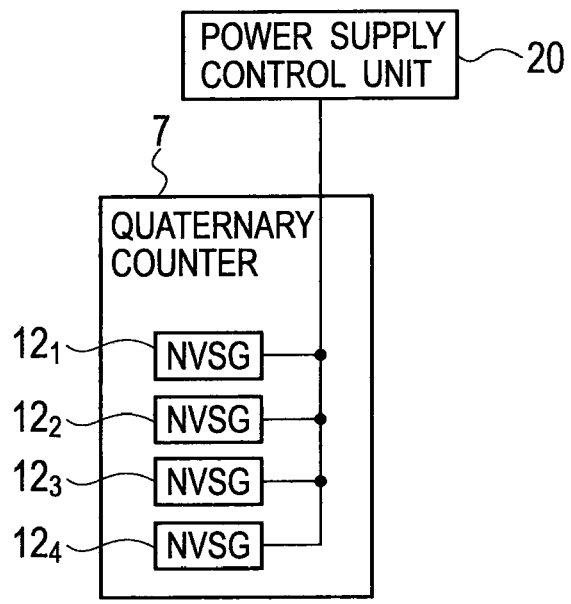
Figure 12:
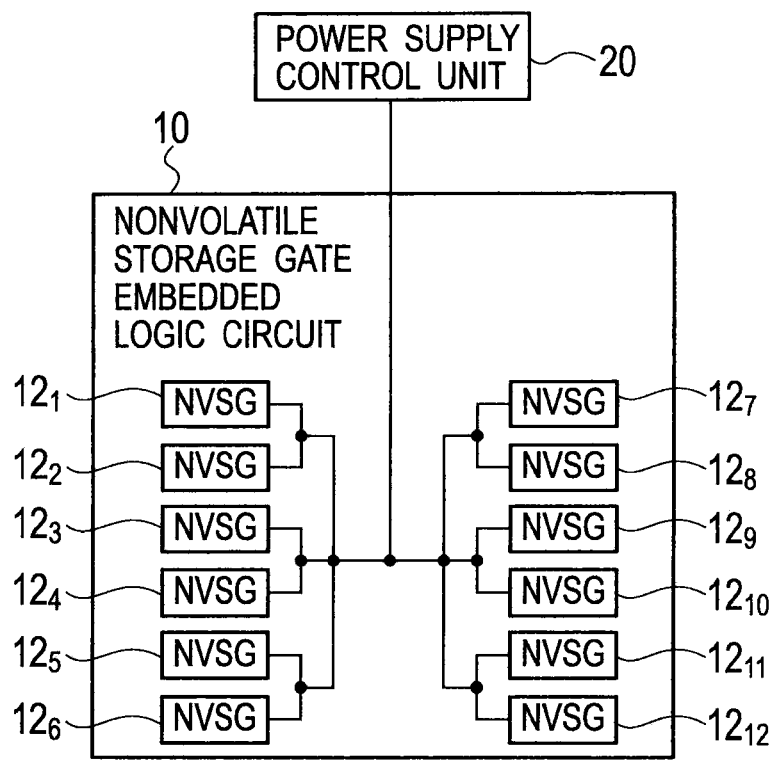
Figure 13:
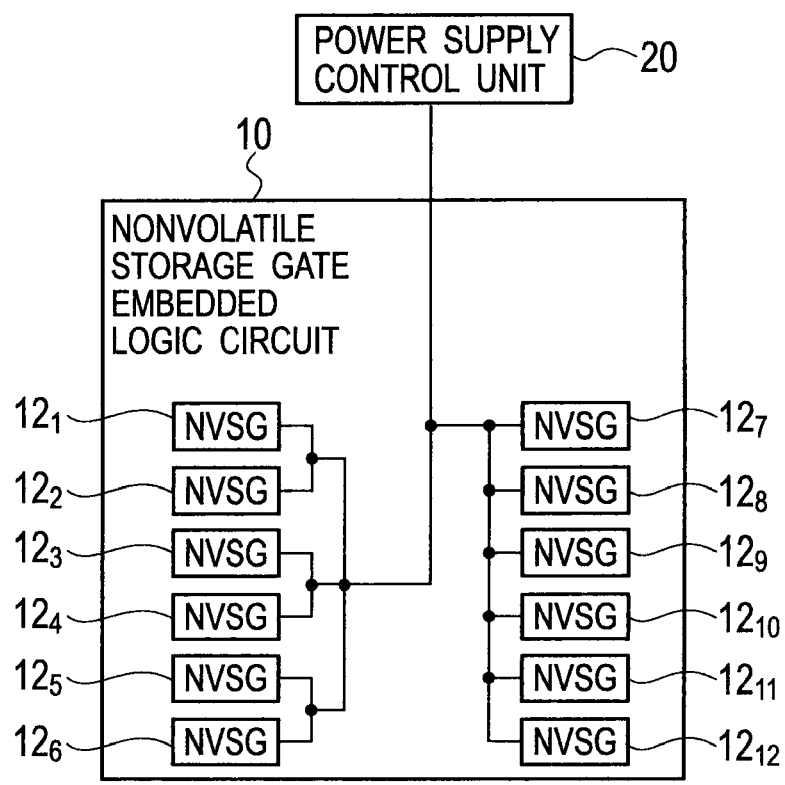
Figure 14:
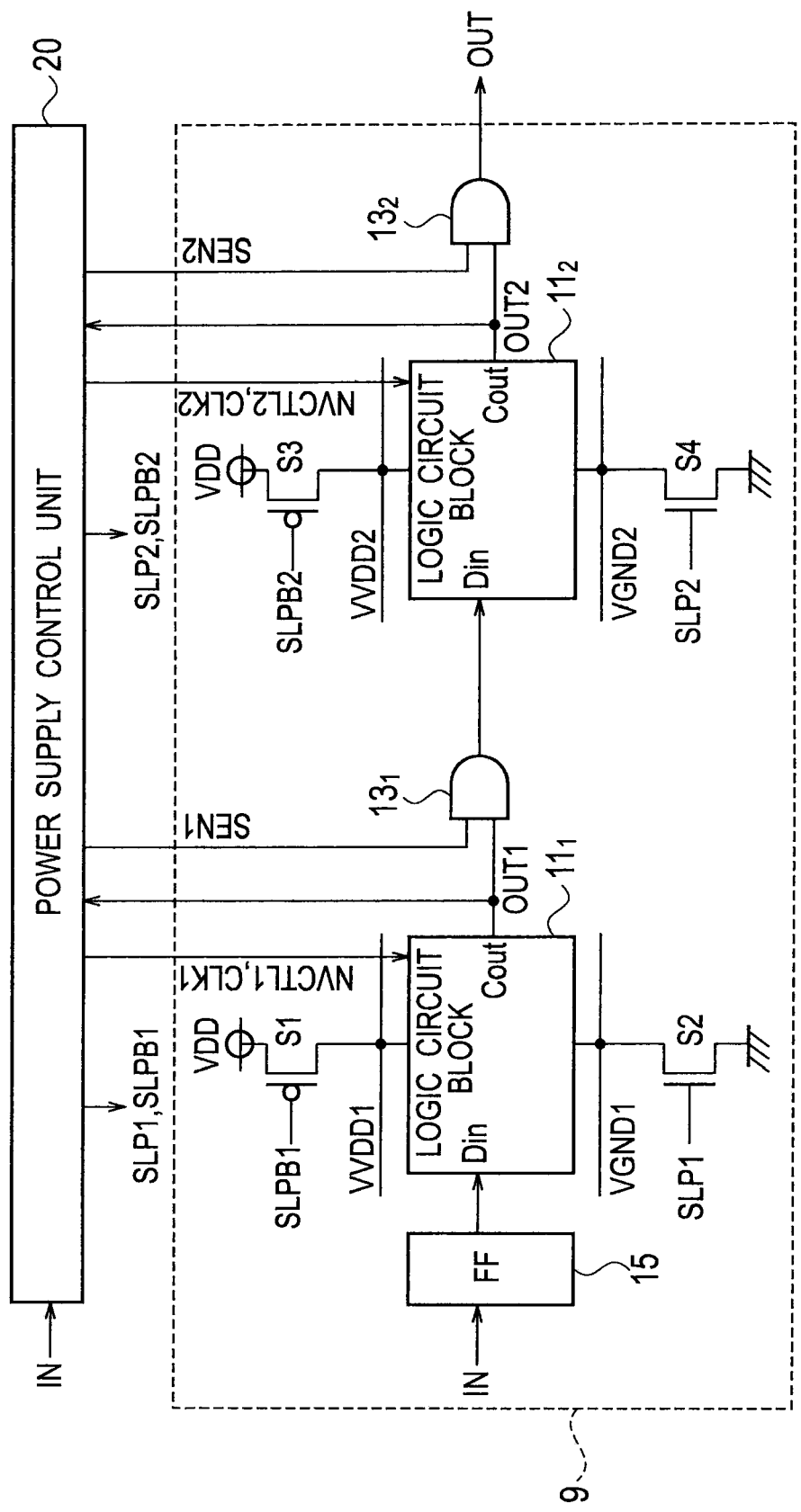
Figure 15:
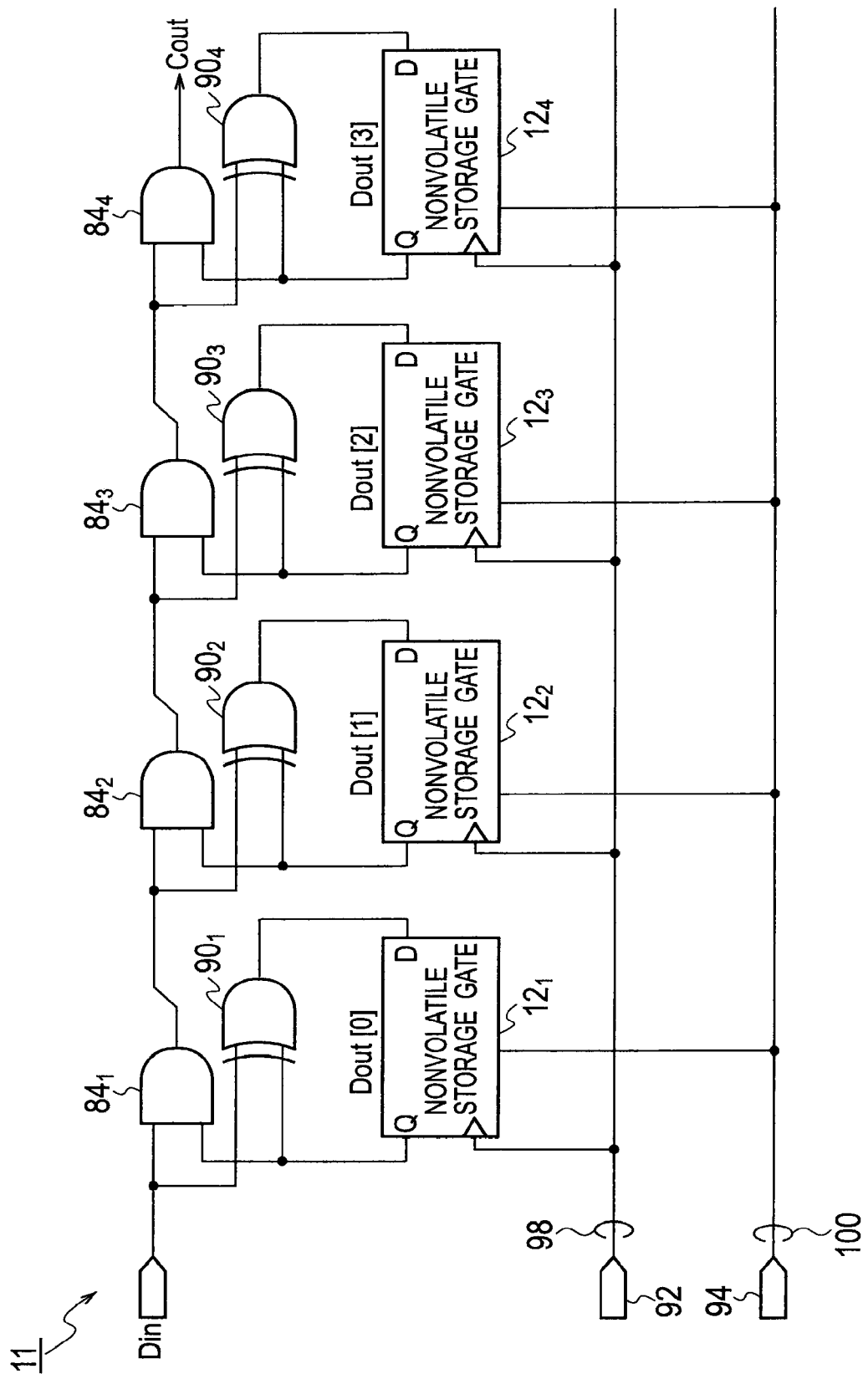
Figure 16:
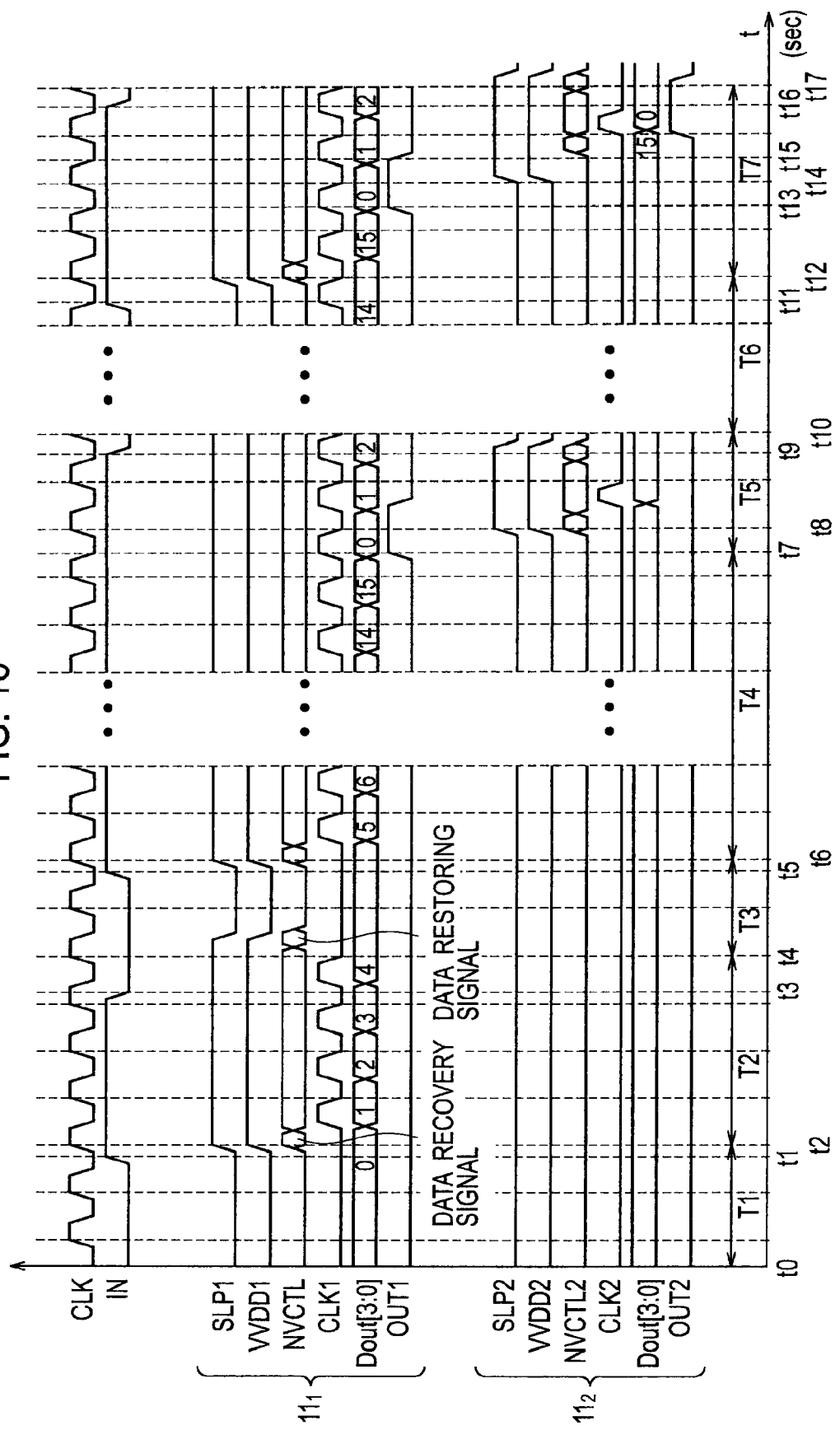
Figure 17:
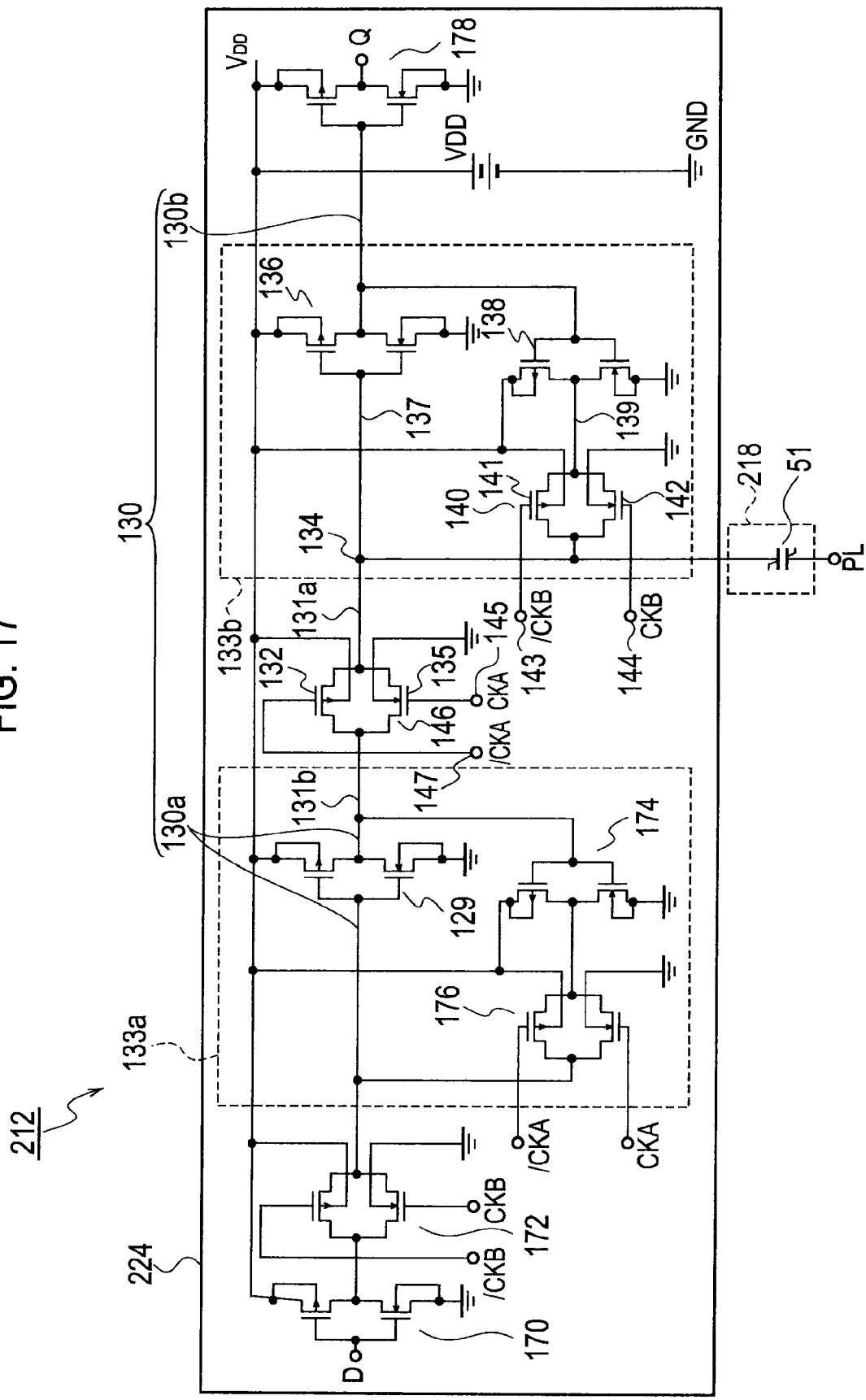
Figure 18:
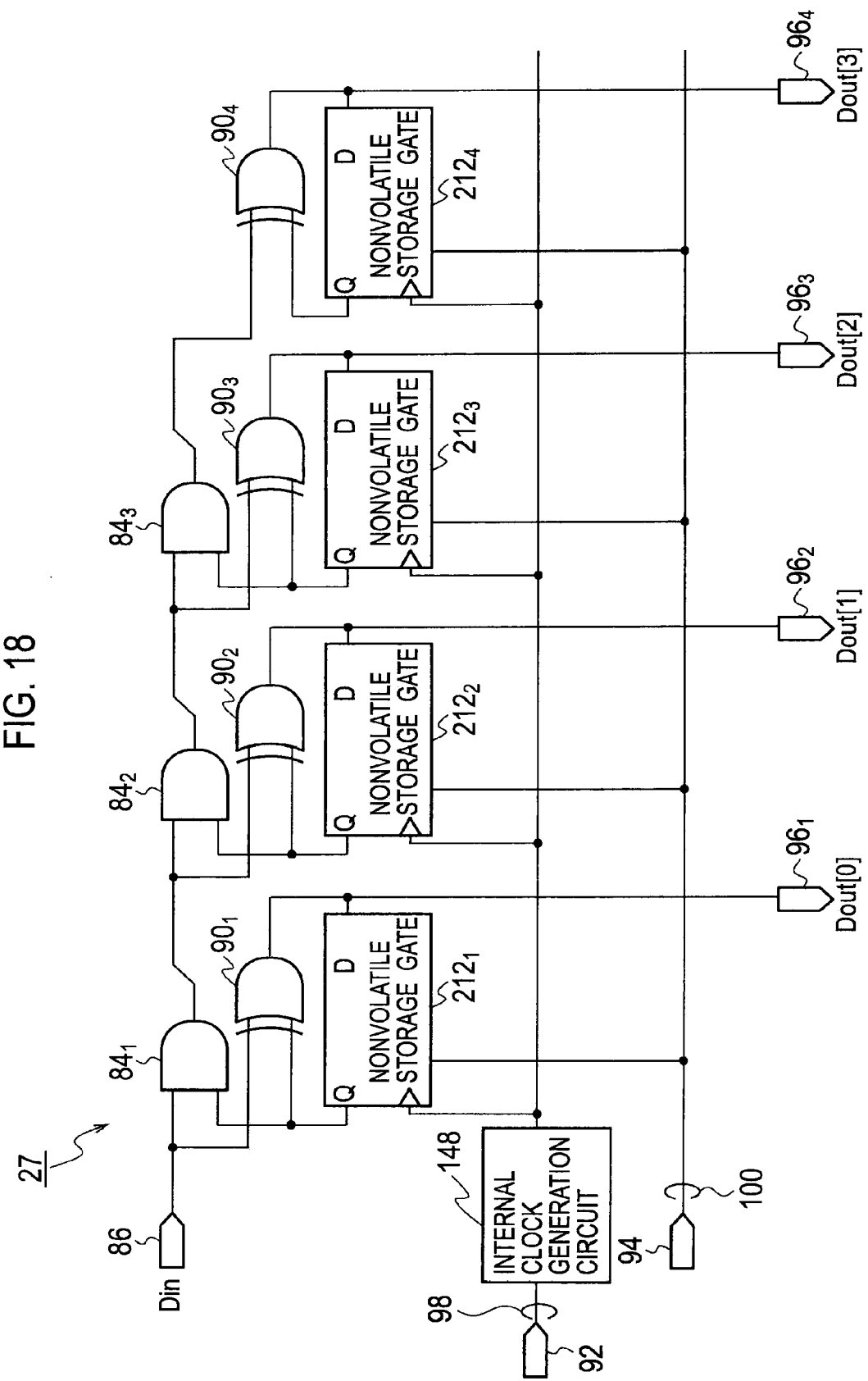
Figure 19:
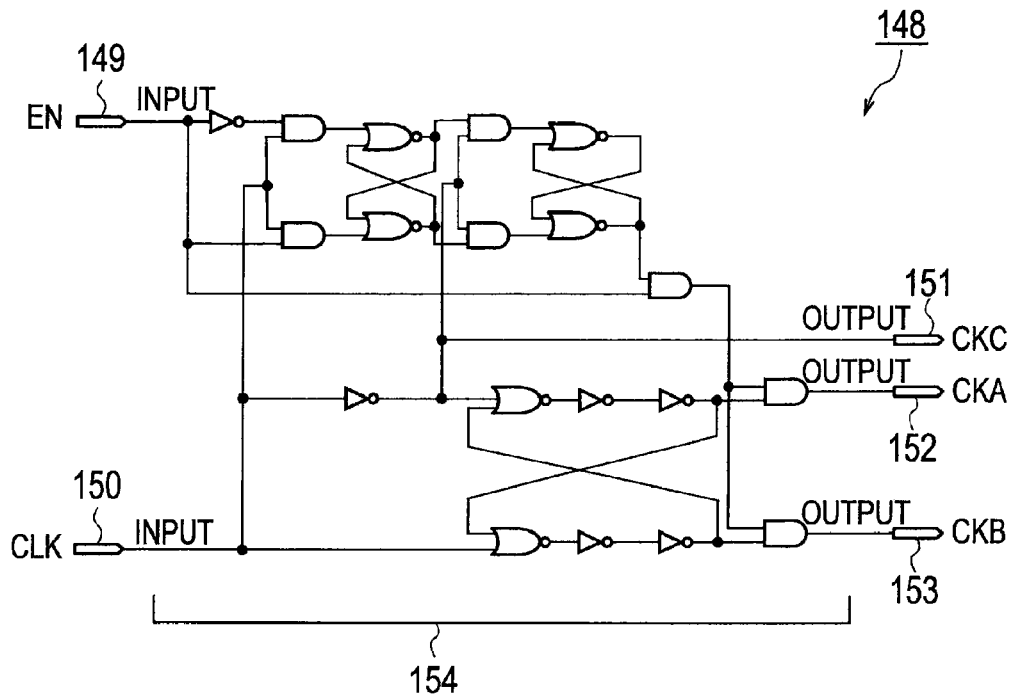
Figure 20:
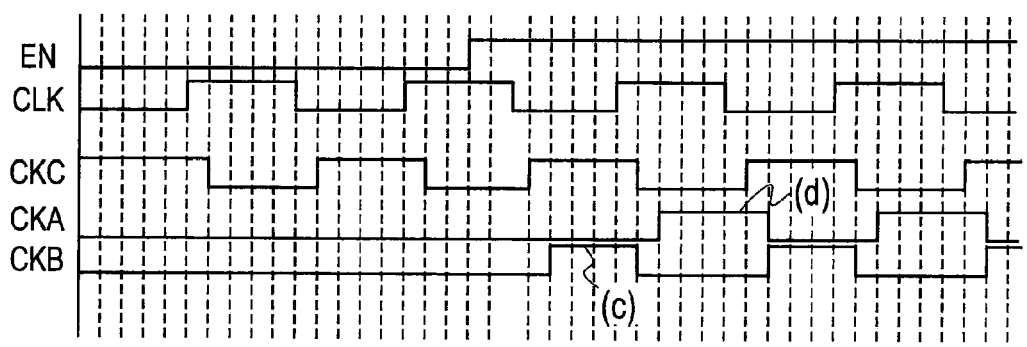
Figure 21:
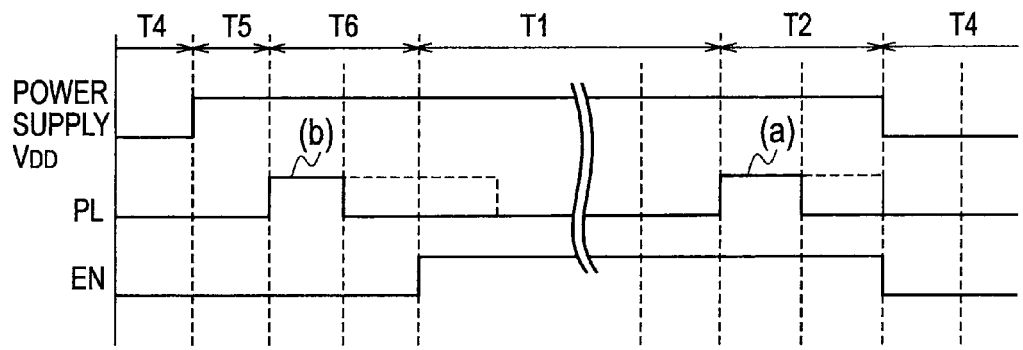
Figure 22:
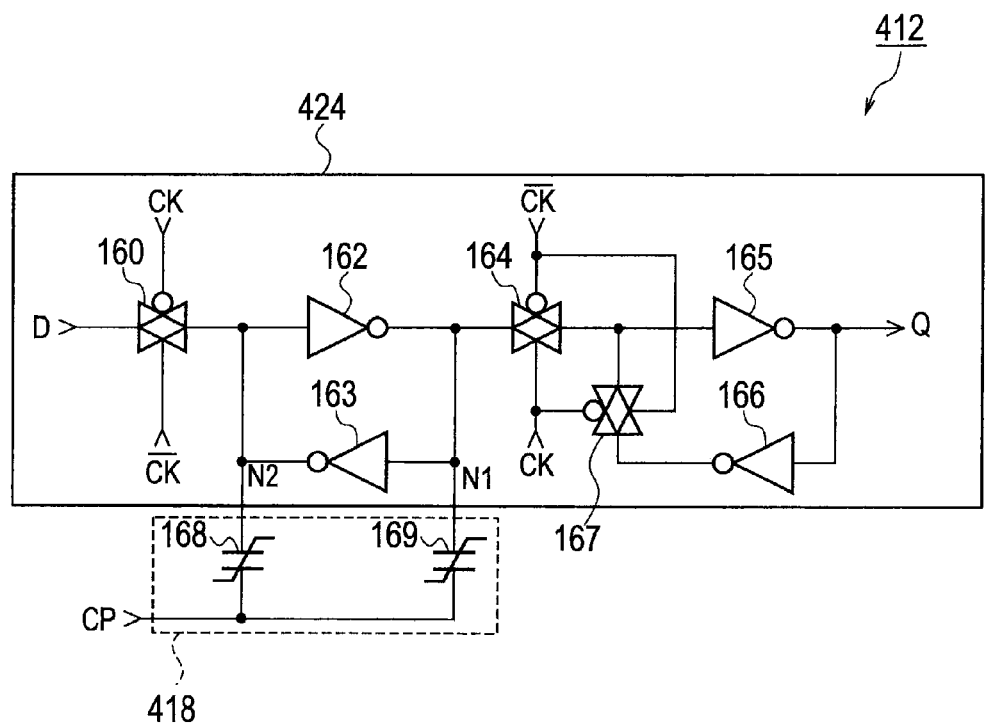
Figure 23:
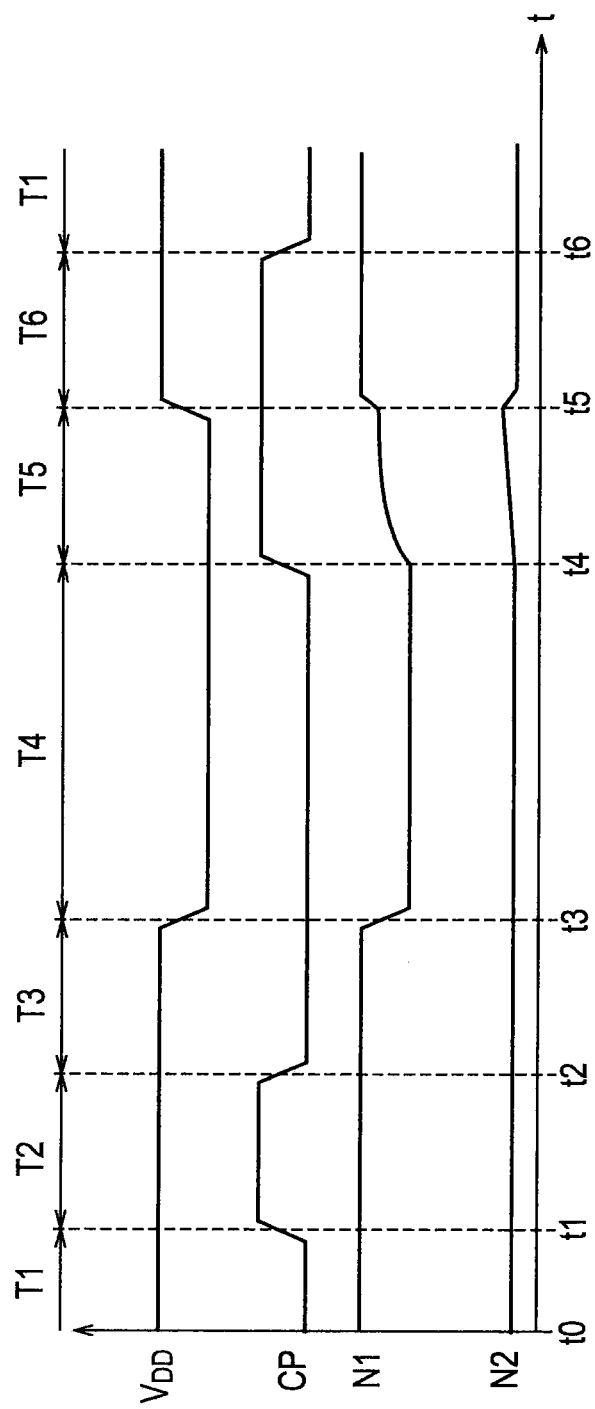
Figure 24:
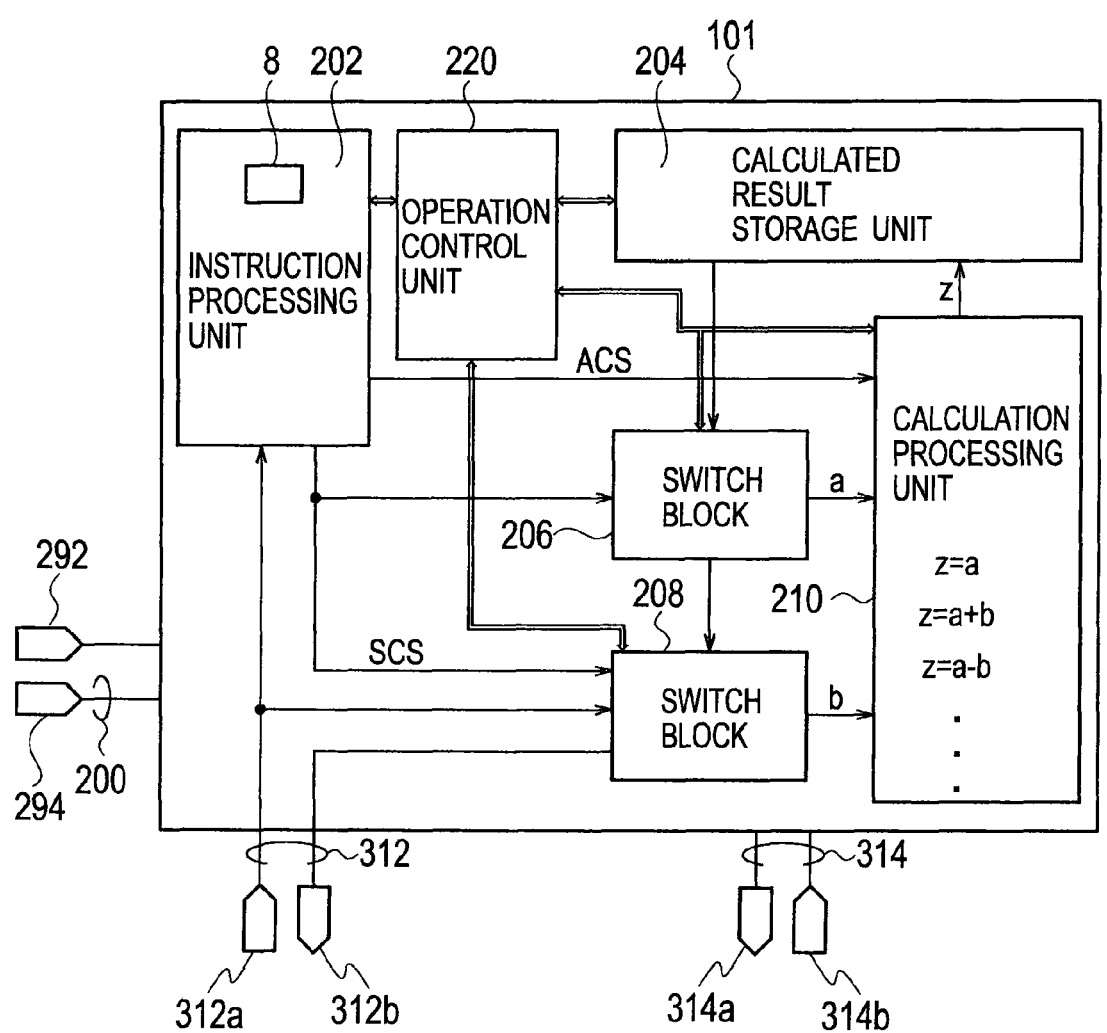
Figure 25:
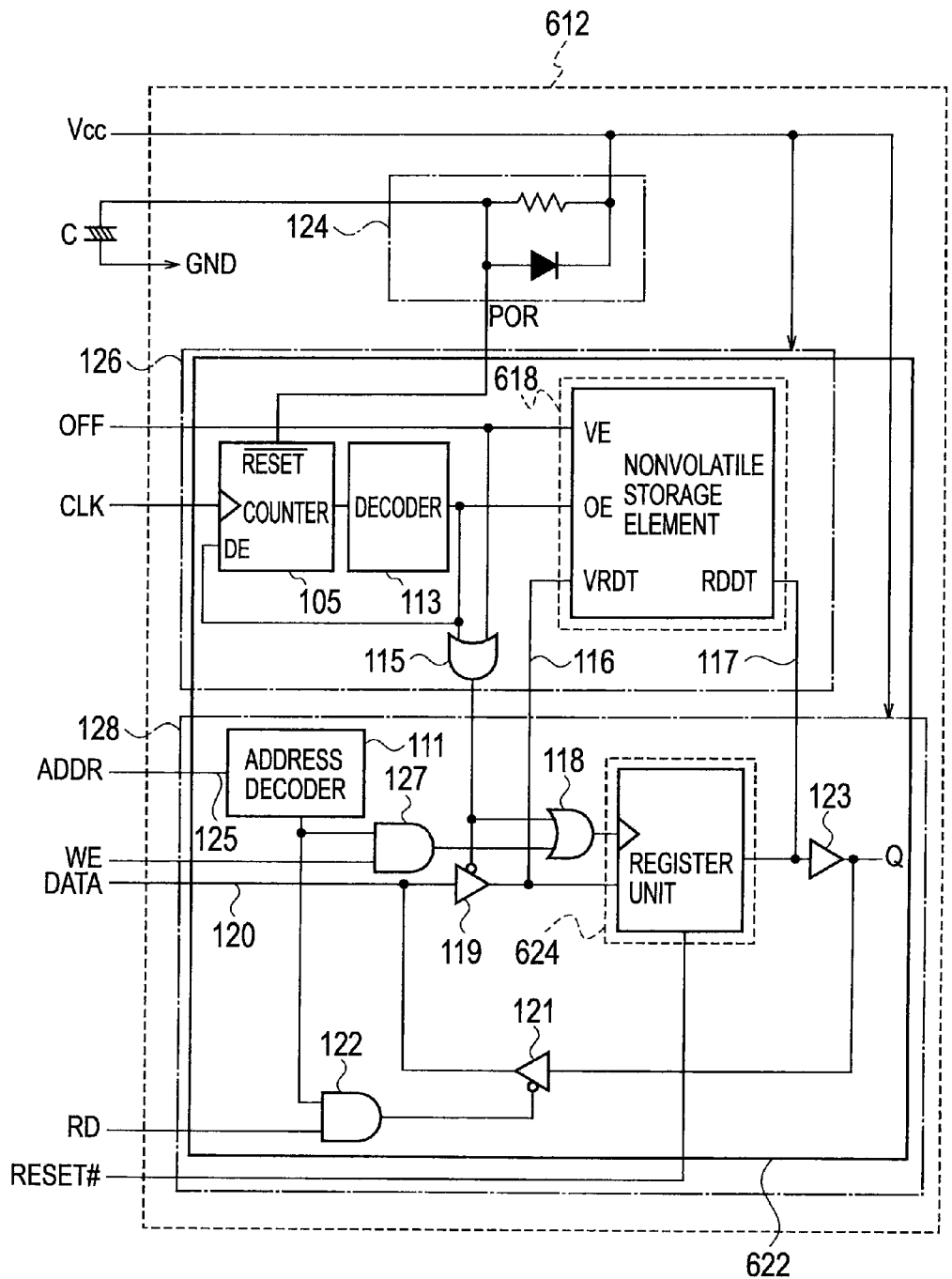
Figure 26:
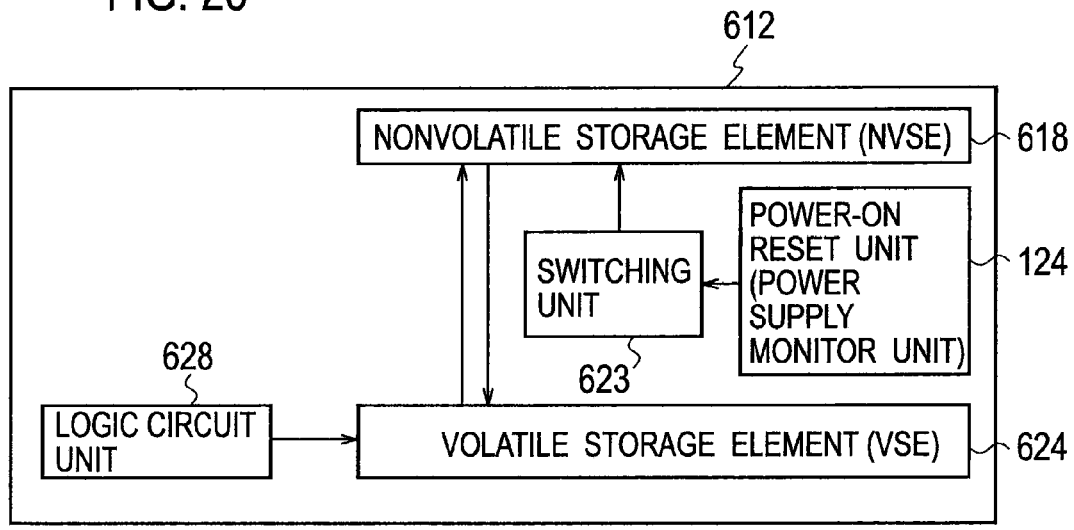
Figure 27:
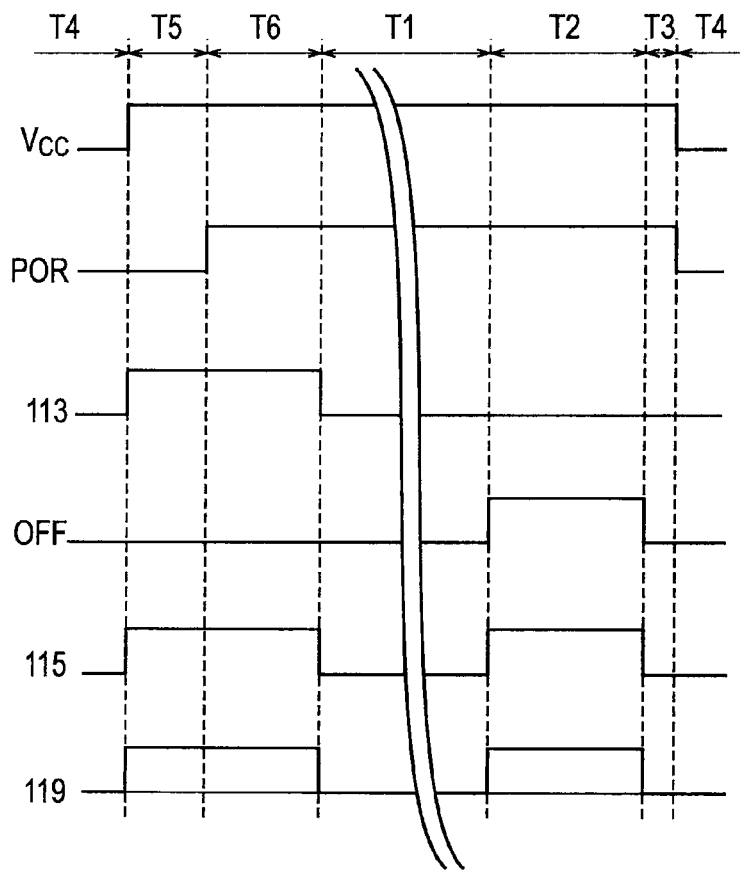
Figure 28:
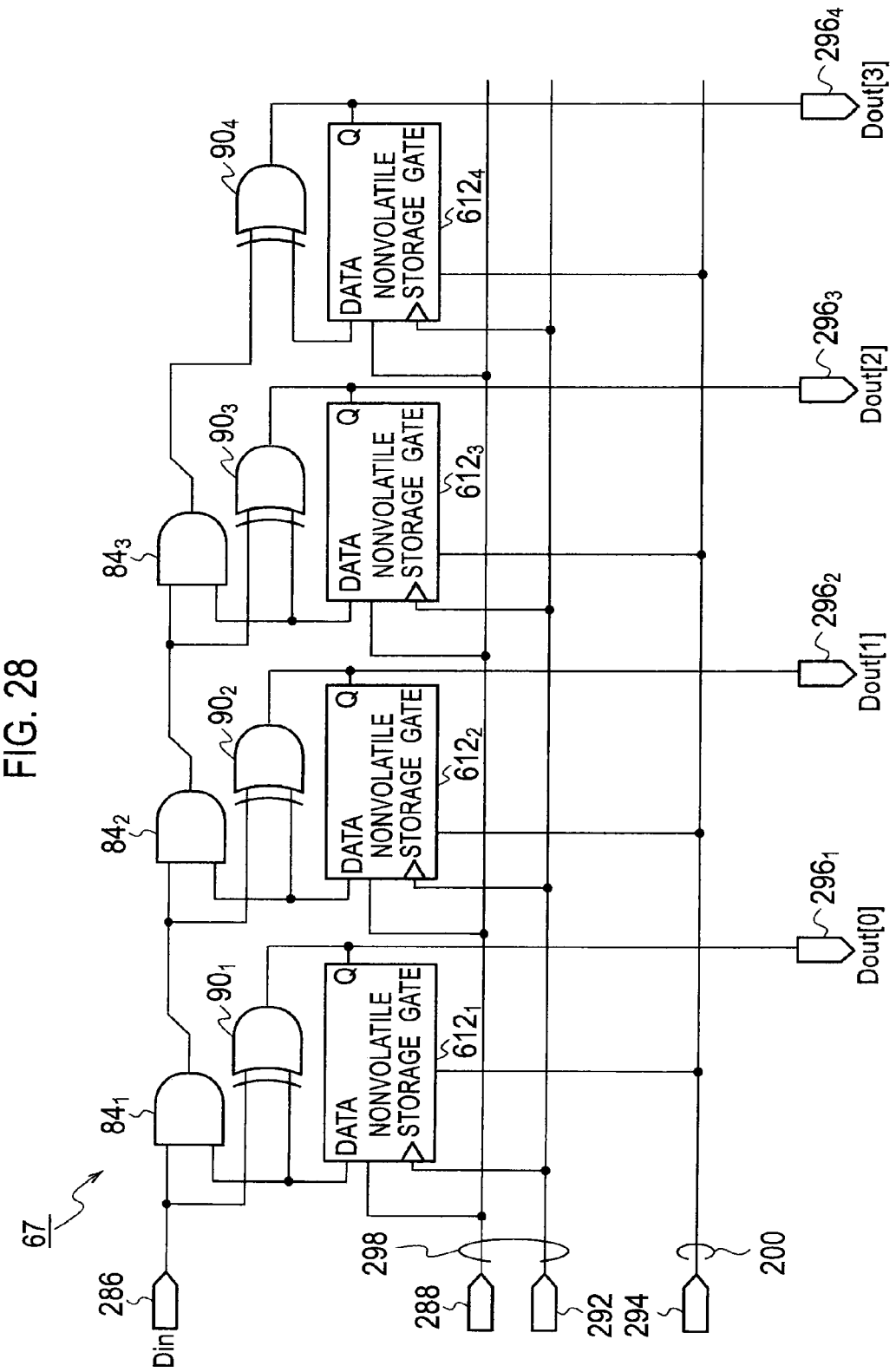

FIG. 4 A circuit configuration diagram of the configuration example 1 of the nonvolatile storage gate applicable to the nonvolatile storage gate embedded logic circuit according to the first embodiment of the present invention FIG. 5 A schematic layout pattern configuration example of the nonvolatile storage gate embedded logic circuit according to the first embodiment of the present invention FIG. 6 A detailed layout pattern configuration example of the nonvolatile storage gate embedded logic circuit according to the first embodiment of the present invention FIG. 7 A logic circuit timing chart of the configuration example 1 of the above-mentioned nonvolatile storage gate FIG. 8 A diagram for explaining the characteristics of a ferroelectric capacitor FIG. 9 A diagram for explaining the data read-out method using a capacitive coupling between the ferroelectric capacitors FIG. 10 A schematic circuit configuration diagram of a quaternary counter applied by the configuration example 1 of the above-mentioned nonvolatile storage gate FIG. 11 A configuration of a control line of the quaternary counter shown in FIG. 10 applied by the configuration example 1 of the above-mentioned nonvolatile storage gate, and a schematic block configuration diagram of a configuration example of a random/line type FIG. 12 A configuration of the control line of another nonvolatile storage gate embedded logic circuit, and a schematic block configuration diagram of a tree type configuration example FIG. 13 A configuration of the control line of the nonvolatile storage gate embedded logic circuit of further others, and a schematic block configuration diagram of a hybrid type configuration example FIG. 14 A schematic circuit configuration diagram of an octal counter applied by the configuration example 1 of the nonvolatile storage gate FIG. 15 A schematic circuit configuration diagram of a quaternary counter included in the above-mentioned octal counter FIG. 16 A timing chart of the octal counter applied by the configuration example 1 of the nonvolatile storage gate FIG. 17 A circuit configuration diagram of a configuration example 2 of a nonvolatile storage gate applicable to a nonvolatile storage gate embedded logic circuit according to the second embodiment of the present invention FIG. 18 A schematic circuit configuration diagram of a quaternary counter applied by the configuration example 2 of the above-mentioned nonvolatile storage gate FIG. 19 A diagram showing a configuration example of an internal clock generation circuit which operates the configuration example 2 of the above-mentioned nonvolatile storage gate FIG. 20 A logic circuit timing chart of the above-mentioned internal clock generation circuit FIG. 21 A logic circuit timing chart of the configuration example 2 of the above-mentioned nonvolatile storage gate FIG. 22 A circuit configuration diagram of a configuration example 3 of the nonvolatile storage gate applicable to the nonvolatile storage gate embedded logic circuit according to a third embodiment of the present invention FIG. 23 A logic circuit timing chart of the configuration example 3 of the above-mentioned nonvolatile storage gate FIG. 24 A schematic block configuration diagram of a nonvolatile CPU according to a fourth embodiment of the present invention FIG. 25 A circuit configuration diagram of a configuration example 4 of the nonvolatile storage gate applicable to the nonvolatile storage gate embedded logic circuit according to the fourth embodiment of the present invention FIG. 26 A schematic block configuration diagram of the nonvolatile storage gate which composes the above-mentioned nonvolatile storage gate embedded logic circuit FIG. 27 A logic circuit timing chart of the configuration example 4 of the above-mentioned nonvolatile storage gate FIG. 28 A schematic circuit configuration diagram of a quaternary counter applied by the configuration example 4 of the above-mentioned nonvolatile storage gate

REFERENCE SIGNS LIST 1 and 101: Nonvolatile CPU;
4, 6, and 8: Logic circuit block;
7, $11_1$, $11_2$, 27, and 67: Logic circuit block (quaternary counter);
9: Logic circuit (octal counter);
10: Nonvolatile storage gate embedded logic circuit;
12, $12_1$-$12_{12}$, 212, $212_1$-$212_{12}$, 412, 612, and $612_1$-$612_{12}$: Nonvolatile storage gate (NVSG);
$13_1$ and $13_2$: Insulated gate;
14: Logic calculation unit;
15: Flip-flop (FF);
16 and 30: Logic gate;
18, 218, 418, and 618: Nonvolatile storage element (NVSE);
20: Power supply control unit;
22: Data interface (I/F) control unit;
24, 224, 424, and 624: Volatile storage element (VSE);
26: Power supply line ($V_{DD}$ line, VVDD1);
28: Ground line (GND line, VGND1);
32: Global power supply line ($V_{DD}$);
34: Global ground line (GND);
36 and 123: Buffer;
38: NOR gate;
40: NAND gate;
42, 51a, 51b, 52a, 52b, 168, and 169: Ferroelectric capacitor;
46, 58, 60, 64, 70, 72, 74, 76, 80, 162, 163, 165, and 166: Inverter;
54 and 56: Multiplexer;
62, 66, 68, 78, 82, 160, 164, and 167: Pass switch;
$84_1$-$84_4$, 122, and 127: AND gate;
86 and 286: Quaternary counter data input terminal;
88 and 288: Normal operation control terminal;
$90_1$-$90_4$: Exclusive OR gate;
92, 192, and 292: Clock control terminal;
94, 194, and 294: Nonvolatile operation control terminal;
$96_1$-$96_4$, and $296_1$-$296_4$: Quaternary counter data output terminal;
98 and 298: Normal operation control line;
100 and 200: Nonvolatile operation control line;
102 and 202: Instruction processing unit;
104 and 204: Calculated result storage unit;
105: Counter;
106, 108, 206, and 208: Switch block;
110 and 210: Calculation processing unit;

111: Address decoder;
112 and 312: Program/data input/output line;
113: Decoder;
114 and 314: Control signal input/output line;
115 and 118: OR gate;
116: Read-out internal data bus;
117: Write-in internal data bus;
119 and 121: Tri-state buffer;
120: Data bus;
124: Power-ON reset unit (power supply monitor unit);
125: Address bus;
126: Register content storing unit;
128: Conventional circuit unit;
129, 136, and 138: Inverter circuit;
130a: Input side data propagation path;
130b: Output side data propagation path;
131a: One end;
131b: Other end;
132, 135, 141, and 142: MOS transistor;
133a and 133b: Data holding circuit;
134: Ferroelectric connection node;
137: Input node;
139: Output node;
140 and 146: Transfer gate;
143, 144, 145, and 147: Gate terminal;
148: Internal clock generation circuit;
149: Enable signal input terminal;
150: Basic clock input terminal;
151: Third clock output terminal;
152: First clock output terminal;
153: Second clock output terminal;
154: Clock generation unit;
220: Operation control unit;
622: Switching unit;
628: Logic circuit unit;
D: Data input signal;
Q: Data output signal;
CLK, CKA, /CKA, CKB, /CKB, CKC, and /CKC: Clock signal;
E1: Ferroelectric element write-in signal;
E2: Normal operation signal;
FRST: Ferroelectric element both ends short circuit signal;
PL, PL1, and PL2: Ferroelectric element driving signal;
CP: Cell plate;
$V_{CC}$, and $V_{DD}$: Power supply voltage;
N1, and N2: Storage node;
NVCTL: Nonvolatile storage control signal (external control signal);
SLP1 and SLP2: Power supply control signal;
SLPB1 and SLPB2: Inverted power supply control signal; and
S1-S4: Transistor.

DESCRIPTION OF EMBODIMENTS

Next, an embodiment of the invention will be described with reference to drawings. It explains simple by attaching the same reference numeral as the same block or element to below, and avoiding duplication of description. The drawing is schematic and it should care about differing from an actual thing. Of course, the part from which the relation and ratio of a mutual size differ also in mutually drawings is included.

The embodiment shown in the following exemplifies the device and method for materializing the technical idea of this invention, and this embodiment of the invention does not specify assignment of each component parts, etc. as the following. Various changes can be added to the technical idea of this invention in scope of claims.

First Embodiment

Nonvolatile CPU

Figure 1:
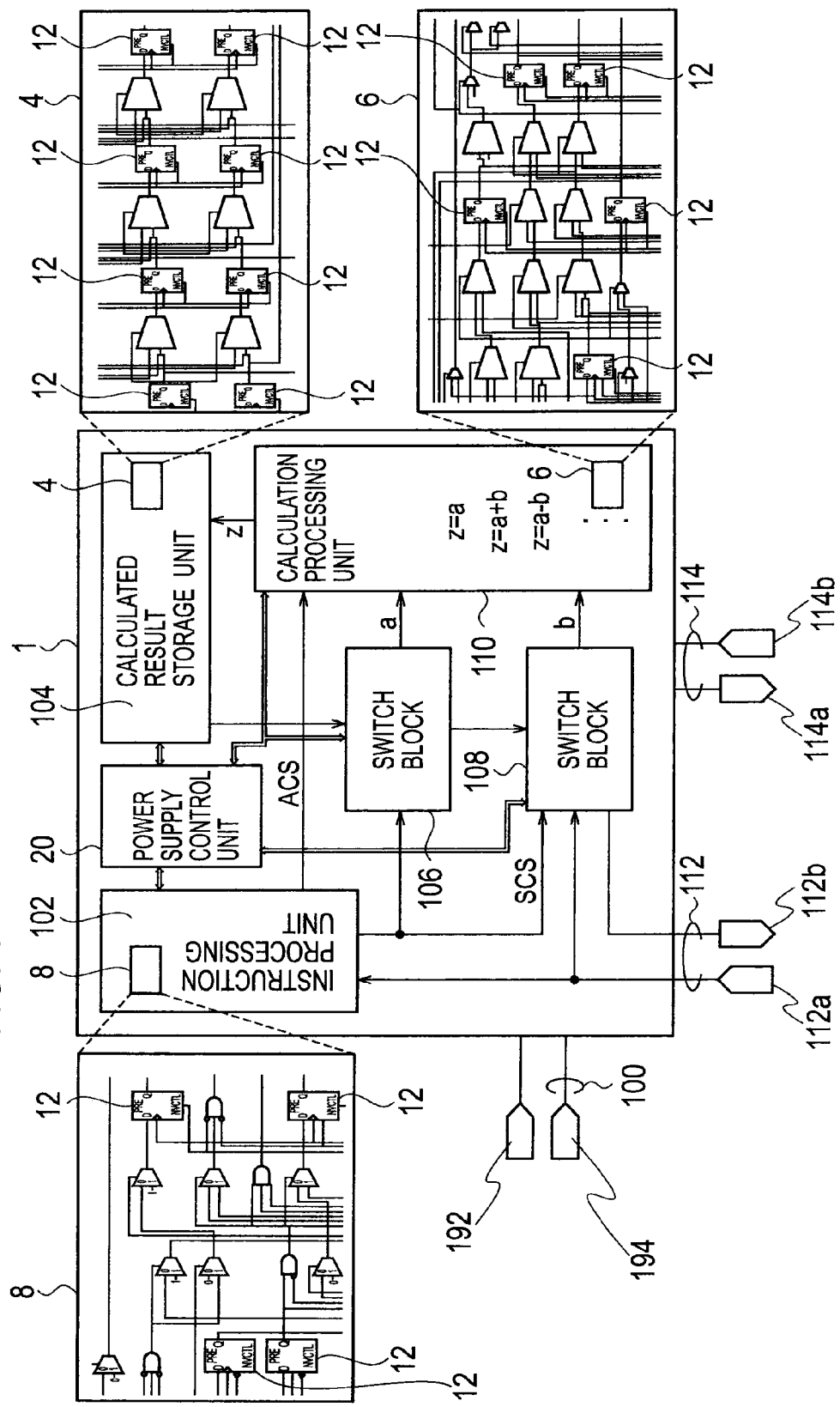
FIG. 1 A schematic block configuration diagram of a nonvolatile CPU applying a configuration example 1 of a nonvolatile storage gate composing a nonvolatile storage gate embedded logic circuit according to a first embodiment of the present invention FIG. 2 (*a*) A schematic configuration diagram of the whole nonvolatile storage gate embedded logic circuit according to the first embodiment of the present invention.

As shown in FIG. 1, a nonvolatile CPU1 according to the first embodiment of the present invention includes: an instruction processing unit 102; a calculation processing unit 110 which is connected to the instruction processing unit 102 and receives an arithmetic control signal ACS from the instruction processing unit 102; a calculated result storage unit 104 which is connected to the calculation processing unit 110 and receives an arithmetic output signal z from the calculation processing unit 110; a switch block 106 which is connected to the calculated result storage unit 104 and the instruction processing unit 102, and supplies an output signal a to the calculation processing unit 110; and a switch block 108 which is connected to the switch block 106 and the instruction processing unit 102, receives a switch control signal SCS from the instruction processing unit 102, and supplies an output signal b to the calculation processing unit 110.

The nonvolatile CPU1 further includes a power supply control unit 20 which performs power control. While the power supply control unit 20 controls the power supply to the instruction processing unit 102, the calculated result storage unit 104, the switch blocks 106 and 108, and the calculation processing unit 110, the power supply control unit 20 bus-connects to each part to exchange data. The power supply control unit 20 outputs a nonvolatile storage control signal (NVCTL) to a nonvolatile storage gate 12 described later.

Through a program/data input/output line 112, a program/data input terminal 112a is connected to the instruction processing unit 102, and a program/data output terminal 112b is connected to the switch block 108.

Moreover, as shown in FIG. 1, a control signal input terminal 114b and a control signal output terminal 114a are connected to the nonvolatile CPU 1 through a control signal input/output line 114.

Moreover, as shown in FIG. 1, a clock signal CLK is supplied to the nonvolatile CPU 1 through a clock control terminal 192, and a ferroelectric element write signal E1, a normal operation signal E2, ferroelectric element driving signals PL1 and PL2, and a ferroelectric element both ends short circuit signal FRST are supplied to the nonvolatile CPU 40 through a nonvolatile operation control terminal 194 connected to a nonvolatile operation control line 100.

Moreover, as shown in FIG. 1, the instruction processing unit 102 includes a logic circuit block 8 having a nonvolatile memory gate 12, the calculated result storage unit 104 includes a logic circuit block 4 having the nonvolatile storage gate 12, and the calculation processing unit 110 includes a logic circuit block 6 having the nonvolatile storage gate 12.

(Nonvolatile Storage Gate Embedded Logic Circuit)

The nonvolatile storage gate embedded logic circuit 10 of FIG. 2 shows a part of the instruction processing unit 102 shown in FIG. 1.

The above-mentioned nonvolatile storage gate embedded logic circuit 10 includes the logic circuit block 8 as shown in FIG. 2(a). The nonvolatile storage gate embedded logic circuit 10 further includes a quaternary counter 7 and an octal counter 9.

As shown in FIG. 2(b), the logic circuit block 8 includes the logic calculation unit 14 having a logic gate 16, and the nonvolatile storage gate 12 connected to the logic gate 16 in a logic calculation unit 14, and disposed so as to be adjoining to the logic calculation unit 14.

The above-mentioned nonvolatile storage gate embedded logic circuit 10 includes the logic calculation unit 14 having the logic gate 16 and the nonvolatile storage gate 12 as shown in FIG. 2(a) to FIG. 2(c). The nonvolatile storage gate 12 includes: a nonvolatile storage element 18; a data interface control unit 22 which is disposed so as to be adjoining to the nonvolatile storage element 18, and receives a nonvolatile storage control signal NVCTL for data read-out/data write-in from/to the nonvolatile storage element 18; and a volatile storage element 24 which is disposed so as to be adjoining to the data interface control unit 22, receives a data input signal D from a data input terminal and a clock signal CLK from a clock input terminal, and outputs a data output signal Q from a data output terminal.

Moreover, in the nonvolatile gate embedded logic circuit 10, the logic gate 16 includes an inverter, a NAND element, a NOR element, etc. without a storage function and not using data storage. The volatile storage element 24 includes storage gates, such as a latch and a register.

Moreover, in the nonvolatile gate embedded logic circuit 10, the nonvolatile storage element 18 is applied only to the storage gate parts, such as the latch and register of the volatile storage element 24.

Moreover, in the nonvolatile gate embedded logic circuit 10, the same volatile operation as the existing storage gate is possible for the nonvolatile storage element 18.

Moreover, in the nonvolatile gate embedded logic circuit 10, the data interface control unit 22 includes an external terminal for receiving an external control signal (nonvolatile storage control signal) NVCTL for data read-out/data write-in from/to the nonvolatile storage element 18.

Moreover, the data interface control unit 22 of the nonvolatile storage gate 12 includes a function to perform data write-in to the nonvolatile storage element 18, corresponding to a power supply cutoff detection signal (not shown) from the power supply control unit 20 of the nonvolatile CPU 1.

Moreover, in the nonvolatile gate embedded logic circuit 10, the nonvolatile storage element 18 includes a ferroelectric element. However, it may not limit to the configuration, and may include a floating gate MOS transistor, a magneto resistance effect element, or a phase change element, for example.

(Nonvolatile Memory Gate)

As shown in FIG. 2(c), the nonvolatile storage gate 12 includes: a Nonvolatile Storage Element (NVSE) 18; a data interface control unit 22 which is disposed so as to be adjoining to the nonvolatile storage element 18, and receives a nonvolatile storage control signal NVCTL for data read-out/data write-in from/to the nonvolatile storage element 18; and a Volatile Storage Element (VSE) 24 which is disposed so as to be adjoining to the data interface control unit 22, receives a data input signal D from a data input terminal and a clock signal CLK from a clock input terminal, and outputs a data output signal Q from a data output terminal.

(Operation Example of Nonvolatile Storage Gate Embedded Logic Circuit)

A logic circuit operation of the nonvolatile storage gate 12 is shown using a timing chart of power supply $V_{DD}$ of logic circuit, a clock signal CLK, a nonvolatile storage control signal NVCTL, a volatile data signal VSEDATA, and a nonvolatile data signal NVSEDATA, as shown in FIG. 3.

(a) First of all, in a normal operation period T1 of timing t0 to t1, as shown by the NVSE waiting signal U1, it is in a normal operation state.

(b) Next, in a data write-in period T2 of timing t1 to t2, as shown by a data write-in signal U2, data write-in (arrow A) from the volatile storage element 24 to the nonvolatile storage element 18 is executed.

(c) Next, in a power supply cutoff waiting period T3 of timing t2 to t3, as shown by a power supply cutoff waiting signal U3, it is in a power supply cutoff waiting state.

(d) Next, in a power supply cutoff period T4 of timing t3 to t4, it is in a power supply cutoff state.

(e) Next, in a power recovery waiting period T5 of timing t4 to t5, as shown by a power recovery waiting signal U4, it is in a power recovery waiting state.

(f) Next, in a data read-out period T6 of timing t5 to t6, as shown by a data read-out signal U5, data read-out (arrow B) to the volatile storage element 24 from the nonvolatile storage element 18 is executed.

(Configuration Example of Nonvolatile Memory Gate)

In for more details, as shown in FIG. 4, the nonvolatile storage gate 12 according to the present embodiment includes: first and second nonvolatile storage elements (NYSE) $18_2$ and $18^2$; a first data interface control unit $22_1$ which is placed so as to be adjoining to the first nonvolatile storage element $18_1$, and receives an external control signal for data read-out from the first nonvolatile storage element 181 and the data write-in to the first nonvolatile storage element $18_1$; a second data interface control unit $22_2$ which is placed so as to be adjoining to the second nonvolatile storage element $18_2$, and receives an external control signal for data read-out from the second nonvolatile storage element $18_2$ and the data write-in to the second nonvolatile storage element $18_2$; and a Volatile Storage Element (VSE) 24 which is disposed so as to be adjoining to the data interface control unit 22, receives a data input signal D from a data input terminal and a clock signal CLK from a clock input terminal, and outputs a data output signal Q from a data output terminal.

In addition, the NVCTL, the data input signals D and CLK, and the data output signal Q in FIG. 2 are equivalent to FRST/E1/E2/PL1/PL2, D, CLK/CLKB, and Q shown in FIG. 4.

The first nonvolatile storage element (NVSE) $18_1$ includes MOS transistors Q1a and Q1b and ferroelectric capacitors 51a and 51b, and the second nonvolatile storage element (NVSE) $18_2$ includes MOS transistors Q2a and Q2b and ferroelectric capacitors 52a and 52b.

The volatile storage element (VSE) 24 includes inverters 58, 60, 64, 70, 72, and 74 and pass switches 62, 66, and 68.

The first data interface control unit 221 includes an inverter 76, a pass switch 78, and a multiplexer 54, and the second data interface control 25 unit $22_2$ includes an inverter 80, a pass switch 82, and a multiplexer 56.

An input terminal of the inverter 58 is connected to a voltage applied terminal of the data input signal D. An output terminal of the inverter 58 is connected to an input terminal of the inverter 60. An output terminal of the inverter 60 is connected to a first input terminal (1) of the multiplexer 54 through the path switch 66. Furthermore, the output terminal of the inverter 60 is connected to an input terminal of the inverter 64, and an output terminal of the inverter 64 is connected to the input terminal of the inverter 60 through the path switch 62.

An output terminal of the multiplexer 54 is connected to an input terminal of the inverter 72. An output terminal of the inverter 72 is connected to an input terminal of the inverter 74. An output terminal of the inverter 74 is connected to a pulling out terminal of the data output signal Q. Also, an output terminal of the inverter 72 is connected to the first input terminal (1) of the multiplexer 56. An output terminal of the multiplexer 56 is connected to an input terminal of the inverter 70. An output terminal of the inverter 70 is connected to the first input terminal (1) of the multiplexer 54 through the path switch 68.

Thus, as shown in FIG. 4, the nonvolatile storage gate 12 includes the volatile storage element (VSE) 24 having a loop structure unit LOOP (a part surrounded by 54, 72, 56, and 70 in FIG. 4) for holding the inputted data input signal D using two logic gates (the inverters 72 and 70 in FIG. 4) connected to loop shape. The volatile storage element 24 further includes a loop by the inverters 60 and 64.

An input terminal of the inverter 76 is connected to the first input terminal (1) of the multiplexer 54. In for more details, an output terminal of the inverter 60 is connected to an input terminal of the inverter 76 through the pass switch 66, or an output terminal of the inverter 70 is connected to it through the pass switch 68. An output terminal of the inverter 76 is connected to a second input terminal (0) of the multiplexer 56 through the path switch 78.

An input terminal of the inverter 80 is connected to the first input terminal (1) of the multiplexer 56. In for more details, an output terminal of the inverter 72 is connected to the input terminal of the inverter 80. An output terminal of the inverter 80 is connected to a second input terminal (0) of the multiplexer 54 through the path switch 82.

A positive electrode terminal of the ferroelectric capacitor 51a is connected to a first plate line, and a ferroelectric element driving signal PL1 is supplied. A negative electrode terminal of the ferroelectric capacitor 51a is connected to the second input terminal (0) of the multiplexer 56. A MOS transistor Q1a is connected between the both terminals of the ferroelectric capacitor 51a. A gate of the MOS transistor Q1a is connected to a voltage applied terminal of the ferroelectric element both ends short circuit signal FRST.

A positive electrode terminal of the ferroelectric capacitor 51b is connected to the second input terminal (0) of the multiplexer 56. A negative electrode terminal of the ferroelectric capacitor 51b is connected to a second plate line, and a ferroelectric element driving signal PL2 is supplied. A MOS transistor Q1b is connected between the both terminals of the ferroelectric capacitor 51b. A gate of the MOS transistor Q1b is connected to the voltage applied terminal of the ferroelectric element both ends short circuit signal FRST.

A positive electrode terminal of the ferroelectric capacitor 52a is connected to the first plate line, and the ferroelectric element driving signal PL1 is supplied. A negative electrode terminal of the ferroelectric capacitor 52a is connected to the second input terminal (0) of the multiplexer 54. A MOS transistor Q2a is connected between the both terminals of the ferroelectric capacitor 52a. A gate of the MOS transistor Q2a is connected to the voltage applied terminal of the ferroelectric element both ends short circuit signal FRST.

A positive electrode terminal of the ferroelectric capacitor 52b is connected to the second input terminal (0) of the multiplexer 54. A negative electrode terminal of the ferroelectric capacitor 52b is connected to the second plate line, and the ferroelectric element driving signal PL2 is supplied. A MOS transistor Q2b is connected between the both terminals of the ferroelectric capacitor 52b. A gate of the MOS transistor Q2b is connected to the voltage applied terminal of the ferroelectric element both ends short circuit signal FRST.

The path switches 62 and 66 are turned ON and OFF according to the clock signal CLK, and the tri-state inverters 58 and the pass switch 68 are turned ON and OFF according to inversion clock signal CLKB (inverted logic signal of the clock signal CLK), among the above-mentioned components. The tri-state inverters 58 and the pass switch 62 of mutually are turned ON and OFF exclusively (complementarily). Also, the pass switch 66 and the pass switch 68 of mutually are turned ON and OFF exclusively (complementarily). On the other hand, both of the pass switches 78 and 82 are turned ON and OFF according to a ferroelectric element write-in signal E1. Also, as for the multiplexers 54 and 56, both of the signal paths are switched according to a normal operation signal E2.

(Layout Pattern of Nonvolatile Gate Embedded Logic Circuit)

In the present embodiment, as shown in FIG. 5, in the layout pattern of the logic circuit 10, cell pitches $L_{CP}$ of the logic gate 30 and the nonvolatile storage gate 12 are equal. Also, the line widths of a power supply line (VVDD1) 26 and a ground line (VGND1) 28 used for the logic gate 30 and the nonvolatile storage gate 12 is equal. That is, as shown in FIG. 5, the logic gate 30 and the nonvolatile storage gate 12 are disposed between the power supply line 26 and the ground line 28 so that the cell pitches $L_{CP}$ may become equal. Moreover, since the line widths of the power supply line 26 and the ground line 28 is equal, it is possible of the same arrangement as the logic gate 30 when using the nonvolatile storage gate 12. Herein, as the logic gate 30, an inverter INV, aNAND gate, aNOR gate, etc. are included, for example.

In the nonvolatile gate embedded logic circuit 10, as shown in FIG. 6, in the layout pattern of the logic circuit 10, a plurality of line pairs composed of the power supply line 26 and the ground line 28 are disposed in a row direction, and a buffer 36, a NOR gate 38, a NAND gate 40, a nonvolatile storage gate 12 including a ferroelectric element 42, an inverter 46, etc. are disposed, for example, between the line pairs.

Moreover, as shown in FIG. 6, in the layout pattern of the logic circuit 10, the cell pitches $L_{CP}$ of the buffer 36, the NOR gate 38, the NAND gate 40, and the nonvolatile storage gate 12 including the inverter 46 and the ferroelectric element 42 is equal. Also, the line widths of the power supply line 26 and the ground line 28 is equal. That is, as shown in FIG. 6, the logic gate, such as the buffer 36, the NOR gate 38, the NAND gate 40, and the inverter 46, and the nonvolatile storage gates 12 are disposed between the power supply line 26 and the ground line 28 so that the cell pitches $L_{CP}$ may become equal. Moreover, since the line widths of the power supply line 26 and the ground line 28 are equal, it is possible of the same arrangement as the logic gate when using the nonvolatile storage gate 12. Moreover, a plurality of power supply lines 26 are connected to the global power supply line ($V_{DD}$) 32, and a plurality of ground lines 28 are connected to the global ground line (GND) 34.

Moreover, in the nonvolatile gate embedded logic circuit 10, as shown in FIG. 6, in the layout pattern of the logic circuit 10, the nonvolatile storage gate 12 and the logic gate composed of the buffer 36, the NOR gate 38, the NAND gate 40, the inverter 46, etc., for example use the common power supply line 26.

(Timing Chart of Logic Circuit)

A logic circuit operation of the nonvolatile storage gate 12 shown in FIG. 4 is shown using a timing chart of the power supply $V_{DD}$, a clock signal CLK, a data input signal $D_{in}$, a data output signal $D_{out}$, a nonvolatile storage control signal NVCTL, a volatile data signal VSEDATA, and a nonvolatile data signal NVSEDATA of the logic circuit, as shown in FIG. 7.

In FIG. 7, the ferroelectric element write-in signal E1, the normal operation signal E2, the ferroelectric element driving signals PL1 and PL2, and the ferroelectric element both ends short circuit signal FRST are shown as the nonvolatile storage control signal NVCTL.

In the following explanation, the voltage which appears in the connection node of the ferroelectric capacitors 51*a* and 51*b* is set to V1, the voltage which appears in the connection node of the ferroelectric capacitors 52*a* and 52*b* is set to V2, the voltage which appears in the input terminal of the inverter 70 is set to V3, the voltage which appears in the output terminal of the inverter 70 is set to V4, the voltage which appears in the input terminal of the inverter 72 is set to V5, and the voltage which appears in the output terminal of the inverter 72 is set to V6.

—Normal Operation—

First of all, a normal operation will be explained.

(a) During the period T1 until the time point W1 shown by the timing t1, since the ferroelectric element both ends short circuit signal FRST is set to "H (high level)", the MOS transistor Q1*a*, Q1*b*, Q2*a*, and Q2*b* are turned ON, and between each both terminals of the ferroelectric capacitors 51*a*, 51*b*, 52*a*, and 52*b* is short-circuited, it is in the state where no voltage is applied to the ferroelectric capacitors 51*a*, 51*b*, 52*a*, and 52*b*. In addition, the ferroelectric element driving signals PL1 and PL2 applied to the first plate line and the second plate line are all set to "L (low level)".

Moreover, till the point in time W1, since the ferroelectric element write-in signal E1 is set to "L" and the path switch 78 and the path switch 82 are turned OFF, each data write-in driver (inverters 76 and 82 in the example of FIG. 4) is invalid.

Moreover, till the point in time W1, since the normal operation signal E2 is set to "H" and the first input terminal (1) of the multiplexer 54 and the multiplexer 56 is selected, the normal loop is formed in the loop structure unit LOOP (a part surrounded by 54, 72, 56, and 70 in FIG. 4).

In the volatile storage element 24, when the clock signal CLK is "H" and inverted clock signal CLKB is "L", the tri-state inverters 58 is turned OFF, the path switch 62 is turned ON, the path switch 66 is turned ON, and the path switch 68 is turned OFF. Therefore, in the loop composed of the inverters 60 and 64, when the clock signal CLK changes from "L" to "H", the imported data input signal D is held. Then, in the loop structure unit, the data is passed in that condition and the data output signal Q is outputted from the volatile storage element 24.

When the clock signal CLK is "L", in the loop structure unit LOOP, the signal imported when the clock signal switched from "H" to "L" is held. The volatile storage element 24 outputs the data output signal Q corresponding to a signal of the loop structure unit LOOP.

—Data Write-in Operation to Ferroelectric Element—

Next, a data write-in operation to the ferroelectric element will be explained.

(b) A period T2 of time points W1-W3 shown by timing t1 to t3, the clock signal CLK is set to "L" and the inverted clock signal CLKB is set to "H". Therefore, the first pass switch 66 is turned OFF and the second pass switch 68 is turned ON. Thus, it becomes possible to improve the stability of the data write-in operation for the ferroelectric capacitor by fixing beforehand the logic of the clock signal CLK and the inverted clock signal CLKB.

In particular, in the period of the time points W2-W3 shown by the timing t2 to t3, data write-in (arrow A) from the volatile storage element (VSE) 24 to the nonvolatile storage elements (NYSE) 181 and 182 is executed.

Moreover, in the time points W1-W3, the ferroelectric element both ends short circuit signal FRST is set to "L", the MOS transistors Q1*a*, Q1*b*, Q2*a*, and Q2*b* are turned OFF, and it is in the state in which the voltage impression toward the ferroelectric capacitors 51*a*, 51*b*, 52*a*, and 52*b* is possible.

Moreover, in the time points W1-W3, the ferroelectric element write-in signal E1 is set to "H", and the path switch 78 and the path switch 82 are turned ON. Therefore, each data write-in driver (inverters 76 and 82 in the example of FIG. 4) is validated.

In addition, in the time points W1-W3, since the normal operation signal E2 is set to "H" and the first input terminal (1) of the multiplexer 54 and the multiplexer 56 is selected similarly till then, the normal loop is formed in the loop structure unit LOOP (a part surrounded by 54, 72, 56, and 70 in FIG. 4).

Moreover, in the time points W1-W2, the ferroelectric element driving signal PL1 applied to the first plate line and the ferroelectric element driving signal PL2 applied to the second plate line are set to "L", and then the ferroelectric element driving signals PL1 and PL2 is set to "H" in the time points W2-W3. That is, the same pulse voltage is applied toward the first plate line and the second plate line. The residual polarization state inside the ferroelectric capacitor is set to either the inverted state/noninverted state by impression of such the pulse voltage.

More specifically stating based on the example of FIG. 7, in the time point W1, since the data output signal Q is "H", the node voltage V1 is set to "L", and the node voltage V2 is set to "H". Therefore, in the time points W1-W2, while the ferroelectric element driving signal PL1 applied to the first plate line and the ferroelectric element driving signal PL2 applied to the second plate line are set to "L", it is in the state where the voltage is not applied between the both terminals of the ferroelectric capacitors 51*a* and 51*b*, is in the state where the voltage of negative polarity is applied between the both terminals of the ferroelectric capacitor 52*a*, and is in the state where the voltage of positive polarity is applied between the both terminals of the ferroelectric capacitor 52*b*.

On the other hand, in the time points W2-W3, while the ferroelectric element driving signal PL1 applied to the first plate line and the ferroelectric element driving signal PL2 applied to the second plate line are set to "H", it is in the state where the voltage is not applied between the both terminals of the ferroelectric capacitors 52*a* and 52*b*, is in the state where the voltage of positive polarity is applied between the both terminals of the ferroelectric capacitor 51*a*, and is in the state where the voltage of negative polarity is applied between the both terminals of the ferroelectric capacitor 51*b*.

Thus, the residual polarization state inside the ferroelectric element is set to either the inverted state/noninverted state by applying the pulse voltage toward the first plate line and the second plate line. In addition, between the ferroelectric capacitors 51*a* and 51*b* and between the ferroelectric capacitors 52*a* and 52*b*, the mutual residual polarization state becomes reverse. Also, between the ferroelectric capacitors 51*a* and 52*a* and between the ferroelectric capacitors 51*b* and 52*b*, the mutual residual polarization state becomes reverse.

(c) In the period T3 of the time points W3-W4 shown by the timing t3 to t4, it is in a power supply cutoff waiting state. In the time point W3, since the ferroelectric element both ends short circuit signal FRST is set to "1" again, the MOS transistor Q1*a*, Q1*b*, Q2*a*, and Q2*b* are turned ON, and between each both terminals of the ferroelectric capacitors 51*a*, 51*b*, 52*a*, and 52*b* is short-circuited, it is in the state where no voltage is applied to the ferroelectric capacitors 51*a*, 51*b*, 52*a*, and 52*b*. At this time, each of the ferroelectric element driving signal PL1 applied to the first plate line and the ferroelectric element driving signal PL2 applied to the second plate line are set to "L".

Moreover, in time point W3, since the ferroelectric element write-in signal E1 is again set to "L", and the path switch 78 and the path switch 82 are turned OFF, each data write-in driver (inverters 76 and 80 in the example of FIG. 4) is invalid. Although it is unquestioned about the normal operation signal E2, it is set to "L" in the example of FIG. 7.

(e) Next, in the period T4 of the time points W4-W6 shown by the timing t4 to t6, it is in a power supply cutoff waiting state. That is, in the time point W4 shown by the timing t4, the power supply $V_{DD}$ is cut off. In this point, the ferroelectric element both ends short circuit signal FRST is maintained by "H" from time point W3, the MOS transistor Q1a, Q1b, Q2a, and Q2b are turned ON, and between each both terminals of the ferroelectric capacitors 51a, 51b, 52a, and 52b is short-circuited. Therefore, since it is in the state where no voltage is applied to the ferroelectric capacitors 51a, 51b, 52a, and 52b, even if it is the case where the voltage variation occurs at the time of the power supply cutoff, the voltage which is not aimed to the ferroelectric capacitors 51a, 51b, 52a, and 52b is not applied, and it becomes possible to avoid data corruption.

—Data Read-out Operation from Ferroelectric Element—

Next, a data read-out operation from the ferroelectric element will be explained.

(e) The time points R1-R5 shown by the timing t5 to t9, the clock signal CLK is set to "L" and the inverted clock signal CLKB is set to "H". Therefore, the first path switch 66 is turned OFF and the second path switch 68 is turned ON. Thus, it becomes possible to improve the stability of the data read-out operation from the ferroelectric element by fixing beforehand the logic of the clock signal CLK and the inverted clock signal CLKB.

(f) At the time point R1, the ferroelectric element both ends short circuit signal FRST is set to "1" earliest, the MOS transistor Q1a, Q1b, Q2a, and Q2b are turned ON, and between each both terminals of the ferroelectric capacitors 51a, 51b, 52a, and 52b is short-circuited. Therefore, since it is in the state where no voltage is applied to the ferroelectric capacitors 51a, 51b, 52a, and 52b, even if it is the case where the voltage variation occurs at the time of the power activation, the voltage which is not aimed to the ferroelectric capacitors 51a, 51b, 52a, and 52b is not applied, and it becomes possible to avoid data corruption.

In addition, at the time point R1, each of the ferroelectric element driving signal PL1 applied to the first plate line and the ferroelectric element driving signal PL2 applied to the second plate line are set to "L".

(g) In the period T5 of the time points of R2-R3 shown by the timing t6 to t7, it is in a power recovery waiting state.

At the time R2, in the state where all of the ferroelectric element write-in signal E1 and the normal operation signal E2 are set to "L" (that is, the state where the data write-in driver is invalid, and the normal loop is formed in the loop structure unit LOOP), the power supply $V_{DD}$ is turned ON.

(h) In the period T6 of time point t7 to t9 shown by the timing R3-R5, data read-out (arrow B) to the volatile storage element (VSE) 24 from the nonvolatile storage elements (NYSE) $18_1$ and $18_2$ is executed.

At the time point R3, the ferroelectric element both ends short circuit signal FRST is set to "L", a MOS transistors Q1a, Q1b, Q2a, and Q2b are turned OFF, and it changes into the state in which the voltage impression for the ferroelectric capacitors 51a, 51b, 52a, and 52b is possible. On the other hand, while the ferroelectric element driving signal PL2 applied to the second plate line is maintained by "L", the ferroelectric element driving signal PL1 applied to the first plate line is set to "H". By impression of such the pulse voltage, the voltage signal corresponding to the residual polarization state in the ferroelectric capacitor appears as the node voltage V1 and the node voltage V2.

More specifically stating based on the example of FIG. 7, a comparatively low voltage signal (the logic is hereinafter referred to as WL (Weak Low)) appears as the node voltage V1, and a comparatively high voltage signal (the logic is hereinafter referred to as WH (Weak Hi)) appears as the node voltage V2. That is, between the node voltage V1 and the node voltage V2, it becomes a form which the voltage difference according to the difference of the residual polarization state in the ferroelectric capacitor occurs.

At this time, at the time points R3-R4, since the normal operation signal E2 is set to "L", and the multiplexer 66 and the second input terminal (0) of the multiplexer 68 is selected, the logic of the node voltage V3 is turns to WL, and the logic of the node voltage V4 is turns to WH. Also, the logic of the node voltage V5 is turned to WH, and the logic of the node voltage V6 is turned to WL. Thus, at the time points R3-R4, the node voltages V1 to V6 of each part is still in an unstable state (state where logic inversion in the inverter 76 and the inverter 80 is not performed thoroughly, and the output logic does not become "L"/"H" securely).

(i) In the time point R4 shown by the timing t8, since the normal operation signal E2 is set to "H" and the multiplexer 66 and the first input terminal (1) of the multiplexer 68 is selected, the normal loop is formed in the loop structure unit LOOP. With the change of such a signal path, the output terminal of the inverter 70 (logic: WH) and the input terminal of the inverter 72 (logic: WH) are connected, and the output terminal of the inverter 72 (logic: WL) and the input terminal of the inverter 70 (logic: WL) are connected. Therefore, mismatching is not occurred in the signal logic (WH/WL) of each node. Hereinafter, while the normal loop is formed in the loop structure unit LOOP, the inverter 72 tends to pull up the output logic to "H" in response to the input of the logic WL, and the inverter 70 tends to pull down the output logic to "L" in response to the input of the logic WH. As a result, the output logic of the inverter 72 is settled by "L" from the unstable logic WL, and the output logic of the inverter 70 is settled by "H" from the unstable logic WH.

Thus, in the time point R4, it becomes a shape where the signal (potential difference of the node voltage V1 and the node voltage V2) read from the ferroelectric capacitor is amplified in the loop structure unit LOOP, with the loop structure unit LOOP being applied into the normal loop, and the held data before power supply cutoff is recovered.

(j) Next, in the time point R5 shown by the timing t9, since the ferroelectric element both ends short circuit signal FRST is again set to "H", the MOS transistors Q1a, Q1b, Q2a, and Q2b are turned ON, and between each both terminals of the ferroelectric capacitors 51a, 51b, 52a, and 52b is short-circuited, it becomes in the state where no voltage is applied to the ferroelectric capacitors 51a, 51b, 52a, and 52b. At this time, each of the ferroelectric element driving signal PL1 applied to the first plate line and the ferroelectric element driving signal PL2 applied to the second plate line are set to "L". Therefore, it recovers to the normal operation state as well as the time point W1 or before.

As explained above, the configuration example 1 of the nonvolatile storage gate 12 shown in FIG. 4 includes: a volatile storage element (VSE) 24 which holds data using a logic gate connected to loop shape (the inverters 60 and 64 and the inverters 72 and 70 in FIG. 4); nonvolatile storage elements $18_1$ and $18_2$ which store the data held at the volatile storage element (VSE) 24 in nonvolatilizing using the hysteresis characteristic of the ferroelectric capacitor; and data interface control units $22_1$ and $22_2$ which connect the volatile storage element (VSE) 24 and the nonvolatile storage elements $18_1$ and $18_2$. The data interface control units $22_1$ and $22_2$ are the configuration of operating the volatile storage element (VSE) 24 electrically, maintaining the applied voltage for the ferroelectric capacitor constant in the normal operation of the nonvolatile storage gate 12.

Thus, the ferroelectric capacitors 51a, 51b, 52a, and 52b are not directly driven from a signal line of the volatile storage element (VSE) 24, and the data write-in driver (the inverters 76 and 80 in FIG. 4) which functions also as a buffer is disposed between the signal line of the volatile storage element (VSE) 24 and the ferroelectric capacitors 51a, 51b, 52a, and 52b, thereby becoming possible to prevent the ferroelectric capacitors 51a, 51b, 52a, and 52b from acting as a load capacitor in the volatile storage element (VSE) 24.

Moreover, if it is the configuration of connecting the pass switches 78 and 82 to the output terminal of the data write-in driver (the inverters 76 and 80), and making the pass switches 78 and 82 turning ON corresponding to the ferroelectric element write-in signal E1 only at the time of the write-in of data, it becomes possible for the ferroelectric capacitors 51a, 51b, 52a, and 52b to be made not to drive at the time of the normal operation.

Moreover, it is controllable for electrical connection/cutoff with the logic gate (the inverters 72 and 70 FIG. 4) between the volatile storage element (VSE) 24 and the ferroelectric capacitors 51a, 51b, 52a, and 52b, by switching the input/output path of the multiplexers 54 and 56 corresponding to the normal operation signal E2 in the case of data read-out. Therefore, since it is not necessary to extend a clock line with large load in order to apply a particular node into floating, it becomes possible to avoid increase of power consumption.

In addition, although the dielectric element write-in signal E1 and the normal operation signal E2 are newly needed in the configuration example 1 of the nonvolatile storage gate 12 shown in FIG. 4, since none of the signals is usually driven unlike the clock signal driven usually, the signals hardly affect the power consumption of the nonvolatile storage gate 12.

Thus, since the ferroelectric capacitor is not uselessly driven in the normal operation according to the configuration example 1 of the nonvolatile storage gate 12 shown in FIG. 4, it becomes possible to achieve improvement in the speed and low power consumption of the same level as the volatile storage gate.

That is, since handling equivalent to the volatile storage gate can be performed, it becomes possible to displace the memory element part of an existing circuit to the nonvolatile storage gate 12 of the present invention, without performing redesigns, such as a timing design and a power consumption design.

Therefore, since the nonvolatilizing of the existing circuit can be performed easily, it becomes possible to achieve CPU etc. in which the cut off of power supply without erasing data at the time of standby, and an operation restart immediately after power activation is possible, for example.

(Characteristics of Ferroelectric Element Used for Nonvolatile Storage Gate)

Next, characteristics of the ferroelectric element used by the nonvolatile storage gate 12 shown in FIG. 4 will be explained in detail.

FIG. 8 is a diagram for explaining the characteristics of the ferroelectric element. In addition, an aspect that the voltage Vs is applied to the ferroelectric capacitor Cs is schematically described in the upper row of FIG. 8. Also, a hysteresis characteristic of the ferroelectric capacitor Cs is shown in the left-hand side of lower row of FIG. 8, and the capacitance characteristics of the ferroelectric capacitor Cs are shown in the right-hand side of lower row.

As shown in FIG. 8, as for the ferroelectric capacitor Cs, the capacitance characteristics change corresponding to the residual polarization state at the time of applying the voltage Vs between the both terminals. More specifically, when the voltage Vs of positive polarity is applied between the both terminals of the ferroelectric capacitor Cs and the ferroelectric capacitor Cs is set into a noninverted state (y=1), the capacitance value becomes small. On the other hand, when the voltage Vs of negative polarity is applied between the both terminals of the ferroelectric capacitor Cs and the ferroelectric capacitor Cs is set into an inverted state (y=0), the capacitance value becomes large. Therefore, at the time of read-out of the data stored in the ferroelectric capacitor Cs, it is necessary to convert the difference in the above-mentioned capacitance value into voltage value.

Accordingly, when reading data from the nonvolatile storage elements $18_1$ and $18_2$, the nonvolatile storage gate 12 shown in FIG. 4 has a configuration of using the capacitive coupling of the ferroelectric capacitor of the noninverted state (y=1) and the ferroelectric capacitor of the inverted state (y=0).

FIG. 9 is a diagram for explaining a data read-out method which used the capacitive coupling between the ferroelectric capacitors. In addition, the upper row of FIG. 9 shows capacitance characteristics in the case where the ferroelectric capacitor CL1a (ferroelectric capacitor CL2a) is the inverted state (y=0), and the ferroelectric capacitor 51b (ferroelectric capacitor 52b) is the noninverted state (y=1). Conversely as mentioned above, the lower row of FIG. 9 shows capacitance characteristics in the case where the ferroelectric capacitor 51a (ferroelectric capacitor 52a) is the noninverted state (y=1), and the ferroelectric capacitor 51b (ferroelectric capacitor 52b) is the inverted state (y=0).

As mentioned also beforehand, since a mutual residual polarization state becomes conversely at the time of the write-in of data for the ferroelectric capacitor between the ferroelectric capacitors 51a and 51b and between the ferroelectric capacitors 52a and 52b, it becomes the relationship that the more the capacitance value of one side is large, the more the capacitance value of the another side is small, as the capacitance characteristics.

Therefore, when the two ferroelectric capacitors 51a and 51b and the ferroelectric capacitors 52a and 52b with a converse residual polarization state are connected in series mutually and pulse voltage is applied to the one end, if the configuration of detecting node voltages V1 and V2 which appear in the connection node between both elements is used (it is the voltage value decided by the ratio of the capacitance value, and it is notated as the read-out voltage $V_{out}$ in FIG. 9), the amplitude value of the read-out voltage $V_{out}$ is secured to near 1 (V), thereby becoming possible to improve a read-out margin substantially.

Moreover, since the nonvolatile storage gate 12 shown in FIG. 4 has a configuration of performing 0/1 determination of the data read from the nonvolatile storage elements $18_1$ and $18_2$ by comparing the node voltage V1 corresponding to the capacity ratio of the ferroelectric capacitors 51a and 51b with node voltage V2 corresponding to the capacity ratio of the ferroelectric capacitors 52a and 52b, it does not need to set up a threshold value of the inverter strictly.

Thus, although the data read-out method with which the capacitive coupling between the ferroelectric capacitors is used for the nonvolatile storage gate 12 shown in FIG. 4 is adopted, the configuration is not limited to the configuration. A configuration which reads data from the nonvolatile storage elements $18_1$ and $18_2$ (in other words, a configuration except for the ferroelectric capacitors 51b and 52b and the MOS transistors Q1b and Q2b from the configuration of FIG. 4) may be suitable as the nonvolatile storage gate 12 using the capacitive coupling between the ferroelectric capacitors 51a and 52a and the gate capacitance of the transistor which composes the inverters 72 and 70. Alternatively, a configuration which reads data from the nonvolatile storage elements $18_1$ and $18_2$ may be suitable as the nonvolatile storage gate 12 using the capacitive coupling between the ferroelectric capacitors 51a and 51b and the other capacitative elements C1 and C2.

(Quaternary Counter)

As shown in FIG. 10, a schematic circuit configuration of the quaternary counter 7 shown in FIG. 2(a) includes nonvolatile storage gates $12_1$, $12_2$, $12_3$, and $12_4$, AND gates $84_1$, $84_2$, and $84_3$, and exclusive OR gates $90_1$, $90_2$, $90_3$, and $90_4$. A logic calculation unit 14 is composed of the AND gates $84_1$, $84_2$, and $84_3$ and the exclusive OR gates $90_1$, $90_2$, $90_3$, and $90_4$. A normal operation control line 98 and a nonvolatile operation control line 100 are connected to the nonvolatile storage gate $12_1$, $12_2$, $12_3$, and $12_4$.

A clock signal CLK and an inverted clock signal CLKB are supplied to the normal operation control line 98 through a clock control terminal 92.

A ferroelectric element write-in signal E1, a normal operation signal E2, ferroelectric element driving signals PL1 and PL2, and a ferroelectric element both ends short circuit signal FRST are supplied to the nonvolatile operation control line 100 through a nonvolatile operation control terminal 94.

A data input signal $D_{in}$ is supplied to an input terminal of the AND gate $84_1$ and an input terminal of the exclusive OR gate $90_1$ through a quaternary counter data input terminal 86.

An output terminal of AND gate $84_1$ is connected to an input terminal of the AND gate $84_2$ and an input terminal of the exclusive OR gate $90_2$.

An output terminal of AND gate $84_2$ is connected to an input terminal of the AND gate $84_3$ and an input terminal of the exclusive OR gate $90_3$.

An output terminal of the AND gate $84_3$ is connected to an input terminal of the exclusive OR gate $90_4$.

The data output terminals (Q) of the nonvolatile storage gates $12_1$, $12_2$, $12_3$, and $12_4$ are connected to input terminals of the AND gates $84_1$, $84_2$, and $84_3$ and input terminals of the exclusive OR gates $90_1$, $90_2$, $90_3$, and $90_4$, respectively.

The output terminals of the exclusive OR gates $90_1$, $90_2$, 903, and $90_4$ are connected to data input terminals (D) of the nonvolatile storage gates $12_1$, $12_2$, $12_3$, and $12_4$ and quaternary counter data output terminals $96_1$, $96_2$, $96_3$, and $96_4$ at the same time, respectively.

In the quaternary counter data output terminals $96_1$, $96_2$, $96_3$, and $96_4$, quaternary counter data output signals $D_{out}[0]$, $D_{out}[1]$, $D_{out}[2]$, and $D_{out}[3]$ are outputted, respectively.

(Control Signal Line of Nonvolatile Storage Gate)

FIG. 11 shows a connecting configuration of a control signal line from the power supply control unit 20 connected to a plurality of nonvolatile storage gates $12_1$, $12_2$, $12_3$, and $12_4$, in the quaternary counter 7. The connecting configuration is random/line type structure. When the control signal line is random/line type structure, the propagation delays of the nonvolatile storage control signal NVCTL sent to a plurality of nonvolatile storage gates $12_1$, $12_2$, $12_3$, and $12_4$ from the power supply control unit 20 differ, respectively.

The connecting configuration of the control signal line is not limited to the above-mentioned configuration. If the nonvolatile gate embedded logic circuit 10 is explained, as shown, for example in FIG. 12, the control signal line from the power supply control unit 20 connected to a plurality of nonvolatile storage gates $12_1$, $12_2$, $12_3$, $12_6$, and $12_7$, $12_8$, $12_9$, ..., $12_{12}$ may have a tree structure. That is, as shown in FIG. 12, since the control signal line has the tree structure, the propagation delay of the nonvolatile storage control signal NVCTL sent to a plurality of the nonvolatile storage gates $12_1$, $12_2$, $12_3$, ..., $12_6$, and $12_7$, $12_8$, $12_9$, ..., $12_{12}$ from the power supply control unit 20 becomes equal.

Also, as shown in FIG. 13, as for the nonvolatile gate embedded logic circuit 10, the control signal line from the power supply control unit 20 connected to a plurality of the nonvolatile storage gates $12_1$, $12_2$, $12_3$, ..., $12_6$, and $12_7$, $12_8$, $12_9$, ..., $12_{12}$ may have a hybrid type structure. That is, as shown in FIG. 7, since the control signal line has the hybrid type structure, the propagation delay of the nonvolatile storage control signal NVCTL sent to a plurality of the nonvolatile storage gates $12_1$, $12_2$, $12_3$, ..., $12_6$ from the power supply control unit 20 becomes equal. On the other hand, the propagation delays of the nonvolatile storage control signal NVCTL sent to a plurality of the nonvolatile storage gates $12_7$, $12_8$, $12_9$, ..., $12_{12}$ from the power supply control unit 20 differ, respectively.

(Octal Counter)

FIG. 14 is a schematic block diagram for explaining a power control of an octal counter 9. The octal counter 9 includes quaternary counters $11_1$ and $11_2$, insulated gates $13_1$ and $13_2$, a flip-flop (FF) 15, pMOS transistors S1 and S3, and nMOS transistors S2 and S4.

The quaternary counters $11_1$ and $11_2$ of the octal counter 9 are connected to the power supply between VDD and GND. When the power supply control signal SLP1 is "H" and the reversal signal SLPB1 is "L", the transistors S1 and S2 are turned ON and the electric power is supplied to the quaternary counter $11_1$. When the power supply control signal SLP2 is "H" and the reversal signal SLPB2 is "L", the transistors S3 and S4 are turned ON and the electric power is supplied to the quaternary counter 112. On the other hand, when the power supply control signal SLP1 is "L" and the reversal signal SLPB1 is "H", the transistors S1 and S2 are turned OFF and therefore the electric power supply to the quaternary counter $11_1$ is stopped. When the power supply control signal SLP2 is "L" and the reversal signal SLPB2 is "H", the transistors S3 and S4 are turned OFF and therefore the electric power supply to the quaternary counter $11_2$ is stopped.

Even when the input signal IN fluctuates precipitously within one cycle of the clock signal CLK, the FF 15 holds data and guarantees operation of the quaternary counter $11_1$ of the subsequent stage for one clock period.

The insulated gates $13_1$ and $13_2$ are not applying an output into an indeterminate value even when the electric power supply to the quaternary counters $11_1$ and $11_2$ is stopped, and for not causing malfunction in the subsequent stage. For example, when the power supply control signal SLP1 is "H", and the quaternary counter $11_1$ is active, if the output signal OUT1 from the quaternary counter $11_1$ is detected, the power supply control unit 20 sets the insulating control signal SEN1 to "H". Accordingly, the output from the quaternary counter $11_1$ is outputted in that condition from the insulated gate $13_1$. On the other hand, when the power supply control signal SLP1 is "L" and the operation of the quaternary counter $11_1$ stops, if the output signal OUT1 from the quaternary counter $11_1$ is detected, the power supply control unit 20 sets the insulating control signal SEN1 to "L". Since "L" is outputted from the insulated gate $13_1$ even when the output from the quaternary counter $11_1$ becomes an indeterminate value, the malfunction is not caused in the subsequent stage. Since the insulated gate $13_2$ is also similar, the explanation is omitted.

The octal counter 9 operates corresponding to a signal from the power supply control unit 20. The power supply control unit 20 switches the power supply control signal SLP1 to the quaternary counter $11_1$ and its inverted signal SLPB1, the power supply control signal SLP2 to the quaternary counter $11_2$ and its inverted signal SLPB2, and the insulating control signals SEN1 and SEN2, corresponding to the input signal IN to the octal counter 9 and the output signals OUT1 and OUT2 from the quaternary counters $11_1$ and $11_2$. Also, the power supply control unit 20 supplies the clocks CLK1 and CLK2, and the nonvolatile storage control signals NVCTL1 and NVCTL2 to the quaternary counters $11_1$ and $11_2$, and controls operation of the quaternary counters $11_1$ and $11_2$.

FIG. 15 is a block diagram showing a schematic structure of the quaternary counters $11_1$ and $11_2$, and since the quaternary counters $11_1$ and $11_2$ are the same configurations, it is shown to be the quaternary counter 11 in order to simplify.

The quaternary counter 11 includes nonvolatile storage gates $12_1$, $12_2$, $12_3$, and $12_4$, AND gates $84_1$, $84_2$, $84_3$, and $84_4$, and exclusive OR gates $90_1$, $90_2$, $90_3$, and $90_4$. A normal operation control line 98 and a nonvolatile operation control line 100 are connected to the nonvolatile storage gate $12_1$, $12_2$, $12_3$, and $12_4$.

A clock signal CLK and an inverted clock signal CLKB are supplied to the normal operation control line 98 through a clock control terminal 92.

A ferroelectric element write-in signal E1, a normal operation signal E2, ferroelectric element driving signals PL1 and PL2, and a ferroelectric element both ends short circuit signal FRST are supplied to the nonvolatile operation control line 100 through a nonvolatile operation control terminal 94.

A data input signal $D_{in}$ is supplied to an input terminal of the AND gate $84_1$, and an input terminal of the exclusive OR gate $90_1$ through a quaternary counter data input terminal 86.

An output terminal of AND gate $84_1$ is connected to an input terminal of the AND gate $84_2$ and an input terminal of the exclusive OR gate $90_2$.

An output terminal of AND gate $84_2$ is connected to an input terminal of the AND gate $84_3$ and an input terminal of the exclusive OR gate $90_3$.

An output terminal of AND gate $84_3$ is connected to an input terminal of the AND gate $84_4$ and an input terminal of the exclusive OR gate $90_4$.

An output of AND gate $84_4$ becomes an output Cout of the quaternary counter 11.

The data output terminals (Q) of the nonvolatile storage gate $12_1$, $12_2$, $12_3$, and $12_4$ are connected to the input terminal of AND gates $84_1$, $84_2$, $84_3$, and $84_4$, and the input terminal of the exclusive OR gates $90_1$, $90_2$, $90_3$, and $90_4$, respectively.

The output terminals of the exclusive OR gate $90_1$, $90_2$, $90_3$, and $90_4$ are connected to the data input terminals (D) of the nonvolatile storage gate $12_1$, $12_2$, $12_3$, and $12_4$, respectively.

FIG. 16 is a timing chart of the octal counter 9. Before the count start, it initializes and both quaternary counters $11_1$ and $11_2$ are set to 0.

(a) During the timing t0 to t1, since the input signal IN is "L", both of the power supply control signals SLP1 and SLP2 are "L". Then, the electric power supply to the counters $11_1$ and $11_2$ is stopped until the rising timing of the next clock signal CLK (period T1).

(b) When the input signal IN is set to "H" in the timing t1, in the rising timing t2 of the next clock signal CLK, the power supply control signal SLP1 is set to "H", and the electric power supply to the quaternary counter $11_1$ is started. In addition, the power supply control signal SLP2 is "L", and the electric power supply to the quaternary counter $11_2$ is stopped. Then, the electric power supply to the quaternary counter $11_2$ is still stopping continuously during the period T1 to T4 which the state where the output signal OUT1 from the quaternary counter $11_1$ of the previous stage is "L" continues.

(c) As the timing t2 explained with reference to FIG. 7, the nonvolatile storage control signal NVCTL performs read-out data from the nonvolatile storage element 18 in the nonvolatile storage gate 12 to the volatile storage element 24, in the quaternary counter $11_1$ (data recovery signal). Then, the clock CLK1 is supplied from the power supply control unit 20 to the quaternary counter $11_1$, and a count (Dout [3:0]) is performed in clock rising timing. Schematically, during the input signal IN is "H" (to t3), the counter process continues, and in for more details, the counter process continues to the next clock rising timing (t4) to have changed the input signal IN from "H" to "L" (period T2).

(d) When the input signal IN is set to "L" in the timing t3, in the rising timing t4 of the next clock signal CLK, as explained with reference to FIG. 7, the nonvolatile storage control signal NVCTL performs data restoring from the volatile storage element 24 in the nonvolatile storage gate 12 of the quaternary counter $11_1$ to the nonvolatile storage element 18 (data restoring signal). Then, the power supply control signal SLP1 is set to "L", and then the electric power supply is stopped to the quaternary counter $11_1$. The electric power supply to the quaternary counter $11_1$ is stopped until the rising timing t6 of the clock signal CLK immediately after the timing t5 from which the input signal IN is set to "H" in next (period T3).

(e) When the input signal IN is set to "H" in the timing t5, in the rising timing t6 of the next clock signal CLK, the power supply control signal SLP1 is set to "H", and then the electric power supply to the quaternary counter $11_1$ is restarted. The nonvolatile storage control signal NVCTL performs read-out data from the nonvolatile storage element 18 in the nonvolatile storage gate 12 to the volatile storage element 24, then, the clock CLK1 is supplied from the power supply control unit 20 to the quaternary counter, and then the count process is performed. Until the clock rising timing (t10) immediately after the timing t9 which changes the input signal IN from "H" to "L" in next, the count process continues (periods T4 and T5).

(f) When completing the count to 0-15 in the timing t7, the quaternary counter $11_1$ starts the count from 0 again while setting the output signal OUT1 to "H".

(g) On the other hand, when the output signal OUT1 from the quaternary counter $11_1$ is set to "H" in the timing t7, in the rising timing t8 of the next clock signal CLK, the power supply control signal SLP2 is set to "H", and then the electric power supply to the quaternary counter $11_2$ is started.

(h) In the timing t8, as explained with reference to FIG. 7, the nonvolatile storage control signal NVCTL performs read-out data from the nonvolatile storage element 18 in the nonvolatile storage gate 12 to the volatile storage element 24, in the quaternary counter $11_2$. In this case, since it is the count 0 from the first, the data indicating the counts is read. Then, the clock CLK2 is supplied from the power supply control unit 20 to the quaternary counter $11_2$, and then the count is performed in clock rising timing.

Since the quaternary counter $11_2$ counts corresponding to the output of the quaternary counter $11_1$, immediately after an output may supply the power supply. Accordingly, the power supply control unit 20 checks the output signal OUT1 of the quaternary counter $11_1$ of the previous stage, and if the OUT1 is "L", it will determine that the power supply to the quaternary counter $11_2$ may be stopped. The power supply control unit 20 stops the clock CLK2 to the quaternary counter $11_2$, and outputs the nonvolatile storage control signal NVCTL, thereby performing data restoring in the quaternary counter $11_2$. Then, the power supply control unit 20 switches the power supply control signal SLP2 to the quaternary counter to "L".

(i) When the input signal IN is set to "L" in the timing t9, in the next rising timing t10 of the clock signal CLK, as explained with reference to FIG. 7, the nonvolatile storage control signal NVCTL performs data restoring from the volatile storage element 24 in the nonvolatile storage gate 12 of the quaternary counter $11_1$ to the nonvolatile storage element 18 (data restoring signal). Then, the power supply control signal SLP1 is set to "L", and then the electric power supply is stopped to the quaternary counter $11_1$. The electric power supply to the quaternary counter $11_1$ is stopped until the rising timing t12 of the clock signal CLK immediately after the timing t11 from which the input signal IN is set to "H" in next (period T6).

(j) When the input signal IN is set to "H" in the timing t11, in the next rising timing t12 of the clock signal CLK, the power supply control signal SLP1 is set to "H", and then the electric power supply to the quaternary counter $11_1$ is restarted. The nonvolatile storage control signal NVCTL performs read-out data from the nonvolatile storage element 18 in the nonvolatile storage gate 12 to the volatile storage element 24, then, the clock CLK1 is supplied from the power supply control unit 20 to the quaternary counter $11_1$, and then the count process is performed. Until the clock rising timing (t17) immediately after the timing t16 which changes the input signal IN from "H" to "L" in next, the count process continues (period T7).

(k) When completing the count to 0-15 in the timing t13, the quaternary counter $11_1$ starts the count from 0 again while setting the output signal OUT1 to "H".

(l) On the other hand, when the output signal OUT1 from the quaternary counter $11_1$ is set to "H" in the timing t13, in the rising timing t14 of the next clock signal CLK, the power supply control signal SLP2 is set to "H", and then the electric power supply to the quaternary counter $11_2$ is restarted.

(m) In the timing t14, as explained with reference to FIG. 7, the nonvolatile storage control signal NVCTL performs read-out data from the nonvolatile storage element 18 in the nonvolatile storage gate 12 to the volatile storage element 24, in the quaternary counter $11_2$. Then, the clock CLK2 is supplied from the power supply control unit 20 to the quaternary counter $11_2$, and the count is performed in clock rising timing. The power supply control unit 20 checks the output signal OUT1 of the quaternary counter 111, performs data restoring of the quaternary counter $11_2$ by the nonvolatile storage control signal NVCTL, and switches the power supply control signal SLP2 to "L".

(n) When completing the count to 0-15 in the timing t15, the quaternary counter $11_2$ starts the count from 0 again while setting the output signal OUT2 to "H". The output signal OUT of the octal counter 9 is outputted by the output of output signal OUT2.

Although the driver for data write-in (inverters 76 and 80) and the multiplexers 54 and 56 are newly needed in the configuration example of the nonvolatile memory gate 12 shown in FIG. 4, since the occupation area of the instruction processing unit 102 of the nonvolatile CPU 1, the arithmetic processing unit 110, and the nonvolatile memory gate 12 in the calculated result storage unit 104 is only several percent, there is almost no influence of the increase in size given to whole of the nonvolatile CPU 1.

In a prototype result of the nonvolatile CPU 1 which mounts about 300 nonvolatile storage gates 12, for example, the power supply can be applied into ON state only for about 4 ms, for example, which is in the process of the nonvolatile CPU 1, and the power supply can be applied into OFF state for about 10 ms, for example, when the nonvolatile CPU1 is standby.

Thus, amount of power electricity (mW·sec) is reducible about 70% in standby of the nonvolatile CPU 1 by turning OFF the power supply, compared with the case of the regular operation.

In a usual CPU, when holding data after the power supply cutoff by a method of restoring all the data stored in a storage gate to external before the power supply cutoff, the data restoring time period with ON and OFF operation of the power supply rises linearly with the rise of the restoration data bit rate. On the other hand, according to the nonvolatile gate embedded logic circuit according to the embodiment of the invention, even if the restoration data bit rate rises, the data restoring time period with ON and OFF operation of the power supply does not rise, but is held at the constant value of the very low value.

The nonvolatile gate embedded logic circuit according to the present embodiment is characterized that the ferroelectric memory elements, such as Ferroelectric Random Access Memory (FRAM), are applied as a storage device in addition to aread/write memory from software of CPU. That is, the characteristic is that the ferroelectric memory elements, such as FRAM, are disposed in logic circuit cells, such as a flip-flop included in a circuit in the CPU, and it performed the nonvolatilizing of the circuit itself. Accordingly, it is compatible in the rapidity and low power of the logic circuit.

In the case of the nonvolatile CPU 1 applied the configuration example of the nonvolatile storage gate 12 shown in FIG. 4, the similar nonvolatile storage element as FRAM is embedded in the element level of the flip-flop which composes a processor. That is, this nonvolatile storage element holds a memory content. Therefore, this nonvolatile CPU1 can cut the power supply in one breath from the root of LSI. That is, the electric power at the time of stopping can be applied into zero, without considering leakage current etc. at all. The point is applicable not only to a processor but all logic LSI. That is, circuit technique applicable to the whole logic LSI of wider range can be provided.

According to the present embodiment, it can be provided of the nonvolatile storage gate which can hold data after the power supply cutoff by embedding the device having the nonvolatile function into the storage gate, and the operation method for such nonvolatile storage gate.

Also, according to the present embodiment, it can be provided of the nonvolatile storage gate embedded the logic circuit which can cut off the power supply at the same time of being in the standby state, without needing securing of the power supply for holding data and restoring external data, by embedding the nonvolatile storage gate, and the operation method for such nonvolatile storage gate embedded logic circuit.

Also, according to the present invention, it can be provided of the nonvolatile storage gate which can be diverted in that condition for the existing design information and the non-volatile storage gate embedded logic circuit which embedded the aforementioned nonvolatile storage gate, by providing a mechanism in which operation equivalent to the volatile storage gate is possible for the nonvolatile storage gate, and operating as the volatile storage gate at the time of normal operation.

The power supply control unit 20 provided in the external of the logic calculation circuit can determine whether the normal operation is performed or the holding data by the nonvolatile storage element is performed.

In the nonvolatile CPU 1 of the present embodiment, although the nonvolatile storage gate 12 of the nonvolatile CPU 1 inside is controlled by the internal power supply control unit 20, the present invention is not limited to the configuration. In the nonvolatile operation control terminal 194 of nonvolatile CPU 1, the nonvolatile storage control signal NVCTL from the outside of the nonvolatile CPU 1 is also receivable.

Moreover, according to the present embodiment, in designing the layout of logic circuit, the nonvolatile storage gate embedded logic circuit which disposes the nonvolatile storage gate inside the logic circuit can be provided efficiently by applying the same cell pitch of the logic gate and the nonvolatile storage gate.

Moreover, according to the nonvolatile storage gate embedded logic circuit according to the present embodiment, since the power supply can be cut off in an instant without the data restoring at the time of power supply cutoff, when the logic calculation circuit is turned into the standby state, the power supply can be cut off in an instant and the leakage current can be reduced efficiently.

Moreover, according to the nonvolatile storage gate embedded logic circuit according to the present embodiment of the invention, the existing circuit information can be diverted in that condition, without performing redesigns, such as a timing design and a power consumption design.

Moreover, according to the nonvolatile storage gate embedded logic circuit according to the present embodiment, the existing circuit can be nonvolatilized easily, for example, the power supply can be cut off at the time of standby (data is not erased), and the quaternary counter, the octal counter, nonvolatile CPU, etc. in which the operation restart is possible immediately after the power activation can be achieved.

Second Embodiment

In the nonvolatile CPU 1 shown in FIG. 1, the present embodiment applies a nonvolatile storage gate 212 explained hereinafter instead of the nonvolatile storage gate 12. Since others except for the point of explaining hereinafter are the same as the first embodiment, the explanation is omitted.
(Configuration Example of Nonvolatile Storage Gate 212)

As shown in FIG. 17, a nonvolatile storage gate 212 applicable to the nonvolatile storage gate embedded logic circuit according to the present embodiment includes: a volatile storage element 224 having data holding circuits 133*a* and 133*b*, inverter circuits 170 and 178, and transfer gates 146 and 172; and a nonvolatile storage element 218 having a ferroelectric capacitor 51.

The data holding circuit 133*b* holds data by connecting the inverter circuits 136 and 138 to loop shape in series at the time of data latch. The inverter circuit 136 is disposed on a main signal path, and the inverter circuit 138 is disposed at a feedback signal path. Herein, the main signal path is a principal signal path for transmitting a signal from the input side data propagation path 130*a* to the output side data propagation path 130*b*, and the feedback signal path is a signal path for feeding back a signal from the output side data propagation path 130*b* to the input side data propagation path 130*a*.

The data holding circuit 133*a* is composed as well as the data holding circuit 133*b*, and holds data by connecting the inverter circuits 129 and 174 to loop shape in series at the time of the data latch. The inverter circuit 129 is disposed on a main signal path, and the inverter circuit 174 is disposed at a feedback signal path.

In FIG. 17, one end of the ferroelectric capacitor 51 of the nonvolatile storage element 218 is connected to the ferroelectric connection node 134, and the ferroelectric element driving signal PL is supplied to the other end.

At the time of data write-in, the ferroelectric capacitor 51 supplies a nonvolatile data write-in signal to the other end as the ferroelectric element driving signal PL, thereby storing the polarization state corresponding to the data currently held in the data holding circuit 133*b*. Also, the nonvolatile data read-out signal is supplied to the other end as the ferroelectric element driving signal PL at the time of data restoration, and thereby an electric charge corresponding to the stored polarization state, and generating voltage higher or lower than the threshold value of voltage of the inverter circuit 136 at the input node 137 of the inverter circuit 136 is supplied to the input node 137 of the inverter circuit 136.

The data holding circuit 133*b* further includes a transfer gate 140. The transfer gate 140 is inserted between the input node 137 and the output node 139 of the inverter circuit 138.

The transfer gate 140 is ON/OFF-controlled so as to be in ON state at the time of the data latch and the data write-in, and at the time of data restoration, to be in OFF state at the time of supplying the nonvolatile data read-out signal, and then to be in ON state after passage of a predetermined period.

In the transfer gate 146, one end 131*a* is connected to the ferroelectric connection node 134, and the other end 131*b* is connected to the input side data propagation path 130*a* among the data propagation path 130 connecting between the data holding circuit 133*b* and the external. The transfer gate 146 is ON/OFF-controlled so as to be in ON state at the time of data transmission, and at the time of data restoration, to be in OFF state during the period which the transfer gate 140 is in OFF state, and then to be in ON state after passage of a predetermined period.

The inverter circuit 129 is inserted in the input side data propagation path 130*a*.

A data input signal D is supplied to the other end 131*b* of the transfer gate 146 through the inverter circuit 170, the transfer gate 172, and the data holding circuit 133*a*.

The transfer gate 140 is composed of an nMOS transistor 142 and a pMOS transistor 141. The clock signals CKB and /CKB are supplied to the gate terminals 144 and 143 of the nMOS transistor 142 and the pMOS transistor 141, respectively. Herein, the clock signal /CKB is a inverted signal of the clock signal CKB.

Also, the transfer gate 146 as well as the transfer gate 140 is composed of an nMOS transistor 135 and a pMOS transistor 132. The clock signal CKA and /CKA are supplied to the gate terminals 145 and 147 of the nMOS transistor 135 and the pMOS transistor 132, respectively.

The normal operation in the nonvolatile storage gate 212 will be explained hereinafter. In addition, the data write-in operation and the data restoring operation are described later separately.

In the nonvolatile storage gate 212, transmitting and holding of data are performed by the data holding circuits 133*a* and 133*b* as the normal operation. Herein, the clock signal CKA and the clock signal CKB which are supplied to the nonvolatile storage gate 212 have in a part of an interval turning into the "L" level at the same time, describe later, but if the configuration is ignored, they are a complementary signal as the whole. In explanation of the normal operation, in order to easy, the clock signal CKA and the clock signal CKB is assumed as complementary things. In this case, the transmitting and holding of data are occurred in the rising or falling timing of the clock signal.

That is, in the volatile storage element 224, when the clock signal CKA is in "H" and the clock signal CKB is in "L", the transfer gate 172 is turned OFF, the transfer gate 176 is turned ON, the transfer gate 146 is turned ON, and the transfer gate 140 is turned OFF. Therefore, in the data holding circuit 133a including the inverter circuits 129 and 174, the data input signal D imported when the clock signal CKA switched from "L" to "H" is held. Then, in the data holding circuit 133b including the inverter circuits 136 and 138, the data is passed in that condition, and a data output signal Q is outputted from the volatile storage element 224.

When the clock signal CKA is "L" and the clock signal CKB is "H", the signal imported when the clock signal CKA switched from "H" to "L" is held in the data holding circuit 133b. The volatile storage element 224 outputs the data output signal Q corresponding to the signal of the data holding circuit 133b.

(Quaternary Counter)

As shown in FIG. 18, a schematic circuit configuration of a quaternary counter to which the nonvolatile storage gate 212 is applied includes: an internal clock generation circuit 148; nonvolatile storage gates $212_1$, $212_2$, $212_3$, and $212_4$; AND gates $84_1$, $84_2$, and $84_3$; and exclusive OR gates $90_1$, $90_2$, $90_3$, and $90_4$. A nonvolatile operation control line 100 is connected to the normal operation control line 98 and the nonvolatile storage gates $212_1$, $212_2$, $212_3$, and $212_4$.

A clock signal CLK and an enable signal EN are supplied to a normal operation control line 98 through a clock control terminal 92. The clock signal CLK and the enable signal EN are supplied to the internal clock generation circuit 148, as shown in FIG. 18.

A ferroelectric element driving signal PL is supplied to the nonvolatile operation control line 100 through a nonvolatile operation control terminal 94.

A data input signal $D_{in}$ is supplied to an input terminal of the AND gate $84_1$, and an input terminal of the exclusive OR gate 901 through a quaternary counter data input terminal 86.

An output terminal of the AND gate $84_1$ is connected to an input terminal of the AND gate $84_2$ and an input terminal of the exclusive OR gate $90_2$.

An output terminal of the AND gate $84_2$ is connected to an input terminal of the AND gate $84_3$ and an input terminal of the exclusive OR gate $90_3$.

An output terminal of the AND gate $84_3$ is connected to an input terminal of the exclusive OR gate $90_4$.

Data output terminals (Q) of the nonvolatile storage gates $212_1$, $212_2$, $212_3$, and $212_4$ is connected to input terminals of the AND gates $84_1$, $84_2$, and $84_3$, and input terminals of the exclusive OR gates $90_1$, $90_2$, $90_3$, and $90_4$, respectively.

Output terminals of the exclusive OR gates $90_1$, $90_2$, $90_3$, and $90_4$ are connected to the data input terminals (D) of the nonvolatile storage gates $212_1$, $212_2$, $212_3$, and $212_4$, respectively, and are connected to quaternary counter data output terminals $96_1$, $96_2$, $96_3$, and $96_4$ at the same time.

In the quaternary counter data output terminals $96_1$, $96_2$, $96_3$, and $96_4$, quaternary counter data output signals $D_{out}[0]$, $D_{out}[1]$, $D_{out}[2]$, and $D_{out}[3]$ are outputted, respectively.

(Internal Cock Generation Circuit)

As shown in FIG. 19, the internal clock generation circuit 148 for supplying a plurality of clock pulses needed for operation of the nonvolatile storage gate 212 includes: an enable signal input terminal 149; a basic clock input terminal 150; a clock generation unit 154; a third clock output terminal 151; a first clock output terminal 152; and a second clock output terminal 153.

An enable signal EN is inputted into the enable signal input terminal 149, and a clock signal CLK which controls operation of the nonvolatile storage gate 12 is inputted into the basic clock input terminal 150.

A clock signal CKC (third clock pulse) obtained by providing predetermined delay to the inverted signal of the clock signal CLK is outputted from the third clock output terminal 151.

A clock signal CKA (first clock pulse) is outputted from the first clock output terminal 152. ON/OFF control of the transfer gates 176 and 146 is performed by the clock signals CKA and /CKA outputted from the first clock output terminal 152.

On the other hand, a clock signal CKB (second clock pulse) is outputted from the second clock output terminal 153. ON/OFF control of the transfer gates 172 and 140 is performed by the clock signals CKB and /CKB outputted from the second clock output terminal 153.

The clock generation unit 154 is composed by plenty of logic gates, and generates the clock signals CKA, CKB, and CKC based on the enable signal EN and the clock signal CLK.

FIG. 20 shows a logic circuit timing chart of the internal clock generation circuit 148 of FIG. 19.

FIG. 20 shows the relationship of the enable signal EN, the clock signal CLK, the clock signal CKC, the clock signal CKA, and the clock signal CKB. Although the clock signal CKA and the clock signal CKB have a part of an interval which turns into the "L" level at the same time, if the configuration is ignored, they are a complementary signal as the whole.

Therefore, in the configuration example (refer to FIG. 17) of the nonvolatile storage gate 212 applicable to the nonvolatile storage gate embedded logic circuit according to the second embodiment of the present invention composed in this manner, transmission and latch of data is repeated alternately.

(Logic Circuit Timing Chart)

An example of a timing chart for explaining a data write-in operation and a data restoring operation in the nonvolatile storage gate 212 is expressed as shown in FIG. 21.

(Data Write-in Operation)

A data write-in operation will be explained using FIG. 21.

In the data write-in operation, first of all, both the power supply $V_{DD}$ and the enable signal EN of the nonvolatile storage gate 212 are ON state, and a write-in signal (a) is supplied to the other end of the ferroelectric capacitor 51 as the ferroelectric element driving signal PL.

As shown in FIG. 21, the write-in signal (a) is a rectangle signal generated by returning to the "L" level again after turning the ferroelectric element driving signal PL from the "L" level to the "H" level. A polarization state corresponding to the data currently held in the data holding circuit 133b at the time point is stored in the ferroelectric capacitor 51 by supplying the write-in signal (a) to the other end of the ferroelectric capacitor 51.

Then, the power supply $V_{DD}$ is turned OFF. By turning OFF the power supply $V_{DD}$, the enable signal EN is also turned OFF ("L" level).

In the example shown in FIG. 21, as shown by a full line, the power supply $V_{DD}$ is turned OFF after returning the ferroelectric element driving signal PL, which is once turned to the "H" level, into the "L" level. However, for example, the power supply $V_{DD}$ may be turned OFF, without returning the ferroelectric element driving signal PL to the "L" level, as shown by a dashed line. Alternatively, only the enable signal EN can also be turned OFF, without turning OFF the power supply $V_{DD}$.

(Data Restoring Operation)

A data restoring operation will be explained using FIG. 21 and FIG. 20 explained previously.

In the data restoring operation, as shown in FIG. 21, first of all, the power supply $V_{DD}$ of the nonvolatile storage gate 212 is turned OFF, and the read-out signal (b) is supplied to the other end of the ferroelectric capacitor 51 in that state as the ferroelectric element driving signal PL.

The read-out signal (b) is a rectangle signal generated by returning to the "L" level again after turning the ferroelectric element driving signal PL from the "L" level to the "H" level. By supplying the read-out signal (b) to the other end of the ferroelectric capacitor 51, the electric charge corresponding to the polarization state stored in the ferroelectric capacitor 51 is discharged to the ferroelectric connection node 134.

In this state, the enable signal EN is still the "L" level. Therefore, both the clock signals CKA and CKB are the "L" levels as shown in FIG. 20. That is, the transfer gates 140 and 146 are all turned OFF. Therefore, the electric charge discharged to the ferroelectric connection node 134 does not leak out to the inverter circuit 138 side through the transfer gate 140, or does not leak out to the inverter circuit 129 side through the transfer gate 146 (refer to FIG. 17). Therefore, read-out is possible for the ferroelectric connection node 134 of a floating state.

Similarly, the electric charge does not leak out to a well diffused region (not shown) of the pMOS transistor 132 which composes the transfer gate 146 so far as the potential of the ferroelectric connection node 134 exceeds the value of the power supply $V_{DD}$.

Thus, so far as the potential of the ferroelectric connection node 134 exceeds the value of the power supply $V_{DD}$, the discharged electric charge stays in the ferroelectric connection node 134. Therefore, the potential of the ferroelectric connection node 134 is exactly reflected in the discharged electric charge.

On the other hand, when the discharged electric charge is too large or the unnecessary electric charge remains in the ferroelectric connection node 134 due to a certain fault, the potential of the ferroelectric connection node 134 may exceed the value of the power supply $V_{DD}$ by discharge of the electric charge.

In such a case, an excessive electric charge flows into the power supply $V_{DD}$ through the pMOS transistor 141 which composes the transfer gate 140. Similarly, the excessive electric charge flows into the power supply $V_{DD}$ connected to a well diffused region (not shown) of the pMOS transistor 132 which composes the transfer gate 146.

Therefore, in the nonvolatile storage gate 212, even when the discharged electric charge is too large or the unnecessary electric charge remains in the ferroelectric connection node 134, the potential of the ferroelectric connection node 134 does not exceed the value of the power supply $V_{DD}$ by discharge of the electric charge. That is, a device can be prevented from being damaged according to such a situation.

Returning to FIG. 21, the enable signal EN is turned into ON state afterward. As shown in FIG. 20, the clock signal CKB is turned into the "H" level afterward (refer to the signal (c) of FIG. 20). At this time, the clock signal CKA is still the "L" level. That is, the transfer gate 146 shown in FIG. 17 is still OFF state, and only the transfer gate 140 is turned ON.

Therefore, the data holding circuit 133b of the nonvolatile storage gate 212 will be in a state where the loop closed, with being separated from the input side of data propagation path 130a. That is, the inverter circuits 136 and 138 will be in a state of connecting to loop shape, eliminating the influence from the outside. Accordingly, the potential of the ferroelectric connection node 134 reaches a logic level ("H" or "L" level) which reflected the discharged electric charge exactly, without being affected by the influence of data input signal D.

According to the present embodiment, it can be provided of the nonvolatile storage gate which can hold data after the power supply cutoff by embedding the device having the nonvolatile function into the storage gate, and the operation method for such nonvolatile storage gate.

Also, according to the present embodiment, it can be provided of the nonvolatile storage gate embedded the logic circuit which can cut off the power supply at the same time of being in the standby state, without needing securing of the power supply for holding data and restoring external data, by embedding the nonvolatile storage gate, and the operation method for such nonvolatile storage gate embedded logic circuit.

Also, according to the present invention, it can be provided of the nonvolatile storage gate which can be diverted in that condition for the existing design information and the nonvolatile storage gate embedded logic circuit which embedded the aforementioned nonvolatile storage gate, by providing a mechanism in which operation equivalent to the volatile storage gate is possible for the nonvolatile storage gate, and operating as the volatile storage gate at the time of normal operation.

Also, according to the present embodiment, in designing the layout of logic circuit, the nonvolatile storage gate embedded logic circuit which disposes a nonvolatile storage gate inside a logic circuit can be provided efficiently by applying the same cell pitch of the logic gate and the nonvolatile storage gate.

Also, according to the nonvolatile storage gate embedded logic circuit according to the present embodiment, since the power supply can be cut off in an instant without the data restoring at the time of power supply cutoff, when the logic calculation circuit is turned into the standby state, the power supply can be cut off in an instant and the leakage current can be reduced efficiently.

Also, according to the nonvolatile storage gate embedded logic circuit according to the present embodiment, the existing circuit information can be diverted in that condition, without performing redesigns, such as a timing design and a power consumption design.

Also, according to the nonvolatile storage gate embedded logic circuit according to the present embodiment of the present invention, the existing circuit can be nonvolatilized easily, for example, a power supply can be cut off at the time of standby (data is not erased), and the quaternary counter, the nonvolatile CPU etc. in which an operation restart is possible immediately after power activation can be achieved.

Third Embodiment

In the nonvolatile CPU 1 shown in FIG. 1, the present embodiment applies a nonvolatile storage gate 412 explained hereinafter instead of the nonvolatile storage gate 12. Since others except for the point of explaining hereinafter are the same as the first embodiment, the explanation is omitted.
(Configuration Example of Nonvolatile Storage Gate 412)

As shown in FIG. 22, a nonvolatile storage gate 412 applicable to the nonvolatile storage gate embedded logic circuit according to the present embodiment includes: a nonvolatile storage element 418; and a volatile storage element 424 which receives a data input signal D and a clock signal CK, and outputs a data output signal Q.

In the nonvolatile storage gate 412, although the data interface control unit explained in the above-mentioned embodiment is not shown as a circuit element, the cell plate potential CP inputted into the nonvolatile storage element 418 is equivalent to the nonvolatile storage control signal NVCTL in the above-mentioned embodiment.

By forming the nonvolatile storage element 418 corresponding to the storage node of a sequential circuit, the nonvolatile storage gate embedded logic circuit according to the present embodiment does not need to provide a peripheral circuit, and can provide a resume function by a small-scale circuit.

The nonvolatile storage gate 412 is embodied as an Application Specific Integrated Circuit (ASIC) having a processing circuit including a sequential circuit and a combinational circuit for holding data of D type flip-flop circuit etc., as shown in FIG. 22.

The D type flip-flop circuit included in ASIC is a circuit which imports and holds data, for example by the rising edge of the clock. As shown in FIG. 22, the D type flip-flop circuit includes: a master-side half latch circuit having a data holding circuit which is composed of two inverter 162 and inverter 163; and a half latch circuit of a slave side having a data holding circuit which is composed of the inverter 165 and the inverter 166.

In particular, as for the nonvolatile storage gate 412, the ferroelectric capacitors 169 and 168 is connected to the storage nodes N1 and N2 of the D type flip-flop circuit, respectively, and the power supply is cut off after the data of the storage nodes N1 and N2 restore to the ferroelectric capacitors 169 and 168 beforehand before the power supply cutoff, and the data restored in the ferroelectric capacitors 169 and 168 at the time where the power supply is re-turned ON is recovered to the storage nodes N1 and N2.

(Logic Circuit Timing Chart)

FIG. 23 shows a logic circuit timing chart for explaining an operation before the power supply cutoff of the nonvolatile storage gate 412, and an operation at the time where the power supply is re-turned ON.

Hereinafter, the operation of the nonvolatile storage gate 412 will be explained with reference to FIG. 22 and FIG. 23.

(a) First of all, a normal operation period T1 during the timing t0 to t1 is in a normal operation state. A clock signal CK (not shown) is supplied to the nonvolatile storage gate 412 in the normal operation, and the data corresponding to data input signal D is held for every rising edge of the above-mentioned clock signal in the storage nodes N1 and N2, respectively.

(b) When cutting off the power supply VDD, then in the timing t1, the clock signal CK is stopped. At this time, the storage node N1 is assumed being in the "H" level, and the storage node N2 is assumed being in the "L" level.

(c) Next, in a data write-in period T2 of timing t1 to t2, the data write-in from the volatile storage element 24 to the nonvolatile storage element 18 is executed. As shown in FIG. 23, in the data write-in period T2 from the timing t1 to the timing t2, the potential of cell plate CP is set as the "H" level. Since the storage node N2 is in the "L" level at this time, the voltage of negative polarity is applied to the ferroelectric capacitor 168, and data "L" is written in the ferroelectric capacitor 168.

(d) Next, in a power supply cutoff period T3 of timing t2 to t3, it is in a power supply cutoff state. The potential of cell plate CP is set as the "L" level. Since the storage node N1 is in the "H" level at this time, the voltage of positive polarity is applied to the ferroelectric capacitor 169. That is, data "H" is written in the ferroelectric capacitor 169.

(e) Next, if the power supply $V_{DD}$ is cut off in the timing t3, both the storage nodes N1 and N2 are set to the "L" level and data is lost, but data "L" is held in the ferroelectric capacitor 168, and data "H" is held in the ferroelectric capacitor 169. Thus, in the nonvolatile storage gate 412 including the D type flip-flop circuit, the power supply is cut off, after restoring the data currently held before power supply cutoff in the storage nodes N1 and N2 to the ferroelectric capacitors 169 and 168, respectively.

(d) Next, in a power supply cutoff period T4 of timing t3 to t4, it is in a power supply cutoff state.

(e) Next, in the power recovery waiting period T3 of timing t4 to t5, it is in a power recovery waiting state. When the power supply is re-turned ON, first of all, cell plate CP is set as the "H" level from the timing t4. At this time, in the ferroelectric capacitor 168 and the ferroelectric capacitor 169, the potential corresponding to the variation of each polarization charge occurs in the storage nodes N2 and N1. In this case, the side of the storage node N1 connected to the ferroelectric capacitor 169 becomes larger than the potential of the storage node N2.

(f) Next, in the timing t5, when the power supply $V_{DD}$ is re-turned ON, the D type flip-flop circuit composed of the pass switches 160 and 164 and the inverters 162 and 163 operates as a latching type sense amplifier, and the potential of the storage node N1 is settled by the "H" level and the potential of the storage node N2 is settled by the "L" level. In addition, the operation of the latching type sense amplifier is the same as the thing which is used by DRAM etc.

(g) Next, in a data read-out period T6 of timing t5 to t6, reading-out the data to the volatile storage element 24 from the nonvolatile storage element 18 is executed.

(h) Next, in the timing t6, the cell plate CP is set as a low level, and the supply of the clock signal CK is restarted. Thus, in the nonvolatile storage gate 412, the data restored to the ferroelectric capacitors 168 and 169 recovers to the storage nodes N2 and N1, respectively.

Thus, in the nonvolatile storage gate 412, since the data of the storage nodes N1 and N2 restore to the ferroelectric capacitors 168 and 169 connected to the storage nodes N1 and N2, respectively before the power supply cutoff, and recover after the power supply cutoff, it is not necessary to use a nonvolatile memory including a peripheral circuit in order to achieve a resume function.

Accordingly, the circuit configuration can be applied simpler, and a personal circuit or software for accessing the nonvolatile memory is unnecessary.

Furthermore, only the worth to which access to the nonvolatile memory became unnecessary can shorten the time period of the read-out and the write-in.

According to the present embodiment, it can be provided of the nonvolatile storage gate which can hold data after the power supply cutoff by embedding the device having the nonvolatile function into the storage gate, and the operation method for such nonvolatile storage gate.

Also, according to the present embodiment, it can be provided of the nonvolatile storage gate embedded the logic circuit which can cut off the power supply at the same time of being in the standby state, without needing securing of the power supply for holding data and restoring external data, by embedding the nonvolatile storage gate, and the operation method for such nonvolatile storage gate embedded logic circuit.

Also, According to the present invention, it can be provided of the nonvolatile storage gate which can be diverted in that condition for the existing design information and the nonvolatile storage gate embedded logic circuit which embedded the aforementioned nonvolatile storage gate, by providing a mechanism in which operation equivalent to the volatile storage gate is possible for the nonvolatile storage gate, and operating as the volatile storage gate at the time of the normal operation.

Also, according to the present embodiment, in designing the layout of logic circuit, the nonvolatile storage gate embedded logic circuit which disposes a nonvolatile storage gate inside a logic circuit can be provided efficiently by applying the same cell pitch of the logic gate and the nonvolatile storage gate.

Also, according to the nonvolatile storage gate embedded logic circuit according to the present embodiment, since the power supply can be cut off in an instant without the data restoring at the time of power supply cutoff, when the logic calculation circuit is turned into the standby state, the power supply can be cut off in an instant and the leakage current can be reduced efficiently.

Also, according to the nonvolatile storage gate embedded logic circuit according to the present embodiment, the existing circuit information can be diverted in that condition, without performing redesigns, such as a timing design and a power consumption design.

Also, according to the nonvolatile storage gate embedded logic circuit according to the present embodiment of the present invention, the existing circuit can be nonvolatilized easily, for example, a power supply can be cut off at the time of standby (data is not erased), and the quaternary counter, the nonvolatile CPU etc. in which an operation restart is possible immediately after power activation can be achieved.

Fourth Embodiment

Nonvolatile CPU

As shown in FIG. 24, a nonvolatile CPU 101 which is a nonvolatile storage gate embedded logic circuit according to a fourth embodiment of the present invention includes: an instruction processing unit 202; a calculation processing unit 210 connected to the instruction processing unit 202 and receives an arithmetic control signal ACS from the instruction processing unit 202; a calculated result storage unit 204 connected to the calculation processing unit 210 and receives an arithmetic output signal z from the calculation processing unit 210; a switch block 206 connected to the calculated result storage unit 204 and the instruction processing unit 202, and supplies an output signal a to the calculation processing unit 210; and a switch block 208 connected to the switch block 206 and the instruction processing unit 202, receives a switch control signal SCS from the instruction processing unit 202, and supplies an output signal b to the calculation processing unit 210.

The nonvolatile CPU 101 further includes an operation control unit 220 which performs operation control. While the operation control unit 20 controls the power supply to the instruction processing unit 202, the calculated result storage unit 204, the switch blocks 206 and 208, and the calculation processing unit 210, the power supply control unit 20 bus-connects to each part to exchange data. The operation control unit 220 outputs a nonvolatile storage control signal NVCTL to the nonvolatile storage gate 612 described later.

Through a program/data input/output line 312, a program/data input terminal 312a is connected to the instruction processing unit 202, and a program/data output terminal 312b is connected to the switch block 208.

Moreover, as shown in FIG. 24, a control signal input terminal 314b and a control signal output terminal 314a are connected to the nonvolatile CPU 101 through a control signal input/output line 314.

Moreover, as shown in FIG. 24, a clock signal CLK and a reset signal RESET# are supplied to the nonvolatile CPU 101 through a clock control terminal 292, and a register designation address signal ADDR, a power supply cutoff notification signal OFF, a write-in control signal WE to a nonvolatile storage element 618 described later, and a read-out control signal RD from the nonvolatile storage element 618 are supplied through a nonvolatile operation control terminal 294 connected to a nonvolatile operation control line 200.

Moreover, the instruction processing unit 202 includes a logic circuit block having the nonvolatile storage gate 612 (not shown), the calculated result storage unit 204 includes a logic circuit block having the nonvolatile storage gate 612, and the calculation processing unit 210 includes a logic circuit block having the nonvolatile storage gate 612.

Although the power-ON reset unit 124, the counter 105, the decoder 113, and the nonvolatile storage element 618 are needed in the nonvolatile storage gate 612 described later, since the occupation area of the instruction processing unit 202 of the nonvolatile CPU 101, the arithmetic processing unit 210, and the nonvolatile memory gate 612 in the calculated result storage unit 204 is only several percent, there is almost no influence of the increase in size given to whole of the nonvolatile CPU 101

(Configuration Example of Nonvolatile Storage Gate 612)

As shown in FIG. 25, a nonvolatile storage gate 612 applicable to the nonvolatile storage gate embedded logic circuit according to the present embodiment includes: a nonvolatile storage element (NVSE) 618; and a volatile storage element (VSE) 624 which receives a data input signal DATA from a data input terminal and a clock signal CLK from a clock input terminal (through the register content storing unit 126), and outputs a data output signal Q from a data output terminal.

The unvolatilized storage gate 612 further includes a data interface control unit 622 which receives the nonvolatile storage control signal NVCTL for reading-out/write-in data from/to the nonvolatile storage element 618. The volatile storage element 624 is disposed so as to be adjoining to the data interface control unit 622. The data interface control unit 622 is disposed so as to be adjoining to the nonvolatile storage element 618. A part except for the volatile storage element 624 and the nonvolatile storage element 618 from a block formation unit of the data interface control unit 622 is equivalent to the data interface control unit 622.

The nonvolatile storage gate 612 allows to recover the register content at the time of powering off without external support, such as software, at the time of power activation, and can reduce power consumption by turning OFF the power at the time of not operating.

The nonvolatile storage gate 612 includes: a conventional circuit unit 128 including a volatile storage element 624 notated as the register unit, and an address decoder 111; a register content storing unit 126 composed of a counter 105, a decoder 113, and a nonvolatile storage element 618 notated as the nonvolatilizing type memory element; and a power-ON reset unit 124 which initializes the counter 105.

Turning the power supply $V_{CC}$ will send the contents stored in the register content storing unit 126 to the volatile storage element 624. The contents of the volatile storage element 624 are not stored in the register content storing unit 126 in the normal operation, but it is stored when an OFF signal is supplies from external. The power supply is disconnected after supplying the OFF signal. When the power supply is re-turned ON, the contents of the register content storing unit 126 stored when the OFF signal is supplied is sent to the volatile storage element 624, and it recovers to the state in the time point of turning OFF the power.

The conventional circuit unit 128 includes: the address decoder 111 which decodes an I/O Address of the volatile storage element 24 from the signal of the address bus 125; and the volatile storage element 624 composed of a flip-flop which stores the contents transmitted through the data bus 120.

The register content storing unit 126 includes: the nonvolatile storage element 618 which stores the state of a register at the time that the power supply is stopped; the counter 105 which measures a clock pulse of the clock signal CLK; and the decoder 113 which decodes a specific count number from the output of the counter 105, and has an output signal which is an active L level. A signal line from the power-ON reset unit 124 is connected to a reset terminal (/RESET) of the counter 105.

(Operation of Nonvolatile Storage Gate 612)

First of all, if the power supply $V_{CC}$ is turned ON, the counter 105 is in an initial state (count 0) with the power-ON reset output signal POR from the power-ON reset unit 124. Since the output "H" level from the decoder 113 is inputted into DE terminal, the clock signal CLK inputted into the counter 105 is counted from 0 in that condition. The output is still the "H" level until the output of the counter 105 is inputted into the decoder 113 and it results in a specific count, and it transmits acting as an OE signal of the nonvolatile storage element 618.

The nonvolatile storage element 618 sends the held contents to the volatile storage element 624 through the read-out internal data bus 116 from a VRDT terminal. At this time, since the signal from the decoder 113 is the "H" level, and the signal is not arriving to the OFF terminal and is the "L" level, the output of OR gate 115 is the "H" level. Since the tri-state buffer 119 is in the state of high impedance in response, the data bus 120 is separated from the internal data bus 116, and competitive data do not occur. The output from the decoder 113 is supplied also to the clock of the volatile storage element 624 through the OR gate 118, and the data from the nonvolatile storage element 618 on the internal data bus 116 is stored in the volatile storage element 624.

The above-mentioned operation is completed, the clock number until the contents of the volatile storage element 624 held beforehand recover is a specific count which the decoder 113 has, and when the count is reached, the output of the decoder 113 is set to the "L" level. The DE terminal of the counter 105 receives this data, and the clock signal CLK is not counted hereinafter, and the operation of the counter 105 stops influencing. Therefore, the output of the decoder 113 always is set as the "L" level, hereinafter. Since the "L" level is transmitted to the OE terminal, data is no longer outputted from the nonvolatile storage element 618. With this and the OFF signal of the "L" level, the output of OR gate 115 is set as the "L" level, and the tri-state buffer 119 is in the state where the gate opened, and becomes the normal operation.

While performing normal operation, if the register designation address signal ADDR inputted from the address bus 125 is an I/O Address of the volatile storage element 624, and the write-in control signal WE to the nonvolatile storage element 618 showing I/O access is inputted at the same time, the AND gate 127 opens with the output from the address decoder 111 and the write-in control signal WE to the nonvolatile storage element 618, and the clock is supplied into the volatile storage element 624 through the OR gate 118.

Data input signal DATA appeared in the data bus 120 at this time is written in the volatile storage element 624 through the tri-state buffer 119. When reading the contents of the volatile storage element 624, a read-out control signal RD from the nonvolatile storage element 618 is inputted. Accordingly, the gate of the tri-state buffer 121 opens, and the contents of the volatile storage element 624 appear on the data bus 120 through the buffer 123. The output from the address decoder 111 and the read-out control signal RD from the nonvolatile storage element 618 is supplied to the gate of the tri-state buffer 121 through the AND gate 122. The reset signal RESET# is supplied to the volatile storage element 624.

When turning OFF the power, first of all, the "H" level is supplied to a power supply cutoff notification signal OFF. The power supply cutoff notification signal OFF is connected with the VE terminal of the nonvolatile storage element 618, and accordingly the contents of the volatile storage element 624 are stored through the write-in internal data bus 117 connected from the output terminal of the volatile storage element 624 to RDDT terminal. Since the power supply cutoff notification signal OFF is the "H" level and the output from the decoder 113 is still the "L" level at this time, the output of the OR gate 115 changes to the "H" level. Therefore, since the tri-state buffer 119 is closed by the gate and the data bus 120 is separated from the read-out internal data bus 116, the contents of the volatile storage element 624 are not rewritten during the nonvolatile storage element 618 stores the contents of the volatile storage element 624. The power supply cutoff notification signal OFF is returned to the "L" level after sufficient period needed for the operation. The power supply VCC turned ON is shut off afterwards.

FIG. 26 shows a schematic block diagram of the nonvolatile storage gate 612 explained as mentioned above. The nonvolatile storage gate 612 can be represented as including the nonvolatile storage element 618, the volatile storage element 624, the switching unit 623, the power-ON reset unit 124, and the logic circuit unit 628. In FIG. 26, an external signal line is omitted for simplification. In this case, the counter 105, the decoder 113, and the OR gate 115 to which the write-in from the nonvolatile storage element 618 to the volatile storage element 624 is performed are equivalent to the switching unit 623, corresponding to the power-ON reset output signal POR from the power-ON reset unit 124. The thing except for the volatile storage element 624 is equivalent to the logic circuit unit 628 among the conventional circuit units 128.

(Logic Circuit Timing Chart)

FIG. 27 is a time chart at the time of the power supply $V_{CC}$ turning and cutting. Control signals do not have necessary except the power supply cutoff notification signal OFF inputted from the outside at the time of powering off. FIG. 27 shows a timing chart of the logic circuit power supply $V_{CC}$, the power-ON reset output signal POR, the operation timing signal of the decoder 113, the power supply cutoff notification signal OFF, the operation timing signal of OR gate 115, and the operation timing signal of the tri-state buffer 119, respectively.

(a) First of all, during the period T1 is in a normal operation state.

(b) Next, in the period T2, the data write-in from the volatile storage element 624 to the nonvolatile storage element 618 is executed.

(c) Next, the period T3 is in a power supply cutoff waiting state.

(d) Next, the period T4 is in a power supply cutoff state.

(e) Next, the period T5 is in a power recovery waiting state.

(f) Next, in the period T6, data read-out to the volatile storage element 24 from the nonvolatile storage element 18 is executed.

(Quaternary Counter)

As shown in FIG. 28, a configuration example of a quaternary counter to which the nonvolatile storage gate 612 shown in FIG. 25 is applied includes: nonvolatile storage gates $612_1$, $612_2$, $612_3$, and $612_4$; AND gates $84_1$, $84_2$, and $84_3$; and exclusive OR gates $90_1$, $90_2$, $90_3$, and $90_4$. A normal operation control line 298 and a nonvolatile operation control line 200 are connected to the nonvolatile storage gates $612_1$, $612_2$, $612_3$, and $612_4$.

A reset signal RESET# is supplied to the normal operation control line 298 through the normal operation control terminal 288, and a clock signal CLK is supplied to the normal operation control line 298 through the clock control terminal 292.

A register designation address signal ADDR, a power supply cutoff notification signal OFF, a write-in control signal WE to a nonvolatile storage element 618, and a read-out control signal RD from the nonvolatile storage element 618 are supplied through a nonvolatile operation control terminal 294 to a nonvolatile operation control line 200.

A data input signal $D_{in}$ is supplied to an input terminal of the AND gate $84_1$, and an input terminal of the exclusive OR gate $90_1$ through a quaternary counter data input terminal 286.

An output terminal of the AND gate $84_1$ is connected to an input terminal of the AND gate $84_2$ and an input terminal of the exclusive OR gate $90_2$.

An output terminal of the AND gate $84_2$ is connected to an input terminal of the AND gate $84_3$ and an input terminal of the exclusive OR gate $90_3$.

An output terminal of the AND gate $84_3$ is connected to an input terminal of the exclusive OR gate $90_4$.

Data output terminals (Q) of the nonvolatile storage gates $612_1$, $612_2$, $612_3$, and $612_4$ is connected to input terminals of the AND gates $84_1$, $84_2$, and $84_3$, and input terminals of the exclusive OR gates $90_1$, $90_2$, $90_3$, and $90_4$, respectively.

Output terminals of the exclusive OR gates $90_1$, $90_2$, $90_3$, and $90_4$ are connected to the data input terminals (D) of the nonvolatile storage gates $612_1$, $612_2$, $612_3$, and $612_4$, respectively, and are connected to quaternary counter data output terminals $296_1$, $296_2$, $296_3$, and $296_4$ at the same time.

In the quaternary counter data output terminals $296_1$, $296_2$, $296_3$, and $296_4$, quaternary counter data output signals $D_{out}[0]$, $D_{out}[1]$, $D_{out}[2]$, and Nut [3] are outputted, respectively.

According to the present embodiment, it can be provided of the nonvolatile storage gate which can hold data after the power supply cutoff by embedding the device having the nonvolatile function into the storage gate, and the operation method for such nonvolatile storage gate.

Also, according to the present embodiment, it can be provided of the nonvolatile storage gate embedded the logic circuit which can cut off the power supply at the same time of being in the standby state, without needing securing of the power supply for holding data and restoring external data, by embedding the nonvolatile storage gate, and the operation method for such nonvolatile storage gate embedded logic circuit.

Also, according to the present invention, it can be provided of the nonvolatile storage gate which can be diverted in that condition for the existing design information and the nonvolatile storage gate embedded logic circuit which embedded the aforementioned nonvolatile storage gate, by providing a mechanism in which operation equivalent to the volatile storage gate is possible for the nonvolatile storage gate, and operating as the volatile storage gate at the time of normal operation.

Also, according to the present embodiment, in designing the layout of logic circuit, the nonvolatile storage gate embedded logic circuit which disposes a nonvolatile storage gate inside a logic circuit can be provided efficiently by applying the same cell pitch of the logic gate and the nonvolatile storage gate.

Also, according to the nonvolatile storage gate embedded logic circuit according to the present embodiment, since the power supply can be cut off in an instant without the data restoring at the time of power supply cutoff, when the logic calculation circuit is turned into the standby state, the power supply can be cut off in an instant and the leakage current can be reduced efficiently.

Also, according to the nonvolatile storage gate embedded logic circuit according to the present embodiment, the existing circuit information can be diverted in that condition, without performing redesigns, such as a timing design and a power consumption design.

Also, according to the nonvolatile storage gate embedded logic circuit according to the present embodiment of the present invention, the existing circuit can be nonvolatilized easily, for example, a power supply can be cut off at the time of standby (data is not erased), and the quaternary counter, the nonvolatile CPU etc. in which an operation restart is possible immediately after power activation can be achieved.

Other Embodiments

The present invention has been described by the first to second embodiments, as a disclosure including associated description and drawings to be construed as illustrative, not restrictive. With the disclosure, artisan might easily think up alternative embodiments, embodiment examples, or application techniques. A configuration which combined the detailed configuration of each embodiment arbitrarily in the possible range is also included in the range of the present invention.

In the case of the nonvolatile CPU 1 applied the configuration example of the nonvolatile storage gates 12, 212, 412, and 612, the similar nonvolatile storage element as FeRAM is embedded in the element level of the flip-flop which composes a processor. That is, this nonvolatile storage element holds a memory content. Therefore, this nonvolatile CPU 1 can cut the power supply in one breath from the root of LSI. That is, the electric power at the time of stopping can be applied into zero, without considering leakage current etc. at all. The point is applicable not only to a processor but all logic LSI. That is, circuit technique applicable to the whole logic LSI of wider range can be provided.

Thus, the present invention includes various embodiments etc. which have not been described in this specification.

INDUSTRIAL APPLICABILITY

Since in particular the nonvolatile gate embedded logic circuit according to the embodiments of the invention includes the nonvolatile storage gate which uses the nonvolatile storage element, the nonvolatile gate embedded logic circuit of the present invention can be applied to wide fields, such as processors, such as a logic operation circuit, a logic unit, CPU, MPU, and DSP, and a game machine, and a mobile computing device, and becomes advantageous in respect of the data protection at the time of the extension of driving period, the extension of battery life, battery exhaustion, etc. in particular in battery powered devices.

What is claimed is:
1. A nonvolatile storage gate comprising;
a nonvolatile storage element;
a data interface control unit adjoining the nonvolatile storage element, and receiving a nonvolatile storage control signal for reading-out data from the nonvolatile storage element and writing-in data to the nonvolatile storage element; and
a volatile storage element adjoining the nonvolatile storage element, receiving a data input signal and a clock signal, and outputting a data output signal, wherein the data interface control unit comprises a data write-in driver coupled between a logic gate connected in a form of a loop shape in the volatile storage element and the nonvolatile storage element, and wherein the data write-in driver is configured to function as a buffer, wherein the data interface control unit further comprises a pass switch coupled between an output terminal of the data write-in driver and the nonvolatile storage element, the pass switch is turned ON only at the time of the data write-in operation in accordance with the received nonvolatile storage control signal.

2. The nonvolatile storage gate according to claim 1 further comprising a power supply monitor unit adjoining the nonvolatile storage element.

3. The nonvolatile storage gate according to claim 2, wherein the power supply monitor unit includes functions to detect power supply cutoff and to perform data write-in to the nonvolatile storage element.

4. The nonvolatile storage gate according to claim 1, wherein the nonvolatile storage element allows the same volatile operation as an existing storage gate.

5. The nonvolatile storage gate according to claim 1, wherein the data interface control unit includes an external terminal for receiving a nonvolatile storage control signal for reading-out data from the nonvolatile storage element and writing-in data to the nonvolatile storage element.

6. The nonvolatile storage gate according to claim 1, wherein the nonvolatile storage element includes one of a floating gate MOS transistor, a ferroelectric element, a magneto resistance effect element, and a phase change element.

7. The nonvolatile storage gate according to claim 1, wherein the data interface control unit comprises a multiplexer for controlling electrical connection/cutoff between a logic gate connected to loop shape in the volatile storage element and the nonvolatile storage element at the time of the data read-out operation in accordance with the received nonvolatile storage control signal.

8. The nonvolatile storage gate according to claim 1, wherein the data write-in driver is coupled between an input side of the logic gate connected in the form of loop shape in the volatile storage element and the nonvolatile storage element.

9. A nonvolatile storage gate embedded logic circuit comprising:
    a logic calculation unit including a logic gate; and
    a nonvolatile storage gate including a nonvolatile storage element, a data interface control unit adjoining the nonvolatile storage element, and receiving a nonvolatile storage control signal for reading-out data from the nonvolatile storage element and writing-in data to the nonvolatile storage element, and a volatile storage element adjoining the nonvolatile storage element, receiving a data input signal and a clock signal, and outputting a data output signal,
    wherein the data interface control unit comprises a data write-in driver coupled between a logic gate connected in a form of a loop shape in the volatile storage element and the nonvolatile storage element, and wherein the data write-in driver is configured to function as a buffer,
    wherein the data interface control unit further comprises a pass switch coupled between an output terminal of the data write-in driver and the nonvolatile storage element, the pass switch is turned ON only at the time of the data write-in operation in accordance with the received nonvolatile storage control signal.

10. The nonvolatile storage gate embedded logic circuit according to claim 9, wherein the nonvolatile storage gate further includes a power supply monitor unit adjoining the nonvolatile storage element.

11. The nonvolatile storage gate embedded logic circuit according to claim 10, wherein the power supply monitor unit includes functions to detect power supply cutoff and to perform data write-in to the nonvolatile storage element.

12. The nonvolatile storage gate embedded logic circuit according to claim 9 further comprising a power supply control unit for supplying the nonvolatile storage control signal to the nonvolatile storage gate.

13. The nonvolatile storage gate embedded logic circuit according to claim 9, wherein: the logic gate includes an inverter, a NAND element, and a NOR element, the inverter, the NAND element, and the NOR element not having a storage function or being not used for data storage; and the volatile storage element includes storage gates including a latch and a register.

14. The nonvolatile storage gate embedded logic circuit according to claim 13, wherein the nonvolatile storage element is applied only to a portion of the storage gates including the latch and the register of the volatile storage element.

15. The nonvolatile storage gate embedded logic circuit according to claim 9, wherein the nonvolatile storage element allows the same volatile operation as an existing storage gate.

16. The nonvolatile storage gate embedded logic circuit according to claim 9, wherein the data interface control unit includes an external terminal for receiving the nonvolatile storage control signal for reading-out data from the nonvolatile storage element and writing-in data to the nonvolatile storage element.

17. The nonvolatile storage gate embedded logic circuit according to claim 9, wherein the nonvolatile storage element includes one of a floating gate MOS transistor, a ferroelectric element, a magneto resistance effect element, and a phase change element.

18. The nonvolatile storage gate embedded logic circuit according to claim 9, wherein the cell pitches of the logic gate and the nonvolatile storage gate are equal in a layout pattern of the logic circuit.

19. The nonvolatile storage gate embedded logic circuit according to claim 9, wherein a control signal line connected to the nonvolatile storage gate and being a tree structure is provided.

20. The nonvolatile storage gate embedded logic circuit according to claim 9, wherein a control signal line connected to the nonvolatile storage gate and being a random/line type structure is provided.

21. The nonvolatile storage gate embedded logic circuit according to claim 9, wherein a control signal line connected to the nonvolatile storage gate and being a hybrid type structure is provided.

22. The nonvolatile storage gate embedded logic circuit according to claim 9 further comprising:
    an instruction processing unit;
    a calculation processing unit connected to the instruction processing unit and receiving an arithmetic control signal from the instruction processing unit;
    a calculated result storage unit connected to the calculation processing unit and receiving an arithmetic output signal from the calculation processing unit;
    a first switch block connected to the calculated result storage unit and the instruction processing unit, and supplying a first output signal to the calculation processing unit;

a second switch block connected to the first switch block and the instruction processing unit, receiving a switch control signal from the instruction processing unit, and supplying a second output signal to the calculation processing unit; and a power supply control unit controlling a power supply to the calculated result storage unit, the first and second switch blocks, and the calculation processing unit, and bus-connecting to each part, and exchanging data.

23. The nonvolatile storage gate embedded logic circuit according to claim 9, wherein the data interface control unit comprises a multiplexer for controlling electrical connection/cutoff between a logic gate connected to loop shape in the volatile storage element and the nonvolatile storage element at the time of the data read-out operation in accordance with the received nonvolatile storage control signal.

24. The nonvolatile storage gate according to claim 9, wherein the data write-in driver is coupled between an input side of the logic gate connected in the form of loop shape in the volatile storage element and the nonvolatile storage element.

25. An operation method of a nonvolatile storage gate, the nonvolatile storage gate including: a nonvolatile storage element; a data interface control unit adjoining the nonvolatile storage element, and receiving a nonvolatile storage control signal for reading-out data from the nonvolatile storage element and writing-in data to the nonvolatile storage element; and a volatile storage element adjoining the nonvolatile storage element, receiving a data input signal and a clock signal, and outputting a data output signal; the operation method comprising:

applying the nonvolatile storage element as a standby state, and applying the volatile storage element as a normal operation state, in a normal operation period;

executing data write-in from the volatile storage element to the nonvolatile storage element, in a data write-in period;

applying the volatile storage element and the nonvolatile storage element as a power supply cutoff waiting state, in a power supply cutoff waiting period;

applying the volatile storage element and the nonvolatile storage element as a power supply cutoff state, in a power supply cutoff period;

applying the volatile storage element and the nonvolatile storage element as a power recovery waiting state, in a power recovery waiting period; and executing data read-out to the volatile storage element from the nonvolatile storage element, in a data read-out period, wherein the data interface control unit comprises a data write-in driver coupled between a logic gate connected in a form of loop shape in the volatile storage element and the nonvolatile storage element, the data write-in driver configured to function as a buffer, wherein the data interface control unit further comprises a pass switch coupled between an output terminal of the data write-in driver and the nonvolatile storage element, the pass switch is turned ON only at the time of the data write-in operation in accordance with the received nonvolatile storage control signal, and wherein the data write-in operation from the volatile storage element to the nonvolatile storage element is executed through the data write-in driver.

26. The operation method according to claim 25, wherein the data write-in driver is coupled between an input side of the logic gate connected in the form of loop shape in the volatile storage element and the nonvolatile storage element.

27. An operation method of a nonvolatile storage gate embedded logic circuit, the nonvolatile storage gate embedded logic circuit including: a logic calculation unit having a logic gate; and a nonvolatile storage gate including a nonvolatile storage element, a data interface control unit adjoining the nonvolatile storage element, and receiving a nonvolatile storage control signal for reading-out data from the nonvolatile storage element and writing-in data to the nonvolatile storage element, and a volatile storage element adjoining the nonvolatile storage element, receiving a data input signal and a clock signal, and outputting a data output signal; the operation method comprising:

applying the nonvolatile storage element as a standby state, and applying the volatile storage element as a normal operation state, in a normal operation period;

executing data write-in from the volatile storage element to the nonvolatile storage element, in a data write-in period;

applying the volatile storage element and the nonvolatile storage element as a power supply cutoff waiting state, in a power supply cutoff waiting period;

applying the volatile storage element and the nonvolatile storage element as a power supply cutoff state, in a power supply cutoff period;

applying the volatile storage element and the nonvolatile storage element as a power recovery waiting state, in a power recovery waiting period; and executing data read-out to the volatile storage element from the nonvolatile storage element, in a data read-out period, wherein the data interface control unit comprises a data write-in driver coupled between a logic gate connected in a form of loop shape in the volatile storage element and the nonvolatile storage element, the data write-in driver configured to function as a buffer, wherein the data interface control unit further comprises a pass switch coupled between an output terminal of the data write-in driver and the nonvolatile storage element, the pass switch is turned ON only at the time of the data write-in operation in accordance with the received nonvolatile storage control signal, and wherein the data write-in operation from the volatile storage element to the nonvolatile storage element is executed through the data write-in driver.

28. The operation method according to claim 27, wherein the data write-in driver is coupled between an input side of the logic gate connected in the form of loop shape in the volatile storage element and the nonvolatile storage element.

* * * * *